(12) United States Patent
Bergmann et al.

(10) Patent No.: US 9,786,639 B2
(45) Date of Patent: Oct. 10, 2017

(54) SOLID STATE LIGHT FIXTURES SUITABLE FOR HIGH TEMPERATURE OPERATION HAVING SEPARATE BLUE-SHIFTED-YELLOW/GREEN AND BLUE-SHIFTED-RED EMITTERS

(71) Applicant: Cree, Inc., Durham, NC (US)

(72) Inventors: Michael John Bergmann, Raleigh, NC (US); Florin Tudorica, Chapel Hill, NC (US); P. Joseph DeSena, Jr., Raleigh, NC (US)

(73) Assignee: Cree, Inc., Durham, NC (US)

(*) Notice: Subject to any disclaimer, the term of this patent is extended or adjusted under 35 U.S.C. 154(b) by 0 days.

(21) Appl. No.: 15/226,992

(22) Filed: Aug. 3, 2016

(65) Prior Publication Data

US 2017/0162547 A1   Jun. 8, 2017

Related U.S. Application Data

(60) Provisional application No. 62/262,414, filed on Dec. 3, 2015.

(51) Int. Cl.

| | | |
|---|---|---|
| *H01L 33/62* | (2010.01) | |
| *H01L 27/146* | (2006.01) | |
| *H01L 33/50* | (2010.01) | |
| *H01L 25/075* | (2006.01) | |
| *F21Y 115/10* | (2016.01) | |
| *F21Y 103/10* | (2016.01) | |
| *F21K 9/68* | (2016.01) | |
| *F21K 9/66* | (2016.01) | |
| *F21K 9/232* | (2016.01) | |
| *F21K 9/62* | (2016.01) | |
| *F21K 9/27* | (2016.01) | |
| *H05B 33/08* | (2006.01) | |

(52) U.S. Cl.
CPC ........ *H01L 25/0753* (2013.01); *H01L 33/502* (2013.01); *H01L 33/507* (2013.01); *H01L 33/62* (2013.01); *F21K 9/232* (2016.08); *F21K 9/27* (2016.08); *F21K 9/62* (2016.08); *F21K 9/66* (2016.08); *F21K 9/68* (2016.08); *F21Y 2103/10* (2016.08); *F21Y 2115/10* (2016.08); *H05B 33/0857* (2013.01)

(58) Field of Classification Search
CPC ......... H01L 2924/00; H01L 2924/0002; F21Y 2115/10; F21Y 2113/13; F21K 9/00
USPC ......... 257/81, 82, 91, 98, 99, 100, 116, 117, 257/432–437, 749, E33.056–E33.059, 257/E25.032
See application file for complete search history.

(56) References Cited

U.S. PATENT DOCUMENTS

| | | |
|---|---|---|
| 7,213,940 B1 | 5/2007 | Van de Ven et al. |
| 7,614,759 B2 | 11/2009 | Negley |
| 7,821,194 B2 | 10/2010 | Negley et al. |
| 7,828,460 B2 | 11/2010 | Van De Ven et al. |

(Continued)

*Primary Examiner* — Jonathan Han
(74) *Attorney, Agent, or Firm* — Myers Bigel, P.A.

(57) ABSTRACT

Solid state light fixtures include a plurality of blue-shifted-yellow/green light emitting diode ("LED") packages and a plurality of blue-shifted-red LED packages, where the solid state light fixture emits light having a correlated color temperature of between 1800 K and 5500 K, a CRI value of between 80 and 99, a CRI R9 value of between 15 and 75, and a Qg value of between 90 and 110 when the blue-shifted-yellow/green LED packages and the blue-shifted-red LED packages are operating at steady-state operating temperatures of at least 80° C.

20 Claims, 34 Drawing Sheets

(56) References Cited

U.S. PATENT DOCUMENTS

| | | | |
|---|---|---|---|
| 7,997,745 B2 | 8/2011 | Van De Ven et al. | |
| 8,018,135 B2 | 9/2011 | Van De Ven et al. | |
| 8,123,376 B2 | 2/2012 | Van De Ven et al. | |
| 8,212,466 B2 | 7/2012 | Negley et al. | |
| 8,648,546 B2 | 2/2014 | Van De Ven et al. | |
| 8,716,952 B2 | 5/2014 | Van de Ven | |
| 8,733,968 B2 | 5/2014 | Van De Ven et al. | |
| 8,736,186 B2 | 5/2014 | Chobot | |
| 8,829,821 B2 | 9/2014 | Chobot et al. | |
| 8,896,197 B2 | 11/2014 | Negley et al. | |
| 8,912,735 B2 | 12/2014 | Chobot et al. | |
| 8,975,827 B2 | 3/2015 | Chobot et al. | |
| 8,998,444 B2 | 4/2015 | Roberts et al. | |
| 9,052,067 B2 | 6/2015 | van de Ven et al. | |
| 9,155,165 B2 | 10/2015 | Chobot | |
| 9,155,166 B2 | 10/2015 | Chobot | |
| 9,366,799 B2 | 6/2016 | Wilcox et al. | |
| 2010/0002440 A1* | 1/2010 | Negley | F21K 9/00 362/249.14 |
| 2010/0079059 A1* | 4/2010 | Roberts | F21K 9/00 313/503 |
| 2012/0104953 A1* | 5/2012 | Chobot | H05B 33/0872 315/153 |
| 2012/0223657 A1* | 9/2012 | Van de Ven | H05B 33/0827 315/297 |
| 2013/0002157 A1* | 1/2013 | van de Ven | H05B 33/0824 315/192 |
| 2014/0001959 A1 | 1/2014 | Motley et al. | |
| 2014/0167642 A1 | 6/2014 | Chobot | |
| 2014/0268790 A1 | 9/2014 | Chobot et al. | |
| 2015/0102729 A1 | 4/2015 | Creasman et al. | |
| 2015/0312983 A1 | 10/2015 | Hu et al. | |

* cited by examiner

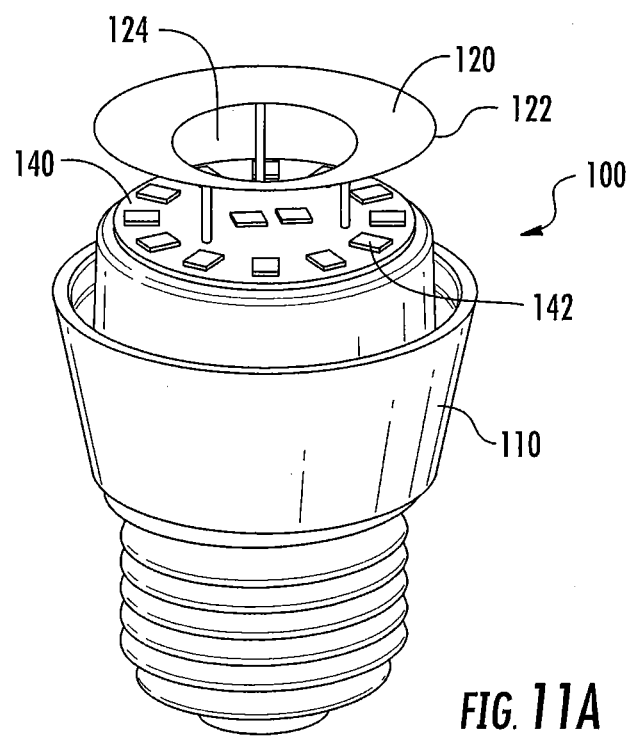
FIG. 11A
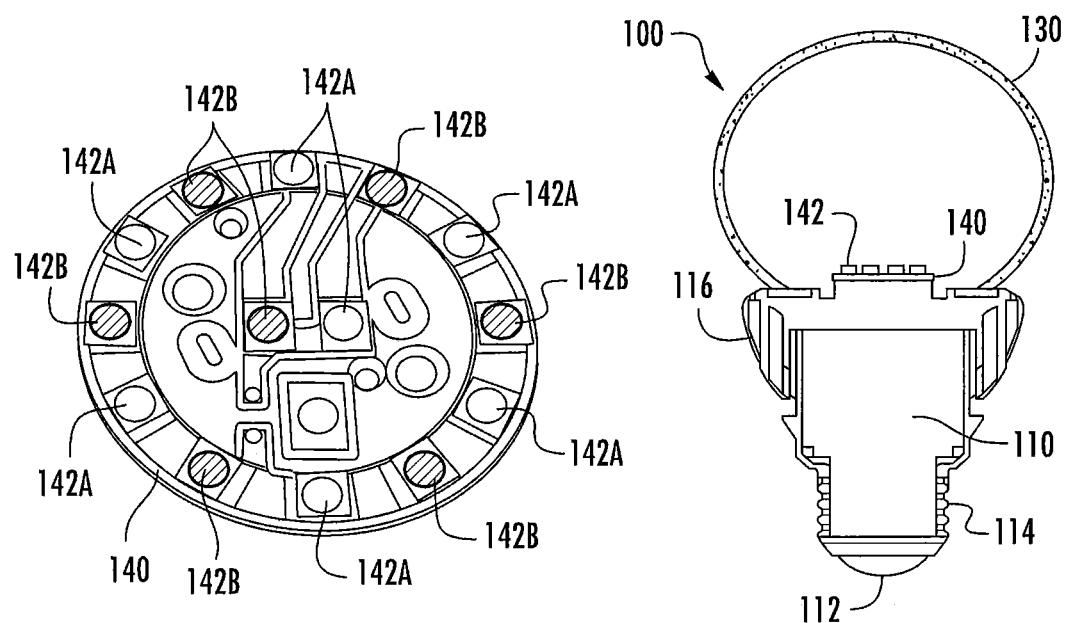
FIG. 11B
FIG. 11C

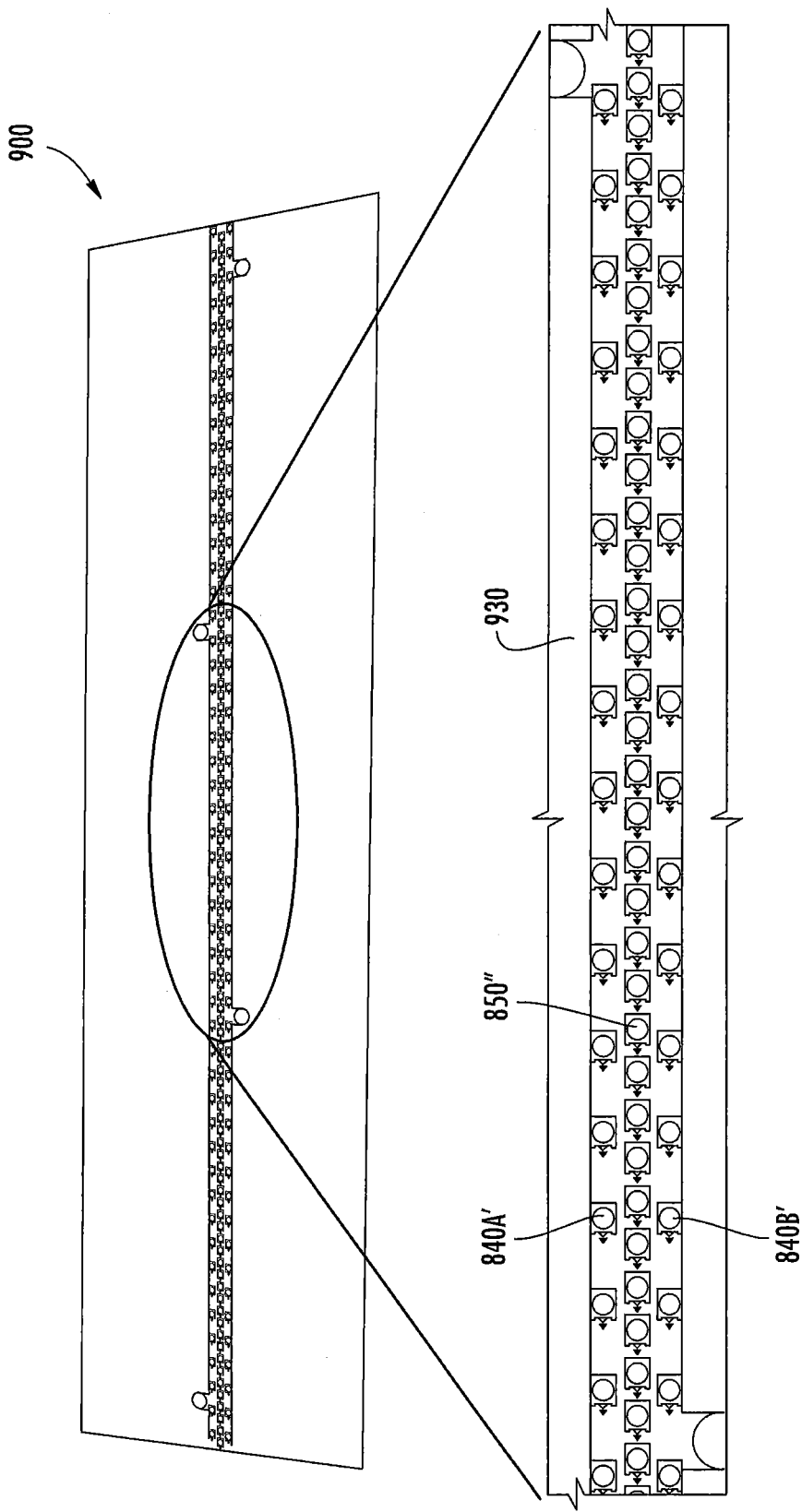

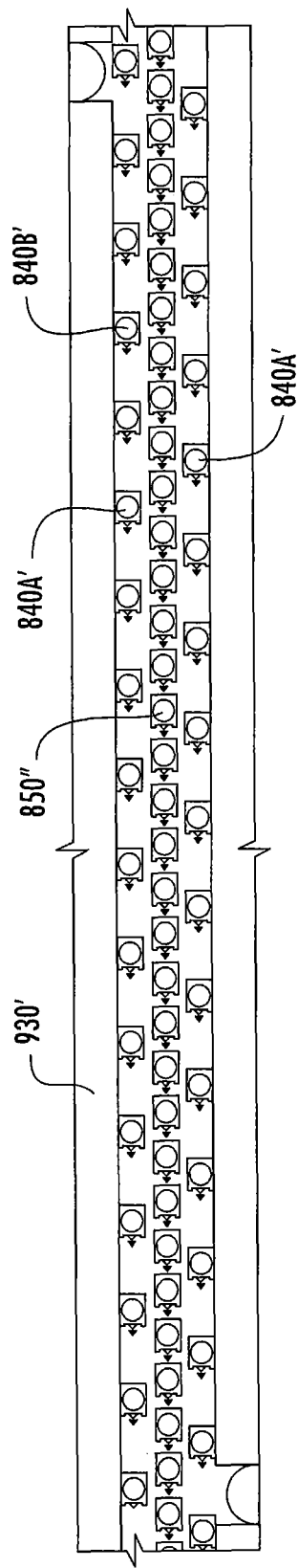

SOLID STATE LIGHT FIXTURES SUITABLE FOR HIGH TEMPERATURE OPERATION HAVING SEPARATE BLUE-SHIFTED-YELLOW/GREEN AND BLUE-SHIFTED-RED EMITTERS

CROSS-REFERENCE TO RELATED APPLICATION

The present application claims priority under 35 U.S.C. §119 to U.S. Provisional Patent Application Ser. No. 62/262,414, filed Dec. 3, 2015, the entire content of which is incorporated herein by reference as if set forth in its entirety.

BACKGROUND

The present invention relates to solid state light fixtures and, more particularly, to solid state light fixtures that are suitable for high temperature operation that emit white light at high luminous efficiency while maintaining good color rendering properties.

A wide variety of light emitting devices are known in the art including, for example, incandescent light bulbs, fluorescent light bulbs and so-called "solid state" lighting devices that use light emitting diodes ("LEDs") as the light source. LEDs generally include a series of semiconductor layers that may be epitaxially grown on a substrate. One or more semiconductor p-n junctions are formed in these epitaxial layers. When a sufficient voltage is applied across the p-n junction, electrons in the n-type semiconductor layers and holes in the p-type semiconductor layers flow toward the p-n junction. As the electrons and holes flow toward each other, some of the electrons will "collide" with corresponding holes and recombine. Each time this occurs, a photon of light is emitted, which is how LEDs generate light. The wavelength distribution of the light generated by an LED generally depends on the semiconductor materials used and the structure of the thin epitaxial layers that make up the "active region" of the device (i.e., the area where the electrons and holes recombine).

Most LEDs are nearly monochromatic light sources that appear to emit light having a single color. Thus, the spectral power distribution of the light emitted by most LEDs is tightly centered about a "peak" wavelength, which is the single wavelength where the spectral power distribution or "emission spectrum" of the LED reaches its maximum as detected by a photo-detector. The "width" of the spectral power distribution of most LEDs is between about 10 nm and 30 nm, where the width is measured at half the maximum illumination on each side of the emission spectrum (this width is referred to as the full-width-half-maximum or "FWHM" width).

In order to use LEDs to generate white light, LED-based light emitting devices have been provided that include several LEDs that each emit a light of a different color. The different colored light emitted by the LEDs combine to produce white light. For example, by simultaneously energizing red, green and blue LEDs, the resulting combined light may appear white, or nearly white, depending on, for example, the relative intensities, peak wavelengths and spectral power distributions of the source red, green and blue LEDs.

White light may also be produced by surrounding a single blue LED with one or more phosphors that convert some of the light emitted by the LED to light of one or more other colors. The combination of the light emitted by the single-color LED that is not converted by the phosphors and the light of other colors that is emitted by the phosphors may produce a white or near-white light.

As one example, a white light emitting LED package may be formed by coating a gallium nitride-based blue LED (i.e., an LED that emits light having a peak wavelength in the blue color range as defined herein) with a "yellow" phosphor (i.e., a phosphor that emits light having a peak wavelength in the yellow color range) such as a cerium-doped yttrium aluminum garnet phosphor, which has the chemical formula $Y_3Al_5O_{12}$:Ce, and is commonly referred to as YAG:Ce. The blue LED emits light having a peak wavelength of, for example, about 460 nm. Some of blue light emitted by the LED passes between and/or through the YAG:Ce phosphor particles without being converted, while other of the blue light emitted by the LED is absorbed by the YAG:Ce phosphor, which becomes excited and emits yellow fluorescence with a peak wavelength of about 550 nm (i.e., the blue light is converted to yellow light). The combination of blue light and yellow light that is emitted by the LED package may appear white to an observer. Such light is typically perceived as being cool white in color, as it is primarily comprises light on the lower half (shorter wavelength side) of the visible emission spectrum. To make the emitted white light appear more "warm" and/or exhibit better color rendering properties, red phosphors such as $Eu^{2+}$ doped $CaAlSiN_3$ based phosphor particles may be added to the coating applied to the blue LED.

In general, phosphors absorb light having first wavelengths and re-emit light having second wavelengths that are different (typically longer) than the first wavelengths. For example, "down-conversion" phosphors may absorb light having shorter wavelengths and re-emit light having longer wavelengths. It will be understood that the term "phosphor" is used broadly herein to encompass not only materials that have traditionally been referred to as phosphorescent, but also other luminophoric materials such as, for example, quantum dots, that absorb light at one wavelength and re-emit light at a different wavelength in the visible spectrum.

Typically, particles of a phosphor are mixed into a binder material such as, for example, an epoxy-based or silicone-based curable resin, and are then coated, sprayed or poured onto an LED or another surface of a light fixture. Herein, such mixtures are referred to as a "recipient luminophoric medium." A recipient luminophoric medium may include one layer or the like in which one or more phosphors are mixed, multiple stacked layers, each of which may include one or more of the same or different phosphors, and/or multiple spaced apart layers, each of which may include the same or different phosphors.

SUMMARY

Pursuant to embodiments of the present invention, solid state light fixtures are provided that include a plurality of blue-shifted-yellow/green LED packages and a plurality of blue-shifted-red LED packages. These solid state light fixtures emit light having a correlated color temperature of between 1800 K and 5500 K, a CRI value of between 80 and 99, a CRI R9 value of between 15 and 75, and a Qg value of between 90 and 110 when the blue-shifted-yellow/green LED packages and the blue-shifted-red LED packages are operating at steady-state operating temperatures of at least 80° C.

In some embodiments, each blue-shifted-yellow/green LED package may comprise a first blue LED and an associated first recipient luminophoric medium that includes a $Y_3Al_5O_{12}$:Ce phosphor and/or a $Lu_3Al_5O_{12}$:Ce phosphor, and each blue-shifted-red LED package may comprise a second blue LED and an associated second recipient luminophoric medium that includes a first $(Ca_{1-x}Sr_x)SiAlN_3$:$Eu^{2+}$ phosphor. In such embodiments, the first blue LEDs may have a first average peak wavelength that is less than a second average peak wavelength of the second blue LEDs. At least one of the first blue LEDs may have a peak wavelength that is less than 455 nm and at least one of the second blue LEDs may have a peak wavelength that is more than 460 nm. In some embodiments, the plurality of blue-shifted-red LED packages may comprise a first plurality of blue-shifted-red LED packages, and the solid state light fixture may further include a second plurality of blue-shifted-red LED packages, each of which comprises a third blue LED and an associated third recipient luminophoric medium that includes a second $(Ca_{1-x}Sr_x)SiAlN_3$:$Eu^{2+}$ phosphor that has a peak wavelength that is greater (i.e., a higher wavelength) than a peak wavelength of the first $(Ca_{1-x}Sr_x)SiAlN_3$:$Eu^{2+}$ phosphor.

In some embodiments, the second recipient luminophoric mediums that are associated with each of the second blue LEDs may further include a second $(Ca_{1-x}Sr_x)SiAlN_3$:$Eu^{2+}$ phosphor that has a peak wavelength that is greater than a peak wavelength of the first $(Ca_{1-x}Sr_x)SiAlN_3$:$Eu^{2+}$ phosphor. Additionally, at least some of the first recipient luminophoric mediums may include both the $Y_3Al_5O_{12}$:Ce phosphor and the $Lu_3Al_5O_{12}$:Ce phosphor. The solid state light fixture may be, for example, an A19 or A21 light bulb, and the first and second blue LEDs may be surface mounted on a printed circuit board or other submount such that each of the first blue LEDs is immediately adjacent a respective one of the second blue LEDs.

In some embodiments, the second recipient luminophoric mediums may not include either a yellow phosphor or a green phosphor, and the first recipient luminophoric mediums may not include a red phosphor. The first $(Ca_{1-x}Sr_x)SiAlN_3$:$Eu^{2+}$ phosphor may have a peak wavelength between 615 and 624 nm and the second $(Ca_{1-x}Sr_x)SiAlN_3$:$Eu^{2+}$ phosphor may have a peak wavelength between 625 nm and 640 nm. Additionally, in some embodiments, a first of the blue-shifted-yellow/green LED packages and a first of the blue-shifted-red LED packages may be implemented together as a packaged LED component that includes at least one LED on a submount and a first recipient luminophoric medium that only includes yellow and/or green phosphors on a first side of the submount and a second recipient luminophoric medium that only includes red phosphors on a second side of the submount that is opposite the first side.

Pursuant to further embodiments of the present invention, packaged LED components are provided that include a submount having an LED mounting surface; at least one LED on the LED mounting surface; and a first recipient luminophoric medium having a first phosphor on top of a first region of the LED mounting surface and a second recipient luminophoric medium having a second phosphor that is different from the first phosphor and that emits light having a peak wavelength in the red color range on top of the second region of the LED mounting surface. The first recipient luminophoric medium is separate from the second recipient luminophoric medium and the second recipient luminophoric medium is not on top of the first region and the first recipient luminophoric medium is not on top of the second region. The combination of the light emitted by the at least one LED and the first recipient luminophoric medium is not white light.

In some embodiments, the packaged LED component may further include a divider that extends across the LED mounting surface to define the first region and the second region. The LED mounting surface may be within a cavity, and the divider may divide the cavity into first and second sub-cavities, and the first recipient luminophoric medium may be in the first sub-cavity and the second recipient luminophoric medium may be in the second sub-cavity. The submount may include a molded structure that defines the cavity and the first and second sub-cavities. The first recipient luminophoric medium may include a $Y_3Al_5O_{12}$:Ce phosphor and/or a $Lu_3Al_5O_{12}$:Ce phosphor and may emit light having a peak wavelength in the green or yellow color range, and the second recipient luminophoric medium may include at least a first $(Ca_{1-x}Sr_x)SiAlN_3$:$Eu^{2+}$ phosphor. The distance between the first sub-cavity and the second sub-cavity may be less than two centimeters.

The at least one LED may comprise a first LED within the first sub-cavity and a second LED within the second sub-cavity. The divider may comprise a separate structure from the material that defines the cavity. The divider may be formed of, for example, a reflective plastic material. The first and second LEDs may have different peak wavelengths.

Pursuant to further embodiments of the present invention, solid state light fixtures are provided that comprise a plurality of blue-shifted-yellow/green LED packages and a plurality of blue-shifted-red LED packages, where the light emitted by the solid state light fixture has an emission spectrum having a first peak in the blue color range, a second peak between 525 nm and 575 nm, and a third peak between 610 nm and 650 nm, and where the third peak is larger than both the first peak and the second peak.

In some embodiments, each blue-shifted-yellow/green LED package may comprise a first blue LED and an associated first recipient luminophoric medium that includes a $Y_3Al_5O_{12}$:Ce phosphor and/or a $Lu_3Al_5O_{12}$:Ce phosphor, and each blue-shifted-red LED package may comprise a second blue LED and an associated second recipient luminophoric medium that includes a first $(Ca_{1-x}Sr_x)SiAlN_3$:$Eu^{2+}$ phosphor. In other embodiments, each blue-shifted-yellow/green LED package may comprise a first blue LED and an associated first recipient luminophoric medium that includes a $Y_3Al_5O_{12}$:Ce phosphor and/or a $Lu_3Al_5O_{12}$:Ce phosphor, and each blue-shifted-red LED package may comprise a second blue LED and an associated second recipient luminophoric medium that includes a first $(Ca_{1-x}Sr_x)SiAlN_3$:$Eu^{2+}$ phosphor and a second $(Ca_{1-x}Sr_x)SiAlN_3$:$Eu^{2+}$ phosphor that emits light having a peak wavelength that is higher than the peak wavelength of the light emitted by the first $(Ca_{1-x}Sr_x)SiAlN_3$:$Eu^{2+}$ phosphor.

In some embodiments, the solid state light fixture may emit light having a correlated color temperature of between 1800 K and 5500 K, a CRI value between 80 and 99, a CRI R9 between 15 and 75, and a Qg value between 90 and 110 when the blue-shifted-yellow/green LED packages and the blue-shifted-red LED packages are operating at steady-state operating temperatures of at least 80° C.

In some embodiments, the blue LEDs included in the blue-shifted-yellow/green LED packages may have a first average peak wavelength that is less than a second average peak wavelength of the blue LEDs included in the blue-shifted-red LED packages. The plurality of blue-shifted-red LED packages may comprise a first plurality of blue-shifted LED packages, and the solid state light fixture may further include a second plurality of blue-shifted-red LED packages, each of the second plurality of blue-shifted-red LED packages comprising a third blue LED and an associated third recipient luminophoric medium that includes a second $(Ca_{1-x}Sr_x)SiAlN_3:Eu^{2+}$ phosphor that has a peak wavelength that is greater than a peak wavelength of the first $(Ca_{1-x}Sr_x)SiAlN_3:Eu^{2+}$ phosphor.

In some embodiments, at least some of the first recipient luminophoric mediums may include both the $Y_3Al_5O_{12}:Ce$ phosphor and/or the $Lu_3Al_5O_{12}:Ce$ phosphor. The second recipient luminophoric mediums may not include either a yellow phosphor or a green phosphor, and the first recipient luminophoric mediums may not include a red phosphor.

In some embodiments, the second peak may be a shoulder formed on a side of the third peak. In such embodiments, the second peak may be between 535 nm and 555 nm, and the third peak may be between 615 nm and 630 nm.

Pursuant to still further embodiments of the present invention, lighting apparatus includes a three dimensional shaped optically transmissive enclosure having an interior volume; a plurality of distinct yellow/green light emitting regions that are within the interior volume, the yellow/green light emitting regions comprising at least one gallium nitride based LED that produces shorter wavelength light and at least one first recipient luminophoric medium that downconverts at least some of the shorter wavelength light to longer wavelength light; and a plurality of distinct red/orange light emitting regions that are within the interior volume, the red/orange light emitting regions comprising at least one gallium nitride based LED that produces shorter wavelength light and at least one second recipient luminophoric medium that downconverts at least some of the shorter wavelength light to longer wavelength light. The lighting apparatus emits white light from the optically transmissive enclosure having a correlated color temperature between 1800 K and 5500 K and a CRI value of greater than 80.

In some embodiments, the at least one first recipient luminophoric medium may include a $Y_3Al_5O_{12}:Ce$ phosphor and/or a $Lu_3Al_5O_{12}:Ce$ phosphor, and the at least one second recipient luminophoric medium may include a first $(Ca_{1-x}Sr_x)SiAlN_3:Eu^{2+}$ phosphor. The at least one second recipient luminophoric medium may include a second $(Ca_{1-x}Sr_x)SiAlN_3:Eu^{2+}$ phosphor that has a peak wavelength that is greater than a peak wavelength of the first $(Ca_{1-x}Sr_x)SiAlN_3:Eu^{2+}$ phosphor.

In some embodiments, the lighting apparatus may further include a second plurality of distinct red/orange light emitting regions that are within the interior volume, the second red/orange light emitting regions comprising at least one gallium nitride based LED that produces shorter wavelength light and at least one third recipient luminophoric medium that downconverts at least some of the shorter wavelength light to longer wavelength light, where a peak wavelength of the light emitted by the at least one third recipient luminophoric medium exceeds a peak wavelength of the light emitted by the at least one second recipient luminophoric medium.

In some embodiment, the lighting apparatus may emit light having a correlated color temperature of between 1800 K and 5500 K, a CRI value between 80 and 99, a CRI R9 value between 15 and 75, and a Qg value between 90 and 110 when the gallium nitride based LEDs are operating at steady-state operating temperatures of at least 80° C. The at least one gallium nitride based LED included in the distinct yellow/green light emitting regions may have a peak wavelength that is less than 455 nm and the at least one gallium nitride based LED included in the distinct red/orange light emitting regions may have a peak wavelength that is more than 460 nm. The at least one first recipient luminophoric medium may include both a $Y_3Al_5O_{12}:Ce$ phosphor and a $Lu_3Al_5O_{12}:Ce$ phosphor. The lighting apparatus may comprise an A series light bulb.

Pursuant to yet additional embodiments of the present invention, a lighting apparatus is provided that includes an optically transmissive enclosure comprising an interior volume and shaped in accordance with an A series bulb; a plurality of distinct yellow/green light emitting regions that are configured to emit light into the interior volume, the yellow/green light emitting regions comprising at least one gallium nitride based LED that produces shorter wavelength light and at least one first recipient luminophoric medium that downconverts at least some of the shorter wavelength light to longer wavelength light; and a plurality of distinct red/orange light emitting regions that are configured to emit light into the interior volume, the red/orange light emitting regions comprising at least one gallium nitride based LED that produces shorter wavelength light and at least one second recipient luminophoric medium that downconverts at least some of the shorter wavelength light to longer wavelength light.

In some embodiments, the at least one first recipient luminophoric medium may include a $Y_3Al_5O_{12}:Ce$ phosphor and/or a $Lu_3Al_5O_{12}:Ce$ phosphor, and the at least one second recipient luminophoric medium may include a first $(Ca_{1-x}Sr_x)SiAlN_3:Eu^{2+}$ phosphor. For example, the at least one second recipient luminophoric medium may include a second $(Ca_{1-x}Sr_x)SiAlN_3:Eu^{2+}$ phosphor that has a peak wavelength that is greater than a peak wavelength of the first $(Ca_{1-x}Sr_x)SiAlN_3:Eu^{2+}$ phosphor.

In some embodiments, the lighting apparatus may further include a second plurality of distinct red/orange light emitting regions that are configured to emit light into the interior volume, the second red/orange light emitting regions comprising at least one gallium nitride based LED that produces shorter wavelength light and at least one third recipient luminophoric medium that downconverts at least some of the shorter wavelength light to longer wavelength light, wherein a peak wavelength of the light emitted by the at least one third recipient luminophoric medium exceeds a peak wavelength of the light emitted by the at least one second recipient luminophoric medium.

The lighting apparatus may emit light having a correlated color temperature of between 1800 K and 5500 K, a CRI value between 80 and 99, a CRI R9 value between 15 and 75, and a Qg value between 90 and 110 when the gallium nitride based LEDs are operating at steady-state operating temperatures of at least 80° C.

The at least one gallium nitride based LED included in the distinct yellow/green light emitting regions may have a peak wavelength that is less than 455 nm and the at least one gallium nitride based LED included in the distinct red/orange light emitting regions may have a peak wavelength that is more than 460 nm. The at least one first recipient luminophoric medium may include both a $Y_3Al_5O_{12}:Ce$ phosphor and a $Lu_3Al_5O_{12}:Ce$ phosphor.

Pursuant to yet additional embodiments of the present invention, A-series solid state light bulbs are provided that comprise an A-series light bulb body; a diffuse optical enclosure mounted on the A-series light bulb body; a reflector within the diffuse optical enclosure; and a submount having at least one blue-shifted-yellow/green emitter and at least one blue-shifted-red emitter in a central section of the submount and a plurality of blue-shifted-yellow/green emitters and a plurality of blue-shifted-red emitters arranged around a periphery of the submount. Each blue-shifted-yellow/green emitter emits light having a peak wavelength in the yellow or green color ranges and each blue-shifted-red emitter emits light having a peak wavelength in the red color range.

In some embodiments, the at least one blue-shifted-yellow/green emitter and the at least one blue-shifted-red emitter in the central section of the submount may comprise a packaged LED component that includes at least one blue LED on an LED mounting surface, a first recipient luminophoric medium having a first phosphor on top of a first region of the LED mounting surface and a second recipient luminophoric medium having a second phosphor that is different from the first phosphor on top of a second region of the LED mounting surface, where the first recipient luminophoric medium is separate from the second recipient luminophoric medium and the second recipient luminophoric medium is not on top of the first region and the first recipient luminophoric medium is not on top of the second region.

In some embodiments, the first and second recipient luminophoric regions may be disposed side-by-side on the at least one LED. The plurality of blue-shifted-yellow/green emitters and the plurality of blue-shifted-red emitters that are arranged around the periphery of the submount may comprise a plurality of packaged LED components, each packaged LED component including at least one blue LED on a respective LED mounting surface, a first recipient luminophoric medium having a first phosphor on top of a first region of the LED mounting surface and a second recipient luminophoric medium having a second phosphor that is different from the first phosphor on top of a second region of the LED mounting surface, where the first recipient luminophoric medium is separate from the second recipient luminophoric medium and the second recipient luminophoric medium is not on top of the first region and the first recipient luminophoric medium is not on top of the second region.

The reflector may be positioned above the submount and may have a truncated frusto-conical shape.

Pursuant to additional embodiments of the present invention, solid state light fixtures are provided that comprise a diffuse optical enclosure having an interior volume; a plurality of blue-shifted-yellow/green emitters that are configured to emit light into the interior volume; a plurality of blue-shifted-red emitters that are configured to emit light into the interior volume; and a controller that controls the relative current levels provided to the plurality of blue-shifted-yellow/green emitters and the plurality of blue-shifted-red emitters. The controller is configured to increase the relative amount of drive current supplied to the blue-shifted-red emitters as compared to the blue-shifted-yellow/green emitters when the solid state light fixture is dimmed. The solid state light fixture may be an A-19 or A-21 solid state light bulb.

In some embodiments, the correlated color temperature of the light emitted from the diffuse optical enclosure may generally decrease with an increasing level of dimming.

In some embodiments, each blue-shifted-yellow/green emitter may be a first blue LED and an associated first recipient luminophoric medium that includes a $Y_3Al_5O_{12}$:Ce phosphor and/or a $Lu_3Al_5O_{12}$:Ce phosphor, and each blue-shifted-red emitter may be a second blue LED and an associated second recipient luminophoric medium that includes a first $(Ca_{1-x}Sr_x)SiAlN_3$:$Eu^{2+}$ phosphor. In other embodiments, each blue-shifted-yellow/green emitter may be a first blue LED and an associated first recipient luminophoric medium that includes a $Y_3Al_5O_{12}$:Ce phosphor and/or a $Lu_3Al_5O_{12}$:Ce phosphor, and some of the blue-shifted-red emitters may each comprise a second blue LED and an associated second recipient luminophoric medium that includes a first $(Ca_{1-x}Sr_x)SiAlN_3$:$Eu^{2+}$ phosphor and others of the blue-shifted-red emitters may each comprise a third blue LED and an associated third recipient luminophoric medium that includes a second $(Ca_{1-x}Sr_x)SiAlN_3$:$Eu^{2+}$ phosphor that has a peak wavelength that is greater than a peak wavelength of the first $(Ca_{1-x}Sr_x)SiAlN_3$:$Eu^{2+}$ phosphor.

Each blue-shifted-yellow/green emitter may comprise a first blue LED and an associated first recipient luminophoric medium that includes a $Y_3Al_5O_{12}$:Ce phosphor and/or a $Lu_3Al_5O_{12}$:Ce phosphor, and each blue-shifted-red emitter may comprise a second blue LED and an associated second recipient luminophoric medium that includes a first $(Ca_{1-x}Sr_x)SiAlN_3$:$Eu^{2+}$ phosphor and a second $(Ca_{1-x}Sr_x)SiAlN_3$:$Eu^{2+}$ phosphor that has a peak wavelength that is greater than a peak wavelength of the first $(Ca_{1-x}Sr_x)SiAlN_3$:$Eu^{2+}$ phosphor.

Pursuant to still further embodiments of the present invention, solid state light fixtures are provided that include a body; a diffuse optical enclosure mounted on the body; a reflector and/or a secondary optical structure within the diffuse optical enclosure; and a submount having at least one blue-shifted-yellow/green emitter and at least one blue-shifted-red emitter in a central section of the submount and a plurality of blue-shifted-yellow/green emitters and a plurality of blue-shifted-red emitters arranged around a periphery of the submount. Each blue-shifted-yellow/green emitter emits light having a peak wavelength in the yellow or green color ranges and each blue-shifted-red emitter emits light having a peak wavelength in the red color range.

In some embodiments, the at least one blue-shifted-yellow/green emitter and at least one blue-shifted-red emitter in the central section of the submount may comprise a packaged LED component that includes at least one blue LED on an LED mounting surface, a first recipient luminophoric medium having a first phosphor on top of a first region of the LED mounting surface and a second recipient luminophoric medium having a second phosphor that is different from the first phosphor on top of a second region of the LED mounting surface, where the first recipient luminophoric medium is separate from the second recipient luminophoric medium and the second recipient luminophoric medium is not on top of the first region and the first recipient luminophoric medium is not on top of the second region.

In some embodiments, the first and second recipient luminophoric regions may be disposed side-by-side on the at least one blue LED. The plurality of blue-shifted-yellow/green emitters and the plurality of blue-shifted-red emitters that are arranged around the periphery of the submount may comprise a plurality of packaged LED components, each packaged LED component including at least one blue LED on a respective LED mounting surface, a first recipient luminophoric medium having a first phosphor on top of a first region of the LED mounting surface and a second recipient luminophoric medium having a second phosphor that is different from the first phosphor on top of a second region of the LED mounting surface, where the first recipient luminophoric medium is separate from the second recipient luminophoric medium and the second recipient luminophoric medium is not on top of the first region and the first recipient luminophoric medium is not on top of the second region.

The secondary optical structure may comprise a total internal reflector optic that reflects a first portion of the light from the at least one blue-shifted-yellow/green emitter, the at least one blue-shifted-red emitter, the plurality of blue-shifted-yellow/green emitters and/or the plurality of blue-shifted-red emitters and that receives and substantially totally internally reflects a second portion of the light from the at least one blue-shifted-yellow/green emitter, the at least one blue-shifted-red emitter, the plurality of blue-shifted-yellow/green emitters and/or the plurality of blue-shifted-red emitters.

Pursuant to yet additional embodiments of the present invention, LED based light fixtures are provide that include a plurality of blue-shifted-yellow/green LED packages, the blue-shifted-yellow/green LED packages including low-phosphor LED packages and high phosphor LED packages, the high phosphor LED packages having a higher phosphor conversion ratio than the low phosphor LED packages; and a plurality of blue-shifted-red LED packages. The blue-shifted-red LED packages extend in a first row, and a first subset of the blue-shifted-yellow/green LED packages extend in a second row on a first side of the blue-shifted-red LED packages and a second subset of the blue-shifted-yellow/green LED packages extend in a third row on a second side of the blue-shifted-red LED packages that is opposite the first side.

In some embodiments, the blue-shifted-yellow/green LED packages in the second row may include both low phosphor LED packages and high phosphor LED packages. The blue-shifted-yellow/green LED packages in the third row may also include both low phosphor LED packages and high phosphor LED packages. The blue-shifted-red LED packages may be electrically connected in series to form a first LED string and the low phosphor LED packages may be electrically connected in series to form a second LED string. The second LED string may cross the first LED string in at least four locations. Likewise, the high phosphor LED packages may be electrically connected in series to form a third LED string, and this third LED string may cross the first LED string in at least four locations. The third LED string may also cross the second LED string in at least four locations. The light fixture may include additional strings of blue-shifted-yellow/green LED packages and/or of blue-shifted-red LED packages.

In some embodiments, a first end of the second row may extend beyond a first end of the first row, and a second end of the second row may extend beyond a second end of the first row. Similarly, a first end of the third row may extend beyond the first end of the first row, and a second end of the third row may extend beyond the second end of the first row.

In some embodiments, the high phosphor LED packages may each include a first amount of a first phosphor and the low phosphor LED packages may each include a second amount of the first phosphor, where the first amount is between twice and seven times the second amount. In other embodiments, the first amount may be between three times and six times the second amount.

In some embodiments, an average separation between adjacent ones of the blue-shifted-red LED packages in the first row may be less than an average separation between adjacent ones of the blue-shifted-yellow/green LED packages in the second row. Similarly, an average separation between adjacent ones of the blue-shifted-red LED packages in the first row may be less than an average separation between adjacent ones of the blue-shifted-yellow/green LED packages in the third row.

Pursuant to further embodiments of the present invention, tunable LED-based light fixtures are provided that include a plurality of blue-shifted-yellow/green LED packages, the blue-shifted-yellow/green LED packages including low-phosphor LED packages that each include a first amount of a first phosphor and high phosphor LED packages that each include a second amount of the first phosphor and a plurality of blue-shifted-red LED packages, where the second amount is between two and seven times the first amount.

In some embodiments, the blue-shifted-red LED packages may extend in a first row and the blue-shifted-yellow/green LED packages may extend in a second row and in a third row, with the second row extending on a first side of the first row and the third row extending on a second side of the first row that is opposite the first side. The second and third rows may be generally parallel to the first row. The second row may include both low phosphor LED packages and high phosphor LED packages, and the third row may include both low phosphor LED packages and high phosphor LED packages.

In some embodiments, the blue-shifted-red LED packages may be electrically connected in series to form a first LED string and the low phosphor LED packages may be electrically connected in series to form a second LED string. The second LED string may cross the first LED string in at least four locations. Likewise, the high phosphor LED packages may be electrically connected in series to form a third LED string, and this third LED string may cross the first LED string in at least four locations. In some embodiments, the third LED string may cross the second LED string in at least four locations.

In some embodiments, a second line defined by the second row may have respective endpoints that extend beyond respective endpoints of a first line defined by the first row, and/or a third line defined by the third row may have respective endpoints that extend beyond respective endpoints of the first line. In some embodiments, an average separation between adjacent ones of the blue-shifted-red LED packages in the first row may be less than an average separation between adjacent ones of the blue-shifted-yellow/green LED packages in the second row, and/or the average separation between adjacent ones of the blue-shifted-red LED packages in the first row may be less than an average separation between adjacent ones of the blue-shifted-yellow/green LED packages in the third row.

BRIEF DESCRIPTION OF THE DRAWINGS

FIG. 11A is a schematic perspective view of a solid state light bulb according to embodiments of the present invention with the dome omitted.

FIG. 11B is a perspective view of a printed circuit board that is included in the solid state light bulb of FIG. 11A that has seven blue-shifted-yellow LED packages and seven blue-shifted-red LED packages mounted thereon.

FIG. 11C is a cross-sectional view of the solid state light bulb of FIG. 11A with a reflector omitted to better show the printed circuit board.

FIG. 22A is a plan view of a tunable troffer light fixture according to further embodiments of the present invention with a call-out illustrating the arrangement of the LED packages included therein in greater detail.

FIG. 23 is a plan view of an alternative printed circuit board that may be used in the light fixture of FIG. 22A.

DETAILED DESCRIPTION

The present invention is directed to solid state light fixtures that emit white light that are suitable for high temperature operation. These light fixtures include both LEDs that have recipient luminophoric mediums that include yellow and/or green light emitting phosphors as well as LEDs that have recipient luminophoric mediums that include red light emitting phosphors. The solid state light fixtures according to embodiments of the present invention may exhibit high luminous efficiency levels while providing excellent color rendering performance and may maintain high levels of performance when the LEDs included therein are operating at elevated temperatures such as temperatures of 80° C. or 90° C. or 100° C. or more.

As used herein, the term "solid state light fixture" refers to a packaged lamp, light bulb or other light fixture (e.g., ceiling mounted "troffer" light fixtures that are used as replacement for conventional fluorescent light fixtures) that include a plurality of LEDs. The LEDs may comprise, for example III-V nitride (e.g., gallium nitride) based LEDs that are fabricated on a silicon carbide, sapphire or gallium nitride substrates such as various devices manufactured and/or sold by Cree, Inc. of Durham, N.C. Such LEDs may (or may not) be configured to operate such that light emission occurs through the growth substrate (or a semiconductor layer that was near the growth substrate if the growth substrate is removed) in a so-called "flip chip" orientation. The LEDs may be vertical devices with a cathode contact on one side of the LED, and an anode contact on an opposite side of the LED, or may be lateral devices in which both contacts are on the same side of the device. The design and fabrication of LEDs are well known to those skilled in the art, and hence further description thereof will be omitted.

Visible light may include light having many different wavelengths. The apparent color of visible light can be illustrated with reference to a two-dimensional chromaticity diagram, such as the 1931 CIE Chromaticity Diagram illustrated in FIG. 1. Chromaticity diagrams provide a useful reference for defining colors as weighted sums of colors.

Figure 1:
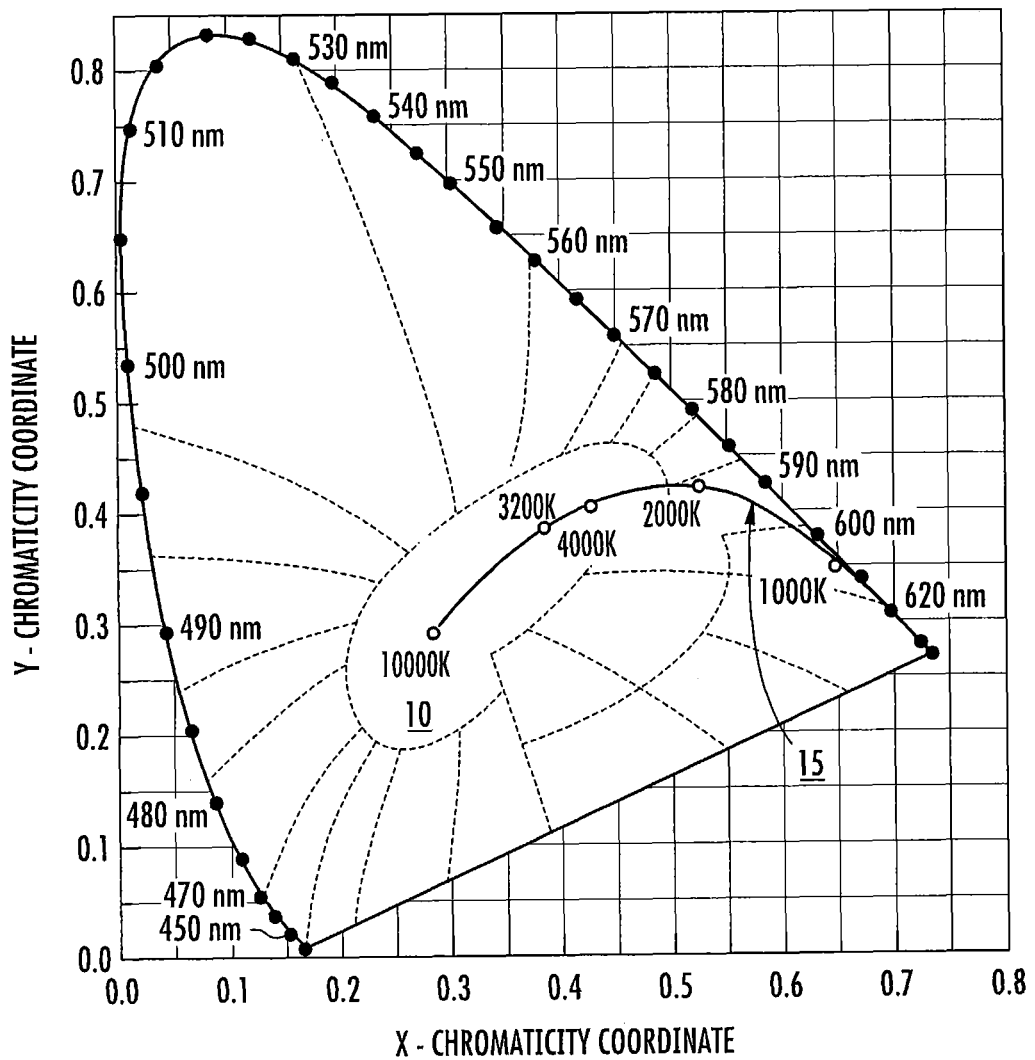
FIG. 1 is a graph of a 1931 CIE Chromaticity Diagram illustrating the location of the planckian locus.

As shown in FIG. 1, colors on a 1931 CIE Chromaticity Diagram are defined by x and y chromaticity coordinates that fall within a generally U-shaped area. Colors on or near the outside of the area are saturated colors composed of light having a single wavelength, or a very small wavelength distribution. Colors on the interior of the area are unsaturated colors that are composed of a mixture of light of different wavelengths. White light, which can be a mixture of light of many different wavelengths, is generally found near the middle of the diagram, in the region labeled 10 in FIG. 1. There are many different hues of light that may be considered "white," as evidenced by the size of the region 10. For example, some "white" light, such as light generated by sodium vapor lighting devices, may appear yellowish in color, while other "white" light, such as light generated by some fluorescent lighting devices, may appear more bluish in color.

A binary combination of light from light sources emitting light of first and second colors may appear to have a different color than either of the two constituent colors. The color of the combined light may depend on the wavelengths and relative intensities of the two light sources. For example, light emitted by a combination of a blue source and a red source may appear purple or magenta to an observer. Similarly, light emitted by a combination of a blue source and a yellow source may appear white to an observer.

Each point in the graph of FIG. 1 is referred to as the "color point" of a light source that emits a light having that color. As shown in FIG. 1 a locus of color points that is referred to as the "black-body" locus 15 exists which corresponds to the location of color points of light emitted by a black-body radiator that is heated to various temperatures. The black-body locus 15 is also referred to as the "planckian" locus because the chromaticity coordinates (i.e., color points) that lie along the black-body locus obey Planck's equation: $E(\lambda)=A\lambda^{-5}/(e^{B/T}-1)$, where E is the emission intensity, $\lambda$ is the emission wavelength, T is the color temperature of the black-body and A and B are constants. Color coordinates that lie on or near the black-body locus 15 yield pleasing white light to a human observer.

As a heated object becomes incandescent, it first glows reddish, then yellowish, and finally bluish with increasing temperature. This occurs because the wavelength associated with the peak radiation of the black-body radiator becomes progressively shorter with increased temperature, consistent with the Wien Displacement Law. Illuminants that produce light which is on or near the black-body locus 15 can thus be described in terms of their correlated color temperature ("CCT"). As used herein, the term "white light" refers to light that is perceived as white, is within 7 MacAdam ellipses of the black-body locus on a 1931 CIE chromaticity diagram, and has a CCT ranging from 2000K to 10,000K. White light with a CCT of 4000K may appear yellowish in color, while white light with a CCT of 8000K or more may appear more bluish in color, and may be referred to as "cool" white light. "Warm" white light may be used to describe white light with a CCT of between about 2500K and 4500K, which is more reddish or yellowish in color. Warm white light is generally a pleasing color to a human observer. Warm white light with a CCT of 2500K to 3300K may be preferred for certain applications.

The ability of a light source to accurately reproduce color in illuminated objects is typically characterized using the color rendering index ("CRT"). The CRT of a light source is a modified average of the relative measurements of how the color rendition of an illumination system compares to that of a reference black-body radiator when illuminating eight reference colors. Thus, the CRT is a relative measure of the shift in surface color of an object when lit by a particular lamp. The CRT equals 100 if the color coordinates of a set of test colors being illuminated by the illumination system are the same as the coordinates of the same test colors being irradiated by the black-body radiator. Daylight generally has a CRT of nearly 100, incandescent bulbs have a CRT of about 95, fluorescent lighting typically has a CRT of about 70 to 85, while monochromatic light sources have a CRT of essentially zero. Light sources for general illumination applications with a CRT of less than 50 are generally considered very poor and are typically only used in applications where economic issues preclude other alternatives. Light sources with a CRT value between 70 and 80 have application for general illumination where the colors of objects are not important. For some general interior illumination, a CRT value of greater than 80 is acceptable. A light source with color coordinates within 4 MacAdam step ellipses of the planckian locus 15 and a CRT value that exceeds 85 is more suitable for general illumination purposes. Light sources with CRT values of more than 90 provide greater color quality.

For general illumination and various other applications, it is often desirable to provide a lighting source that generates white light having a relatively high CRI, so that objects illuminated by the lighting source may appear to have more natural coloring to the human eye. Accordingly, such lighting sources may typically include an array of semiconductor lighting devices including red, green and blue light emitting devices. When red, green and blue light emitting devices are energized simultaneously, the resulting combined light may appear white, or nearly white. However, even light that is a combination of red, green and blue emitters may have a low CRI, particularly if the emitters generate saturated light, because such light may lack contributions from many visible wavelengths.

While CRI is useful in gauging the color rendering performance of a light source, standing alone, CRI may not always provide a satisfactory measure of the color quality. In particular, CRI is an average color rendering value for eight specific sample colors that are generally referred to as R1-R8. These eight color samples R1-R8 are primarily pastel shades, as opposed to saturated colors. As such, light emitting devices that emit light having high CRI values may still fall short in rendering certain hues such as red hues. For example, the red content of a light source may be important for accurately rendering colors of various foods, skin tones, wood, furniture and other objects. Only a few of the color samples used to compute CRI have significant red content (namely sample R1, which is a pink shade, and sample R8, which is a purple shade), and these samples are not saturated color samples. As such, high CRI scores may be achieved even without significant red content in a light source, and thus a high CRI score may be achieved in some cases even though the light source may not do a good job of rendering red hues.

In order to address this issue, seven additional color samples, labeled CRI R9-R15, have been defined that measure the color rendering of a light source for either saturated colors (R9-R12, corresponding to saturated red, yellow, green and blue light) or for other colors (R13-R15) corresponding to two different skin tones and leaf green. These color samples are not used in calculating CRI, which is based solely on color samples R1-R8, but may be important when evaluating the color rendering of a particular light source. The sample color R9 is the saturated red color, and it is generally known that the ability to reproduce red colors well is key for accurately rendering colors, as the color red is often found mixed into processed colors. Accordingly, all else being equal, lamps with high R9 values tend to produce the most vivid colors. Thus, the CRI R9 value of light emitted by a light source is also often considered to be an important performance parameter for the light source.

Figure 2:
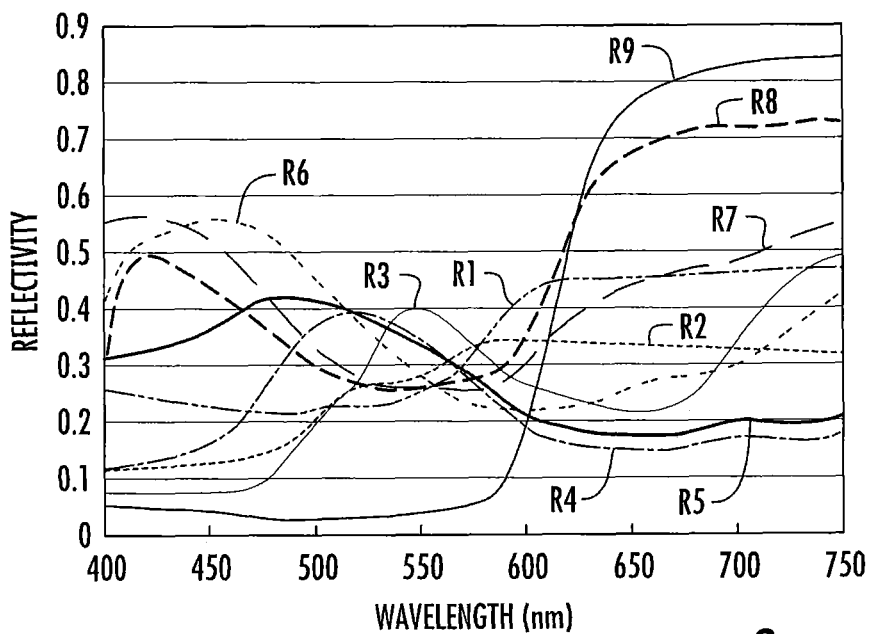
FIG. 2 is a graph illustrating the reflectance spectra for the CRI R1-R9 color samples when illuminated by a reference light source.

Since color sample R9 corresponds to a saturated color, there is no way to achieve a high R9 score without a significant red content in the light source. This can be seen in FIG. 2, which shows the reflectance spectra (i.e., reflected power as a function of wavelength) for the R1-R9 color samples when illuminated by a reference light source. As can be seen in FIG. 2, color samples R1-R8 include mixes of many different colors, as shown by the fact that samples R1-R8 have significant contribution across a broad portion of the visible light spectrum, whereas color sample R9 includes very high spectral reflectivity in the red region with virtually no reflectivity below 600 nm. Thus, the R9 color sample may provide a very good indicator of a light source's ability to accurately render the color of red objects, and for this reason is often considered along with CRI in evaluating the quality of the color of a light source.

In addition, CRI also confers limited ability to predict color discrimination (i.e., to perceive subtle difference in hue) or color preference. There appears to be a natural human attraction to brighter color. Daylight provides a spectrum of light that allows the human eye to perceive bright and vivid colors, which allows a human observer to distinguish objects having even very subtle color shade differences. Accordingly, it is generally recognized that daylight and blackbody sources are superior to many artificial light sources for emphasizing and distinguishing color. The ability of human vision to differentiate color is different under correlated color temperature conditions providing the same CRI. Such differentiation is proportional to the gamut area of the illuminating light.

The gamut area of a light source can be calculated as the area enclosed within a polygon defined by the chromaticities in CIE 1976 u'v' color space of the eight color samples R1-R8 used to calculate CRI when illuminated by a test light source. Gamut area index (GM) is a convenient way of characterizing in chromaticity space how saturated the illumination makes objects appear—with a larger GAI making object colors appear more saturated. GM is a relative number whereby an imaginary equal-energy spectrum (wherein radiant power is equal at all wavelengths) is scored as 100. GM for a test source is determined by comparing color space area of the light being tested to the color space area produced by the imaginary or theoretical equal-energy spectrum (EES) source. Unlike CRI, which has a maximum value of 100, GAI can exceed 100, meaning that some sources saturate colors more than an equal-energy source saturates color.

Typical blackbody-like light sources and typical daylight-like light sources have different gamut areas. Low correlated color temperature sources (e.g., incandescent emitters) have a GAI of approximately 50% (i.e., about half the gamut area of the EES source). Sources with higher correlated color temperature values have a larger GAI. For example, a very bluish light with a correlated color temperature of 10000K may have a GAI of 140%.

Another way of characterizing how saturated an illuminant makes objects appear is relative gamut area, or "Qg", which is also referred to as the "Color Quality Scale Qg," which is the area formed by (a*, b*) coordinates of the 15 test-color samples R1-R15 normalized by the gamut area of a reference illuminant at the same correlated color temperature and multiplied by 100. In a manner similar to GAI, Qg values can exceed 100; however, Qg values are scaled for consistency relative to correlated color temperature. Because of chromatic adaptation, and because correlated color temperature is selected to set the overall color tone of an environment as part of the lighting design process, variable-reference measures such as Qg may be especially relevant to applied lighting design. If the relative gamut is greater than that of the reference, and illuminance is lower than that provided by daylight, then an increase in preference and discrimination might be expected relative to the reference at that same correlated color temperature. Conversely, if the relative gamut is smaller than that of the reference, then a decrease in preference and discrimination might be expected relative to the reference at the same correlated color temperature.

High Qg values are generally associated with more vivid colors. It is believed that, in at least certain contexts, some consumers may prefer light sources with significantly enhanced vividness. It may, however, be challenging to provide enhanced vividness in combination with high luminous efficacy, and further in combination with reasonably high color rendering index values.

Another important performance parameter for an LED lighting source is the intensity of the light emitted, which is referred to as the radiant flux of the device. However, as the human eye has varying sensitivity to different wavelengths of light, the intensity of the light emitted by a lighting source is most typically measured in terms of the lighting source's "luminous flux," which is a measure of the power of the light emitted by a light source as perceived by a human observer. The luminous flux of a light source is typically measured in lumens (lm). The luminous flux of a light source differs from the radiant flux of the light source in that the radiant flux measures the total power emitted, while the luminous flux weights the power of the light emitted at each wavelength based on a luminosity function which represents the response of the human eye for each different wavelength.

Figure 3:
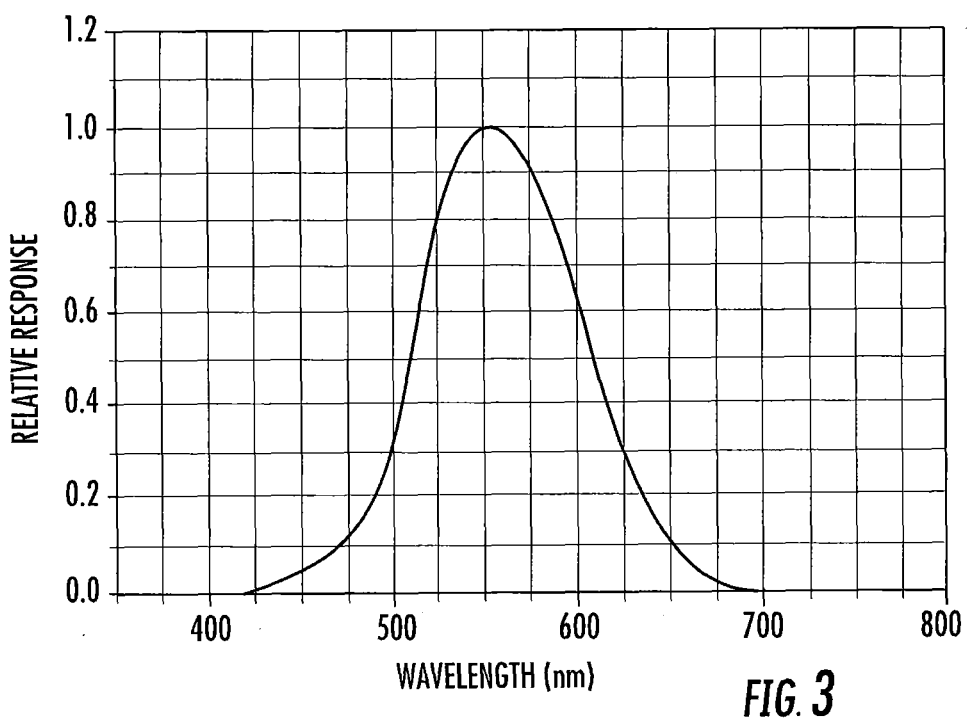
FIG. 3 is a graph illustrating the response of the human eye to light in the visible light spectrum.

FIG. 3 is a graph of the above-referenced luminosity function that corresponds to the response of the human eye to light in the visible light spectrum. As shown in FIG. 3, the human eye cannot perceive light at wavelengths below about 400 nm and above about 700 nm. The maximum response of the human eye to light occurs at about 555 nm. In calculating luminous flux, the radiant flux of a light source is weighted based on the eye sensitivity curve of FIG. 3. As the amount of light emitted by an LED is generally a function of the power input to the LED, the luminous flux performance of semiconductor light emitting devices are typically compared with each device being driven at the same input power level or, alternatively, the devices may be compared in terms of the luminous flux per unit of input power (e.g., lumens per Watt) that each device emits at the input power level for which each device is designed to operate.

Because of the varying sensitivity of the human eye to light of different wavelengths, there tends to be a tradeoff between the luminous flux of the light emitted by an LED lighting source and the CRI of the light emitted. For example, since the human eye is most sensitive to light at a wavelength of about 555 nm, a monochromatic light source at 555 nm would exhibit a high luminous flux value. However, in order to obtain high CRI values, it is generally necessary to have light contribution across a wide range of wavelengths, including wavelengths that are relatively far away from 555 nm where the peak sensitivity of light to the human eye occurs. This is particularly true with respect to CRI R9 performance which is a measure of color rendering in the red color range. Because the human eye has reduced sensitivity to the wavelengths on either end of the visible light spectrum, the light contributions that are often added to improve the CRI of a device may result in a decrease in the luminous efficiency of the device.

As will be described in greater detail below, solid state light fixtures according to embodiments of the present invention include LEDs and associated recipient luminophoric mediums that include phosphors that have peak emission wavelengths in various color ranges. For purposes of this disclosure, the various color ranges of visible light are defined as shown in TABLE 1 below. It will be appreciated, however, that there are not sharp boundaries between different colors of the spectrum. For example, light having wavelengths from 430-450 nm may appear blue-violet, while light having wavelengths from 540-560 nm may appear yellow-green, etc.

TABLE 1

| Color | Wavelength Range (nm) |
|---|---|
| Blue | 430-479 |
| Cyan | 480-510 |
| Green | 511-549 |
| Yellow | 550-580 |
| Orange | 581-604 |
| Red | 605-700 |

An LED or phosphor that emits light having a peak wavelength in one of the above color ranges may be referred to with reference to the color range. By way of example, a phosphor that emits light having a peak wavelength of 630 nm may be referred to herein as a "red phosphor," while a phosphor that emits light having a peak wavelength of 535 nm may be referred to as a "green phosphor."

There is a demand for solid state light fixtures such as, for example, solid state light bulbs that look and feel to a consumer like a conventional incandescent light fixture or bulb. This demand tends to place limits on the size and form factor of solid state light fixtures. Moreover, cost is a critical constraint for many solid state light fixtures.

One potential issue with solid state light fixtures is heat generation. While a solid state light bulb (or other fixture) typically is far cooler under steady-state operation than an incandescent light bulb that generates a similar amount of light, the LEDs themselves are driven at currents that are sufficient to cause the LEDs to heat up to fairly high temperatures such as temperatures in excess of 100° C. While the heat produced by incandescent sources is generally radiated away as infrared emission, the heat produced by LEDs is concentrated at the chip/package level and needs to be removed through conduction, using thermally conductive heat sinks. Unfortunately, with respect at least to the types of LEDs that are typically used in light fixtures, the performance of the LED tends to decrease with increasing operating temperature, resulting in reduced luminous flux and reduced reliability as the expected lifetime of an LED may decrease when operated at higher temperatures. Accordingly, heat generation in solid state light fixtures may be a significant concern.

In order to mitigate the problems caused by heat generation, solid state light fixtures often include physical structures such as heat sinks that are designed to vent the heat that is generated during operation of the LEDs away from the LEDs and, in some embodiments, to outside the solid state light fixture. These heat sinks typically are formed of metal or other materials that have high thermal conductivity and may be designed to provide pathways for transferring heat that builds up in the vicinity of the LEDs to outside the light fixture. For larger footprint applications such as T8 tubes or troffers, another thermal management approach may be used to prevent elevated LED temperatures. In particular, in such larger footprint applications, spatially dispersed (distributed) LED sources may be used where more numerous LEDs run at lower power and therefore locally produce a lower heat load and hence lower LED operating temperatures. When solid state light fixtures include heat sinks or distributed LED designs, it is typically possible to maintain the temperature of the LEDs at relatively low levels (e.g., below 80° C.) where the LEDs may exhibit high luminous output and long expected operating lifetimes.

Unfortunately, the inclusion of heat sinks typically increases the fabrication cost of an LED light bulb, and may also tend to make the solid state light bulb look less like a traditional incandescent light bulb. Thus, it may be desirable to use smaller heat sinks in solid state light fixtures or forego the use of such heat sinks altogether. However, when smaller heat sinks are employed or the heat sinks are omitted altogether, the steady-state expected operating temperature of the LEDs may increase significantly. Also, a light bulb by its specified shape and lumen level is not a distributed light source design. For example, for a 60 Watt equivalent solid state light fixture that is implemented in a package that is roughly equivalent in size and shape to a conventional A19 incandescent light bulb with a minimal heat sink, the steady-state operating temperatures of the LEDs included in the device will typically be near 100° C. At these temperatures, luminous flux, reliability and color rendering of the LEDs may all be concerns, making it difficult to fabricate solid state light bulbs that provide acceptable performance.

Pursuant to embodiments of the present invention, solid state light fixtures are provided that may exhibit improved performance when the LEDs thereof are operating at higher temperatures such as, for example, temperatures of 80° C., 90° C. or 100° C. or more. These solid state light fixtures may include a plurality of blue-shifted-yellow and/or blue-shifted-green LED packages as well as a plurality of blue-shifted-red LED packages. Herein, the term "blue-shifted-yellow LED package" refers to an LED that emits light in the blue color range that has an associated recipient luminophoric medium that includes phosphor(s) that receive the blue light emitted by the blue LED and in response thereto emit light having a peak wavelength in the yellow color range. A common example of a blue-shifted-yellow LED package is a GaN-based blue LED that is coated or sprayed with a recipient luminophoric medium that includes a YAG: Ce phosphor. Similarly, as used herein the term "blue-shifted-green LED package" refers to an LED that emits light in the blue color range that has an associated recipient luminophoric medium that includes phosphor(s) that receive the blue light emitted by the blue LED and in response thereto emit light having a peak wavelength in the green color range, and the term "blue-shifted-red LED package" refers to an LED that emits light in the blue color range that has an associated recipient luminophoric medium that includes phosphor(s) that receive the blue light emitted by the blue LED and in response thereto emit light having a peak wavelength in the red color range. In some cases, a recipient luminophoric medium that is associated with a blue LED may include, for example, both green and yellow phosphors. In such a case, if the peak wavelength of the combined light output by the green and yellow phosphors is in the yellow color range, the LED is considered to be a blue-shifted-yellow LED package, whereas if the peak wavelength of the combined light output by the green and yellow phosphors is in the green color range, the LED is considered to be a blue-shifted-green LED package. Herein the term "blue-shifted-yellow/green LED package" refers to a phosphor converted blue LED where the phosphor particles have a peak wavelength in either the green or yellow color ranges.

Before describing the solid state light fixtures according to embodiments of the present invention in further detail it is helpful to discuss the approaches that have most often been employed conventionally to implement high luminous output solid state light bulbs that may be used as replacements for 40, 60, 75 and 100 Watt incandescent light bulbs.

Under the first conventional approach, light fixtures are provided that combine blue-shifted-yellow and/or blue-shifted-green LED packages with red LEDs which are typically AlInGaP based LEDs. These light fixtures may emit white light having excellent color rendering properties. Light fixtures implemented using this approach are sometimes referred to as "true white" solid state light fixtures because of their excellent color rendering properties. U.S. Pat. No. 7,213,940 discloses various true white solid state light fixtures.

Figure 4:
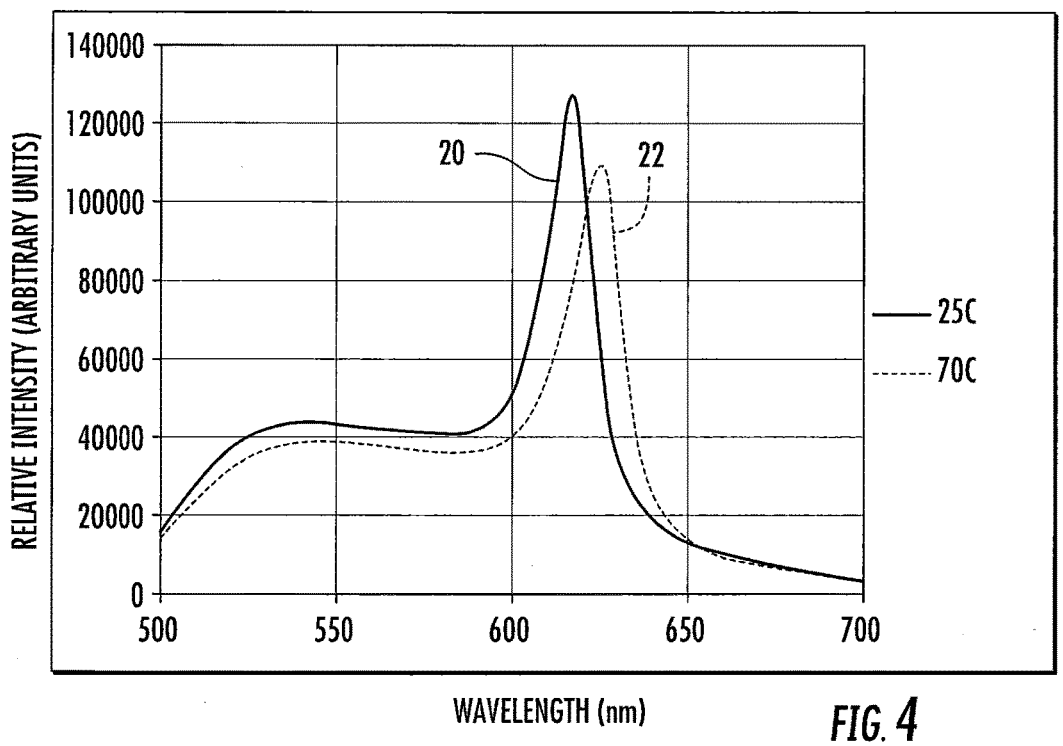
FIG. 4 is a graph illustrating the emission spectra as a function of operating temperature for a "true white" solid state light fixture that includes blue-shifted yellow LED packages and red AlInGaP LEDs.

Unfortunately, the red LEDs that are traditionally used in such true white solid state light fixtures may exhibit reduced efficiency at increased operating temperatures. For example, FIG. 4 is graph illustrating the emission spectra as a function of operating temperature for a "true white" solid state light fixture that includes both blue-shifted-yellow LED packages and red AlInGaP LEDs. In FIG. 4, curve 20 represents the emission spectrum for the true white solid state light fixture when the LEDs included therein are operating at a steady-state operating temperature of 25° C. Curve 22 illustrates the emission spectrum for the true white solid state light fixture when the LEDs included therein are operating at a steady-state operating temperature of 70° C. As can be seen, at the heightened operating temperature, the total output power decreases significantly and the wavelength of the peak in the red color range shifts to the right (i.e., to longer wavelengths).

As discussed above with reference to FIG. 3, the human eye is less responsive to light at these higher wavelengths, which means that the shift to such higher wavelengths may reduce the luminous efficiency of the device and change the color of the light as compared to when the LEDs are operated at lower temperatures (such as at the initial turn-on of the light fixture or when in a cooler ambient). In order to address this color shift, color control circuitry may be included in true white solid state light fixtures that adjusts the relative drive current that is supplied to the blue-shifted-yellow LED packages as compared to the red LEDs in order to maintain the color point of the device close to a desired value. However, this approach requires additional circuitry, which drives up the manufacturing cost of the light fixture and potentially increases the size of the light fixture, and this approach may reduce the luminous efficiency of the device as it typically requires increasing the amount of current supplied to the red LEDs which are typically less efficient as compared to the blue-shifted-yellow LED packages. This gap in performance increases with increasing operating temperature.

Figure 5A:
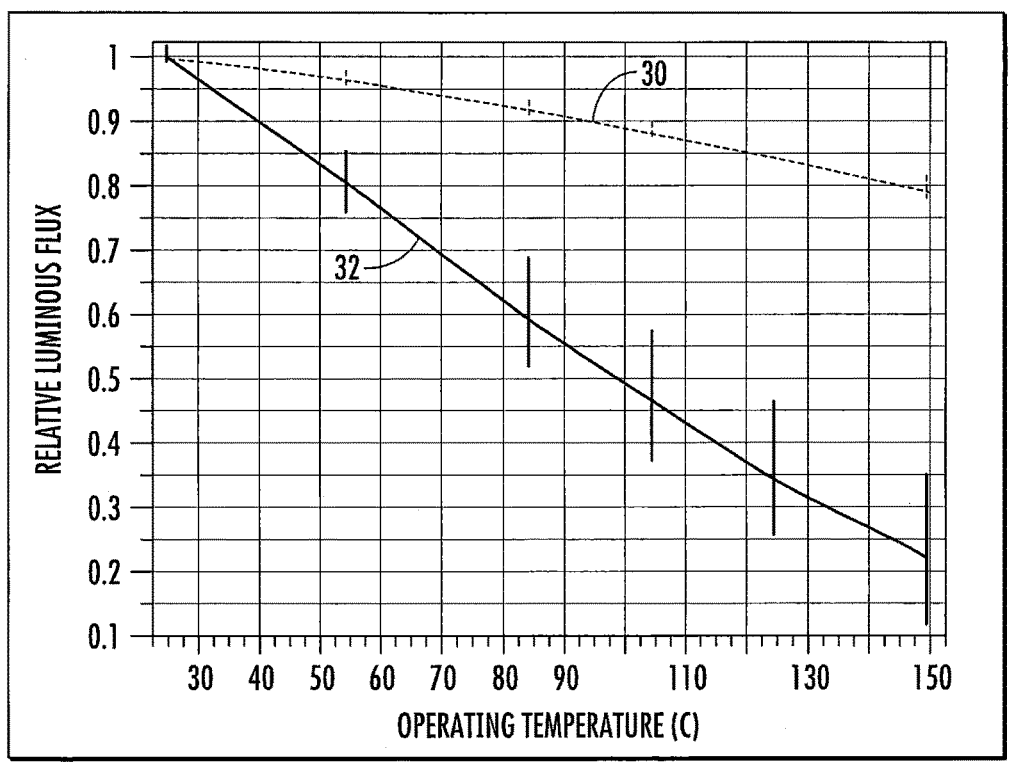
FIG. 5A is a graph illustrating the relative luminous flux as a function of operating temperature output by a blue-shifted-red LED package and a red AlInGaP LED.

Moreover, the luminous efficiency of the red AlInGaP LEDs tends to not only degrade at higher temperature because of the color shift, but also because the power output by the red LEDs decreases with increased operating temperature, and does so at a rate that is faster than the corresponding rate of decrease for the gallium nitride based blue LEDs that are typically used in the blue-shifted-yellow LED packages. The luminous flux performance of a sample red AlInGaP LED as compared to a sample blue-shifted-red LED package formed using a gallium nitride based blue LED is illustrated in FIG. 5A. In FIG. 5A, the output of the red LEDs and the blue-shifted-yellow LED packages are self-normalized to their own flux values at an operating temperature of 25° C. to highlight the difference in how the performance of these devices changes as a function of operating temperature. As can be seen in FIG. 5A, the luminous output of the red AlInGaP LED (curve 32) deteriorates at a rapid rate with increasing operating temperature, such that at an operating temperature of 150° C. the luminous output is less than 25% of the luminous output at 25° C. In contrast, while the luminous output of the blue-shifted-red LED package (curve 30) also decreases with increasing operating temperature, it does so much more slowly, and at an operating temperature of 150° C. the luminous output is still about 80% of the luminous output at 25° C. As can also be seen in FIG. 5A, at an operating temperature of about 100° C., the luminous flux of a conventional red AlInGaP LED is only about 50% of the luminous flux thereof when operated at 25° C., and the reliability (i.e., expected operating lifetime) of red AlInGaP LEDs at such elevated temperatures may be significantly reduced. At high operating temperatures (e.g., temperatures of about 100° C. or more), a blue-shifted-red LED package may be brighter and more efficient than a red AlInGaP LED.

Figure 5B:
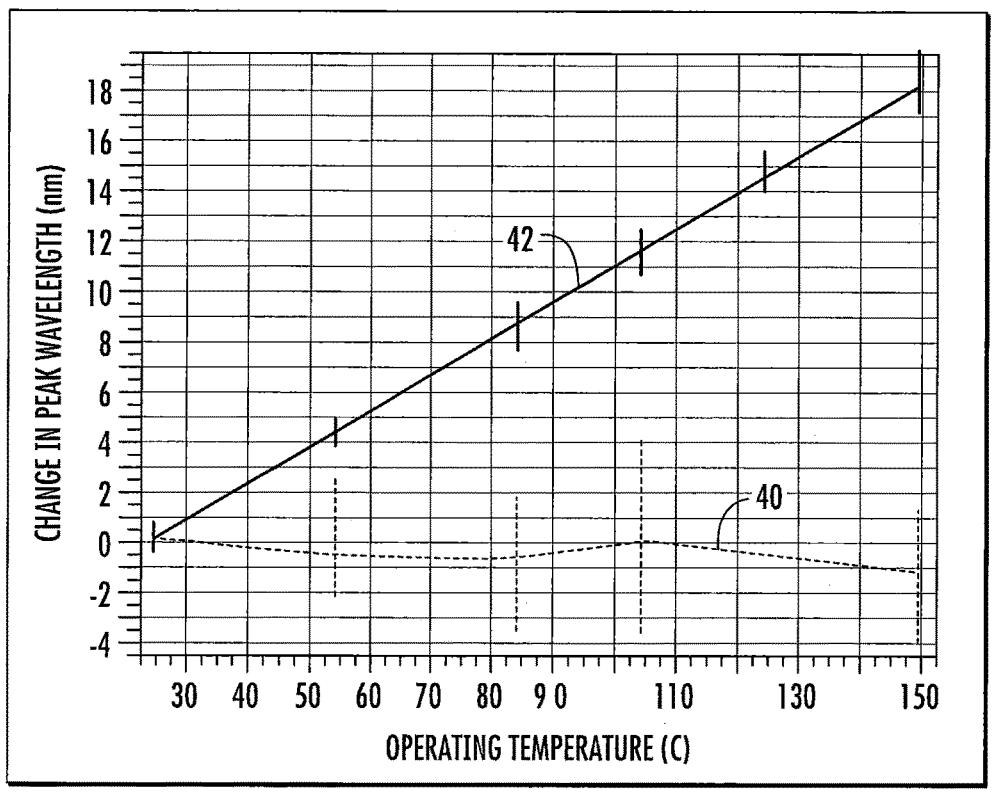
FIG. 5B is a graph illustrating the change in peak wavelength as a function of operating temperature for both a blue-shifted-red LED package and a red AlInGaP LED.

As noted above, the other potential problem with the use of red AlInGaP LEDs at higher operating temperatures is the change in the shape of the emission spectra which may occur. FIG. 5B is a graph illustrating the change in peak wavelength as a function of operating temperature for both a blue-shifted-red LED package (curve 40) and a red AlInGaP LED (curve 42). As shown in FIG. 5B, the peak wavelength of the blue-shifted-red LED package varies by no more than about 1 nm over an operating temperature range of 25° C. to 150° C. In contrast, the peak wavelength of the red AlInGaP LED varies by almost 18 nm over this operating temperature range, which is what results in the significant shift in the peak wavelength shown in FIG. 4, thereby often necessitating electronic control to compensate for this variation.

Thus, because of the need to provide temperature control circuitry as well as the reduced efficiency of the red AlInGaP LEDs at higher operating temperatures, true white solid state light fixtures may not be well-suited for some high temperature applications.

The second conventional approach used to implement high output solid state light bulbs that may be used as replacements for 40, 60, 75 and 100 Watt incandescent light bulbs is to use blue LED packages that have recipient luminophoric mediums that have multiple phosphors so that the combined emission of the blue LEDs and the phosphors is a high quality white light. Such LED packages are referred to herein as "phosphor converted white LED packages." Conventional phosphor converted white LED packages may include, for example, a recipient luminophoric medium that has a green phosphor and/or a yellow phosphor along with one or more red phosphors.

Figure 6:
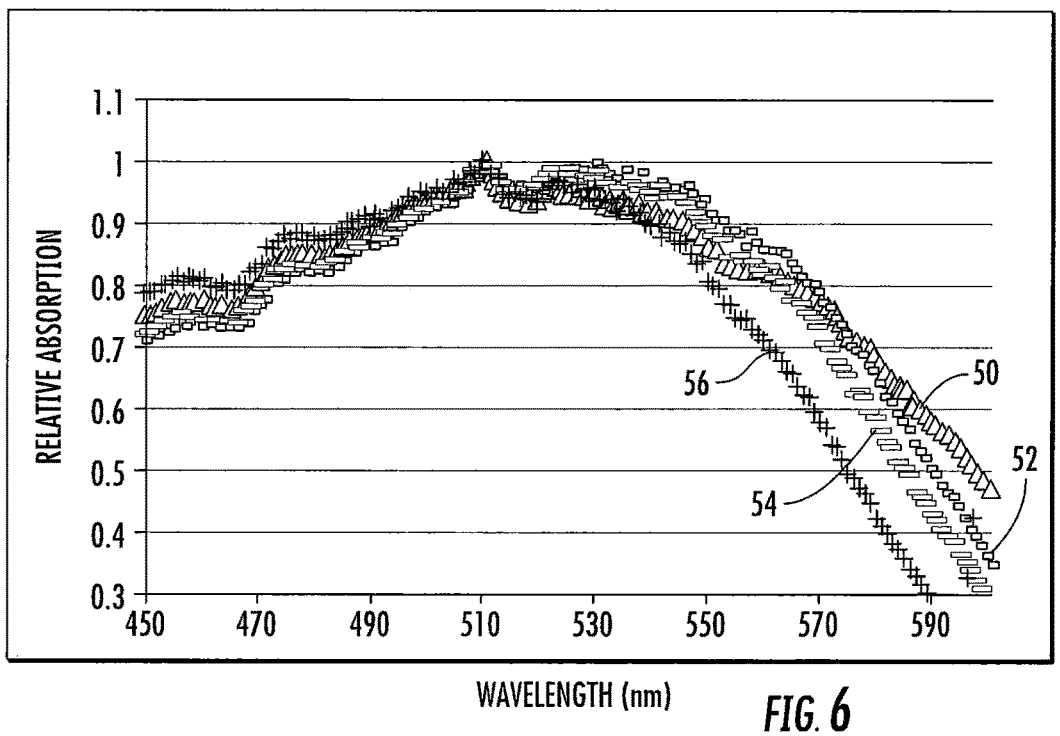
FIG. 6 is a graph illustrating the absorption spectrum for four representative red $(Ca_{1-x}Sr_x)SiAlN_3:Eu^{2+}$ phosphors.
Figure 7:
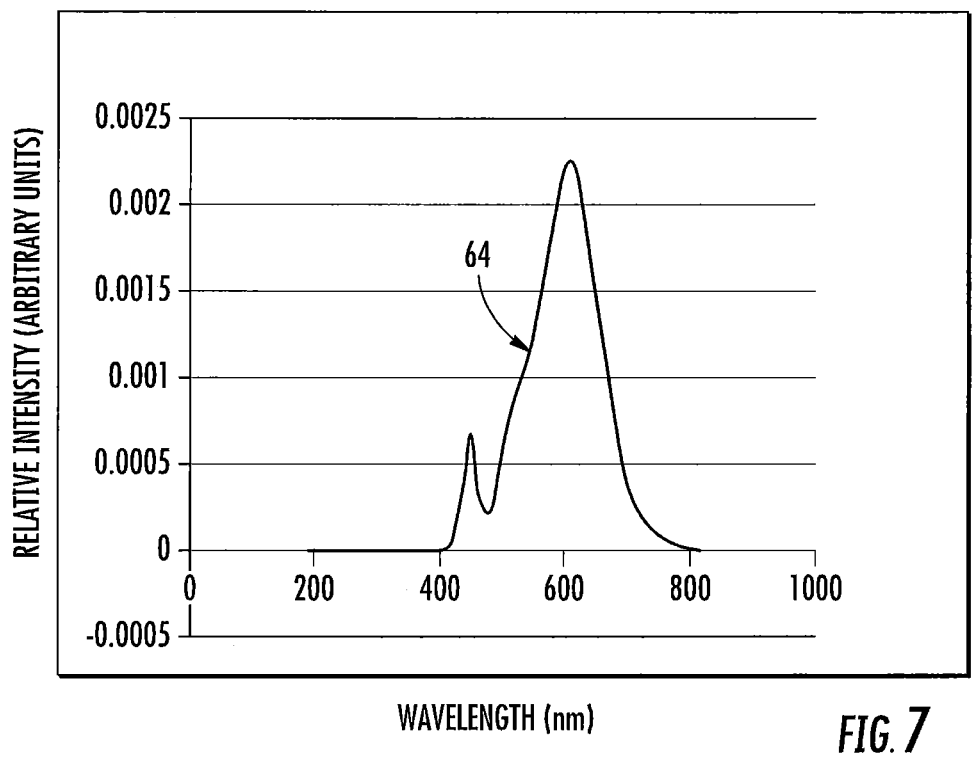
FIG. 7 is a graph illustrating the intensity of the radiation emitted as a function of wavelength of a conventional phosphor-converted white LED package that uses a $(Ca_{1-x}Sr_x)SiAlN_3:Eu^{2+}$ phosphor.

The present inventors have realized that one potential problem with this second approach is that the red phosphors that are often used in phosphor converted white LED packages not only convert the blue light emitted by the LED, but also tend to consume much of the emission of the yellow and/or green phosphor. This can be seen, for example, with reference to FIGS. 6 and 7. In particular, FIG. 6 is a graph illustrating the absorption spectra (curves 50, 52, 54, 56) for four different $(Ca_{1-x}Sr_x)SiAlN_3:Eu^{2+}$ phosphor compositions, which is a type of red phosphor that is commonly used in phosphor converted white LED packages. FIG. 7 is a graph illustrating the emission spectrum (i.e., the intensity of the radiation emitted as a function of wavelength) of a conventional phosphor-converted white LED package that uses a $(Ca_{1-x}Sr_x)SiAlN_3:Eu^{2+}$ phosphor in addition to yellow and green phosphors.

As shown in FIG. 6, the absorption spectrums for the four example $(Ca_{1-x}Sr_x)SiAlN_3:Eu^{2+}$ phosphors have a broad, somewhat uneven peak that extends from about 500 nm to about 560 nm. The emission spectra for typical yellow and green phosphors used in phosphor-converted white LED packages typically peak in the 530-565 nm range, which is right in the middle of the absorption spectra of the $(Ca_{1-x}Sr_x)SiAlN_3:Eu^{2+}$ phosphor. While the absorption spectra for the $(Ca_{1-x}Sr_x)SiAlN_3:Eu^{2+}$ phosphors are quite broad so that there still is good absorption in the 450-460 nm range corresponding to the peak emission wavelength of a representative blue LED, the absorption is reduced by about 20-30 percent at this wavelength range as compared to the amount of absorption across the broad peak. Moreover, the blue LEDs have a small FWHM widths (e.g., less than 30 nm), while the green and yellow phosphors typically have FWHM widths on the order of 70-120 nm. As a result, the $(Ca_{1-x}Sr_x)SiAlN_3:Eu^{2+}$ phosphors will tend to absorb relatively less of the light that was emitted by the blue LED and relatively more of the light that was emitted by the green and/or yellow phosphors.

Phosphors are not fully efficient light emission systems. Consequently, when a phosphor absorbs light emitted by an LED and emits light of a longer wavelength in response thereto, the optical output power of the light emitted by the combination of the LED and the phosphor will be less than the output power of the light emitted by the LED alone if no phosphor is used. In a conventional phosphor-converted white LED package, the red $(Ca_{1-x}Sr_x)SiAlN_3:Eu^{2+}$ phosphor is excited by both the blue light from the LED as well as by the emission from the yellow and green phosphors that are excited by the blue LED. A substantial (likely a majority) of the light that excites the red phosphor originates from the conversion of the LED blue light to yellow and green light by the yellow and green phosphors. Such double conversion results in increased inefficiencies since each conversion has intrinsic optical loss. One impact of this double conversion can be seen in the emission spectra of FIG. 7, where the left side of the main emission peak shifts inwardly at around 550 nm (indicated by 64 in FIG. 7). Such a reduction in spectral output at approximately the peak sensitivity of the human eye response curve has a negative impact on the luminous efficiency of the device.

Additionally, as can also be seen from FIG. 6, the wavelength range where the red $(Ca_{1-x}Sr_x)SiAlN_3:Eu^{2+}$ phosphor absorption is the highest is the 510-545 nm wavelength range, which is the green color range. While the red $(Ca_{1-x}Sr_x)SiAlN_3:Eu^{2+}$ phosphor also absorbs light fairly strongly in the yellow color range, the red $(Ca_{1-x}Sr_x)SiAlN_3:Eu^{2+}$ phosphor also has some degree of emission in the yellow color range which at least partially offsets this absorption. However, the red $(Ca_{1-x}Sr_x)SiAlN_3:Eu^{2+}$ phosphor has very low emission in the green color range, and hence emission of the phosphor converted white LED packages may be reduced in the green color range, which typically acts to reduce the CRI of the device. This effect can be compensated for by adding a green phosphor such as, for example, a $Lu_3Al_5O_{12}$:Ce phosphor (referred to herein as a "LuAG:Ce" phosphor), although the green phosphor tends to be less efficient than the YAG:Ce yellow phosphor, so a tradeoff will typically exist between luminous efficiency and CRI when compensating for the absorption by the red $(Ca_{1-x}Sr_x)SiAlN_3:Eu^{2+}$ phosphor of light emitted in the green color range.

Pursuant to embodiments of the present invention, solid state light bulbs are provided that include both blue-shifted-yellow and/or blue-shifted-green LED packages along with blue-shifted-red LED packages. By using two (or more) different types of phosphor-converted blue LED packages instead of phosphor-converted LED packages that include phosphors of both yellow/green and red colors mixed together, the above-described double-conversion inefficiency problem may be reduced or eliminated. Consequently, the solid state light fixtures according to embodiments of the present invention may provide improved performance as compared to both conventional, state of the art true white and phosphor-converted white LED package based light fixtures in terms of luminous flux, CRI, CRI R9 and Qg performance, and may also be suitable for use at high operating temperatures. Such a solution that improves the performance across the full range of factors that are typically used to judge the performance of an LED is quite remarkable. Example embodiments of such light bulbs will now be described in greater detail with reference to FIGS. 8-14.

Figure 8:
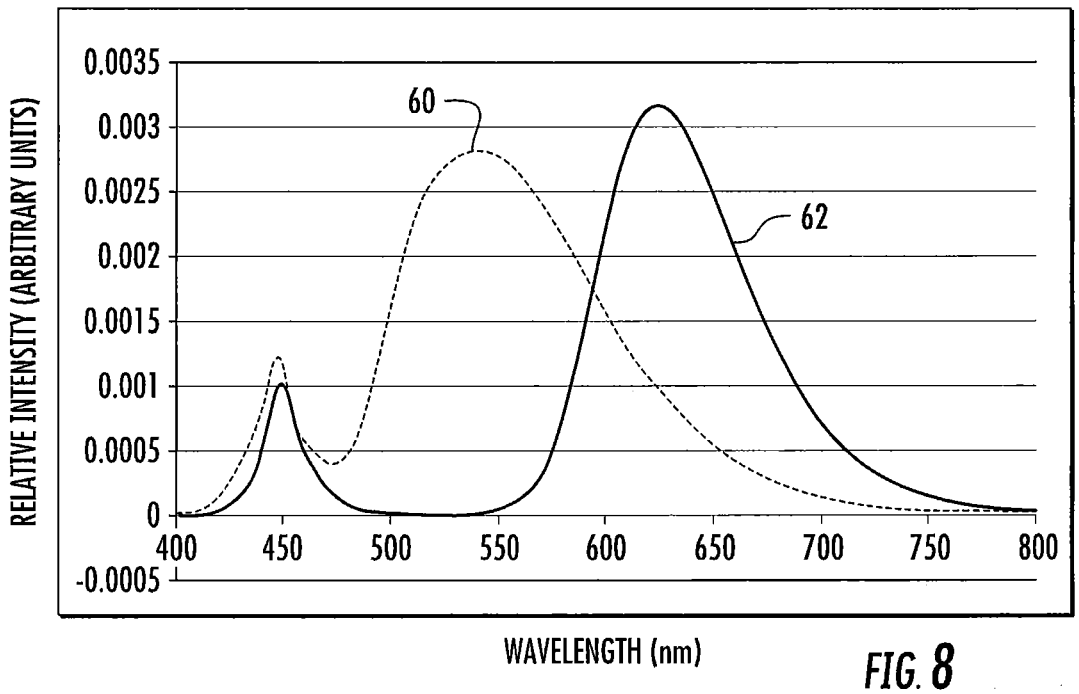
FIG. 8 is a graph illustrating the intensities of the radiation emitted as a function of wavelength for the blue-shifted-yellow LED packages and the blue-shifted-red LED packages that are included in a solid state light fixture according to embodiments of the present invention.

FIG. 8 is a graph illustrating the emission spectra of the blue-shifted-green (curve 60) and blue-shifted-red (curve 62) LED packages that are included in a solid state light bulb according to example embodiments of the present invention. As shown in FIG. 8, each emission spectrum has a small peak at about 450 nm which reflects the pass-through emission of the respective blue LEDs. As shown, the blue LEDs used to form the blue-shifted-green LED packages may have somewhat shorter peak wavelengths than the blue LEDs used to form the blue-shifted-red LED packages. Various reasons why such an approach may be advantageous in certain embodiments will be described in detail below. The blue-shifted-green LED packages have a broad emission peak centered at about 545 nm, while the blue-shifted-red LED packages have a somewhat narrower (although still quite broad) emission peak centered at about 625 nm. The locations and shapes of these peaks may be adjusted by selection of the phosphors used in the blue-shifted-green and blue-shifted-red LED packages.

Figure 9:
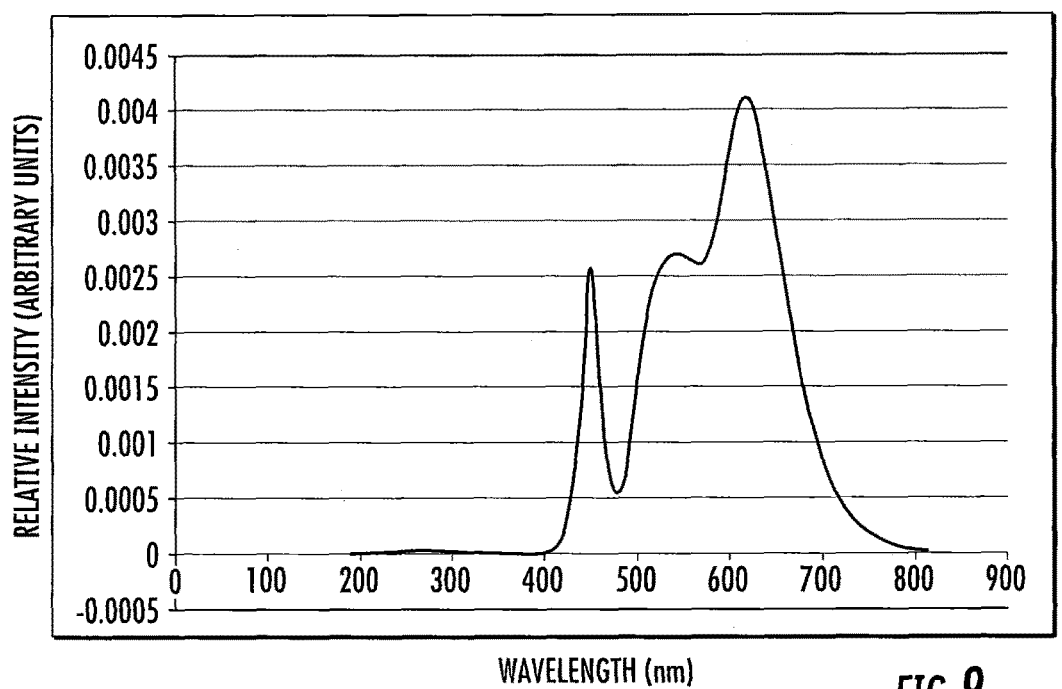
FIG. 9 is a graph illustrating the intensity of the radiation emitted as a function of wavelength for a solid state light fixture according to embodiments of the present invention.

FIG. 9 is a graph illustrating the intensity of the radiation emitted as a function of wavelength of a solid state light fixture according to embodiments of the present invention that includes the blue-shifted-green and blue-shifted-red LED packages that were used to generate the graph of FIG. 8. As shown in FIG. 9, the combined emission spectrum has a narrow emission peak at about 450 nm that is attributable to the light from the blue LEDs that passes through the recipient luminophoric mediums without conversion, and a broad emission peak that is attributable to the two phosphors that have peak wavelengths of about 620 nm. This broad emission peak includes a distinct shoulder at about 545 nm that has its own sub-peak.

Figure 10:
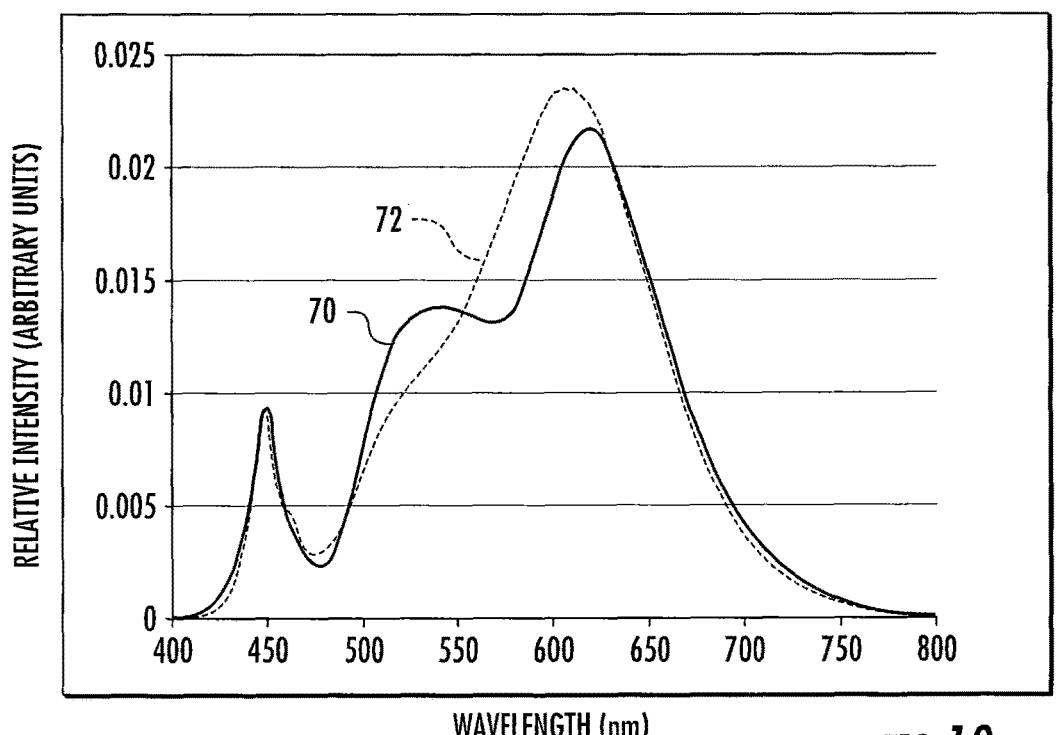
FIG. 10 is a graph comparing the emission spectrum of a solid state light fixture that has a conventional phosphor-converted white LED that uses a $(Ca_{1-x}Sr_x)SiAlN_3:Eu^{2+}$ phosphor to the emission spectrum of a solid state light fixture according to embodiments of the present invention.

FIG. 10 is a graph comparing the emission spectrum of a solid state light fixture that has a conventional phosphor-converted white LED package that uses a $(Ca_{1-x}Sr_x)SiAlN_3$:$Eu^{2+}$ phosphor (curve 72 in FIG. 10) to the emission spectrum of a solid state light fixture according to embodiments of the present invention (curve 70 in FIG. 10). As shown in FIG. 10, the two emission spectra are quite similar at wavelengths below about 500 nm and at wavelengths above about 650 nm, but are quite different in the range of about 500-650 nm. In particular, the solid state light fixture according to embodiments of the present invention (curve 72) has significantly increased emission in the 500-550 nm wavelength range, which results because the red phosphor is no longer absorbing significant amounts of the light emitted by the yellow and/or green phosphors. Because the improved emission is provided at wavelengths corresponding to a region of the eye response curve of FIG. 3 where the human eye is highly sensitive to light, the overall result is that the solid state light fixture according to embodiments of the present invention may exhibit approximately the same or even increased luminous efficacy as compared to a state-of-the-art conventional solid state light fixture. Moreover, the shape of the emission spectrum may also advantageously provide improved color rendering properties in terms of all three of CRI performance, CRI R9 performance and Qg performance.

TABLE 2 compares the luminous flux and color quality performance of four example devices according to embodiments of the present invention to a conventional state-of-the-art device. Each device used to generate the performance data in TABLE 2 consisted of a printed circuit board with two LED packages mounted thereon. The data in TABLE 2 was generated by comparing the performance of two state-of-the-art LED packages in which a green phosphor, a yellow phosphor and a red phosphor (herein a "BSYGR LED") were all combined in a single recipient luminophoric medium to devices according to embodiments of the present invention which each include one blue-shifted-yellow/green LED package (also referred to herein as a "BSY/G LED package") which had both green and yellow phosphors and one blue-shifted-red LED (also referred to herein as a "BSR LED package"). The measurements where performed at room temperature and the same constant (direct current) drive current for all five devices.

TABLE 2

| Device Configuration | CCT (K) | Relative Luminous Flux | CRI | R9 | Qg | Yellow-Green Phosphor | Red Phosphor |
|---|---|---|---|---|---|---|---|
| 2 BSYGR | 2731 | 100% | 83 | 8 | 96 | | |
| 1 BSY/G; 1 BSR | 2783 | 100% | 85 | 19 | 100 | 50% YAG; 50% LuAg | Red1 |
| 1 BSY/G; 1 BSR | 2803 | 97% | 87 | 33 | 101 | 50% YAG; 50% LuAg | Red3 |
| 1 BSY/G; 1 BSR | 2775 | 98% | 87 | 33 | 102 | 50% YAG; 50% LuAg | Red1 + Red2 |
| 1 BSY/G; 1 BSR | 2954 | 99% | 89 | 24 | 99 | 20% YAG; 80% LuAg | Red1 |

In TABLE 2, "CCT" stands for correlated color temperature, and the "Yellow-Green Phosphor" column lists the relative amounts of yellow phosphor (which is a YAG:Ce phosphor) and green phosphor (which is a LuAG:Ce phosphor) in the recipient luminophoric mediums of the BSY/G LED packages used in devices according to embodiments of the present invention. Red1 through Red3 refer to three specific red $(Ca_{1-x}Sr_x)SiAlN_3$:$Eu^{2+}$ phosphors that were used to implement the BSR LED packages. Red1 has an emission peak at 618 nm, Red2 has an emission peak at 629 nm, and Red3 has an emission peak at 624 nm.

As can be seen from TABLE 2, the four devices according to embodiments of the present invention exhibit improved color rendering as compared to the conventional state-of-the-art device for all three color rendering metrics. The CRI R9 performance of the devices according to embodiments of the present invention are particularly improved, with all four devices exhibiting improvements of over 100% in CRI R9 performance, and some devices providing CRI R9 values that are 3-4 times higher than the conventional device. While the improvements in CRI and Qg are less dramatic, they are still on the order of 5%, which represents a significant performance improvement. Moreover, the luminous flux performance of the four devices according to embodiments of the present invention is comparable to the conventional state-of-the-art device. Moreover, one of the devices (the 50% YAG/50% LuAG with Red1 device) provides matched or improved performance in all four performance characteristics evaluated as compared to the conventional state-of-the-art device.

In the devices listed in TABLE 2, each BSY/G LED package was implemented by combining a YAG:Ce phosphor and a LuAG:Ce phosphor in the same recipient luminophoric medium that is excited by a blue LED. However, it will be appreciated that in other embodiments, separate BSY and BSG LED packages may be used to achieve the same effect (i.e., a first blue LED is provided that has a recipient luminophoric medium having only YAG:Ce phosphors included therein and a second blue LED is provided that has a recipient luminophoric medium having only LuAG:Ce phosphors included therein). Likewise, each BSR LED package used in the embodiment that used two red phosphors had both red phosphors combined in the recipient luminophoric medium. However, it will be appreciated that in other embodiments, two separate BSR LED packages could be used instead, the first of which has a recipient luminophoric medium having only the first red phosphor included therein and the second of which has a recipient luminophoric medium having only the second red phosphor included therein. It will also be appreciated that more than two red phosphors may be used in other embodiments, and that different green, yellow and/or red phosphors may be used in other embodiments.

While each of the devices listed in TABLE 2 above included both yellow and green phosphors, it will be appreciated that in other embodiments the BSY/G LED packages may only include a yellow phosphor or may only include a green phosphor.

Figure 11D:
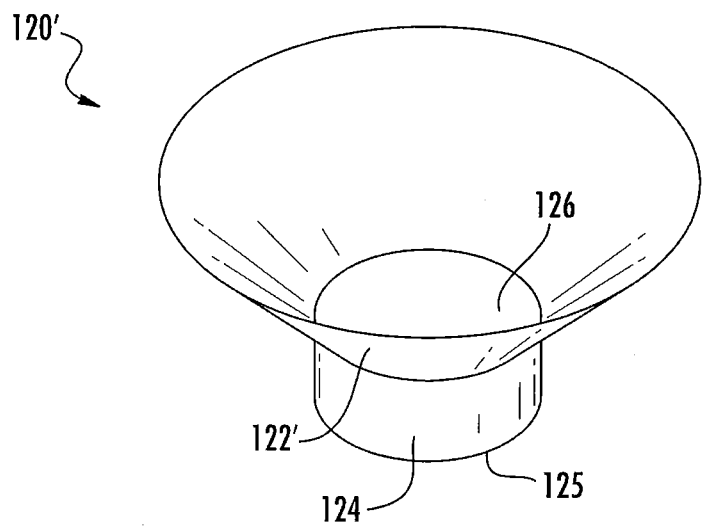
FIG. 11D is a perspective view of an alternative reflector that may be used in the solid state light bulb of FIGS. 11A-11C in other embodiments of the present invention.

FIG. 11A is a schematic perspective view of a light bulb 100 according to embodiments of the present invention with the dome thereof omitted. FIG. 11B is a perspective view of a printed circuit board that is included in the light bulb of FIG. 11A that has seven blue-shifted-yellow/green LED packages and seven blue-shifted-red LED packages mounted thereon. FIG. 11C is a cross-sectional view of the light bulb 100 with a reflector omitted to better show the printed circuit board. FIG. 11D is a perspective view of an alternative reflector that may be used in the solid state light bulb of FIGS. 11A-11C in other embodiments of the present invention.

Referring to FIGS. 11A-11C, the solid state light bulb 100 includes a body 110, a reflector 120, a dome 130 and a submount 140 such as a printed circuit board. As shown in FIGS. 11A and 11C, the body 110 may be shaped and sized like the body of a conventional incandescent light bulb such as an A19 or A21 light bulb. The body 110 may include a pair of electrical contacts 112, 114 that mate with electrical contact structures of a conventional incandescent light bulb socket. The body 110 may include power conversion circuitry (not shown) that converts the alternating current (AC) power received from a light socket to a suitable direct current (DC) voltage that may be used to power the LEDs included in solid state light fixture 100. The body 110 may also include one or more heat sinks 116 that help vent heat generated by the LEDs during operation to the exterior of the light bulb 100.

The reflector 120 may be mounted to extend upwardly from atop the body 110. The reflector 120 may be formed of, for example, a highly reflective metal or plastic. In the embodiment of FIG. 11A, the reflector 120 includes an annular, truncated frusto-conical shaped reflection surface 122 that is positioned above the printed circuit board 140. The reflection surface 122 has a central opening 124 that allows light from LEDs that are positioned in the center of the submount 140 to pass through the reflector 120 and emit from the top of the light fixture 100. The reflector 120 may also have one or more mounting arms that extend between the reflection surface 122 and the body 110 to hold the reflection surface 122 in place above the submount 140.

As shown in FIG. 11C, the dome 130 may be mounted atop the body 110 with the reflector 120 and submount 140 positioned within the interior of the dome 130. The dome 130 may comprise, for example, a plastic or glass dome, and may or may not have the shape of a dome on a conventional A19 incandescent light bulb. The dome 130 may comprise a diffuse optical enclosure. The dome 130 may be designed to mix light emitted by the LEDs included in solid state light bulb 100 so that light exiting the dome 130 will comprise fully mixed white light.

As shown in FIG. 11B, fourteen phosphor-converted LED packages 142 are mounted on the submount 140. In the depicted embodiment, the submount 140 is implemented using a printed circuit board 140. The printed circuit board 140 may be metal core (MCPCB), a flexible printed circuit board, or a fiberglass printed circuit board (e.g., FR-4). It will be appreciated that in other embodiments a different submount may be used. For example, a submount formed of aluminum oxide, aluminum nitride, organic insulators, sapphire and/or silicon may be used in other embodiments. In the solid state light fixture 100 of FIGS. 11A-11C, seven of the LED packages 142 comprise blue-shifted-yellow/green LED packages 142A, and the remaining seven LED packages 142 comprise blue-shifted-red LED packages 142B. The LED packages 142 may each include a single LED (i.e., a single LED "chip" or "die") or multiple LEDs. These LEDs are mounted in the LED package 142, and the LED package 142 includes electrical connections to the printed circuit board 140 to provide electrical power to each LED. In the depicted embodiment, the LED packages 142 are divided into two strings, of seven LED packages 142 each, where each string is supplied a 42 volt DC power signal (6 volts per LED package 142). In some embodiments, the blue-shifted-yellow/green LED packages 142A may all be part of the first string and the blue-shifted-red LED packages 142B may all be part of the second string. This approach may allow the solid state light bulb 100 to be configured to have increased red light contribution when the bulb is dimmed, which can be achieved by driving the blue-shifted-red LED packages 142B more heavily than the blue-shifted-yellow/green LED packages 142A when the light bulb 100 is dimmed. Such a dimming feature may be preferred as it mimics the dimming characteristics of a conventional incandescent light bulb which comparatively emits more red light when dimmed, as will be discussed in more detail below.

The LEDs used to form the LED packages 142 can have many different semiconductor layers arranged in different ways. LEDs and their fabrication and operation are generally known in the art and hence are only briefly discussed herein. The layers of the LEDs can be fabricated using known processes such as, for example, metal organic chemical vapor deposition. Typically, LEDs are grown on a growth substrate such as, for example, a sapphire, silicon carbide, aluminum nitride (AlN), or gallium nitride (GaN) substrate to provide a grown semiconductor wafer, and this wafer is then singulated into individual LEDs. The growth substrate can remain as part of the final singulated LED or, alternatively, the growth substrate can be fully or partially removed. In embodiments where the growth substrate remains, it can be shaped and/or textured to enhance light extraction. The LEDs may be mounted in flip chip configuration in some embodiments.

In the depicted embodiment, each LED package 142 comprises an LED that is mounted in a lead frame having a cup like cavity, and the recipient luminophoric medium is deposited in this cup-like cavity. The recipient luminophoric medium may comprise an encapsulant material such as, for example, silicone that has phosphor particles suspended therein. It will be appreciated that in other embodiments the cavity may be omitted, and/or the recipient luminophoric medium may instead be conformally coated or sprayed on an upper surface and side surfaces of each LED, or may be placed in other locations.

In some embodiments, the LED packages 142 may be within an interior volume of the diffuse optical enclosure 130, as can be seen, for example, in FIG. 11C. This is in contrast to many other solid state light fixtures where the LED packages are positioned outside the interior volume of an optical enclosure such as, for example, in a reflection cavity that has one or more reflective walls that are designed to enhance mixing of the light from LED packages that emit different colored light before that light passes into the interior volume of an optical enclosure. Because the LED packages 142 according to embodiments of the present invention may maintain high efficiency at elevated operating temperatures such as temperatures above 80° C. or even at temperatures above 90° C. or 100° C., the LED packages 142 may be located in close proximity to each other which increases color mixing, which allows the LED packages 142 to be mounted within the interior volume of the dome 130.

In some embodiments, a controller may be included within the body 110. The controller 110 may be configured to increase the relative amount of drive current supplied to the blue-shifted-red emitters (i.e., the blue-shifted-red LED packages) as compared to the blue-shifted-yellow/green emitters (i.e., the blue-shifted-yellow/green LED packages) when the solid state light fixture is dimmed. Conventional incandescent light bulbs tend to emit light that has increased yellow and red components when dimmed. Since the solid state light bulb 100 has separate blue-shifted-yellow/green emitters and blue-shifted-red emitters, the relative drive currents supplied to the blue-shifted-red emitters may be increased as compared to the drive current supplied to the blue-shifted-yellow/green emitters when the solid state light bulb is dimmed (i.e., when an external control circuit is adjusted to supply less current to the solid state light bulb). This can be accomplished by, for example, increasing the relative amount of current supplied to each blue-shifted-red emitter as compared to the amount of current supplied to the blue-shifted-yellow/green emitters when the light bulb is dimmed, or by not supplying current to some of the blue-shifted-yellow/green emitters when the light bulb is dimmed.

In some cases, the correlated color temperature of the light emitted from the diffuse optical enclosure may generally decrease with an increasing level of dimming. Thus, as the luminous flux of the light bulb decreases, the correlated color temperature may also generally decrease.

It will also be appreciated that the blue LEDs included in the LED packages 142 may or may not have the same peak wavelength. For example, in some embodiments, some of the blue LEDs may be shorter wavelength blue LEDs (i.e., peak wavelengths between 440 and 455 nm), while other of the blue LEDs may be longer wavelength blue LEDs (i.e., peak wavelengths between 456 and 480 nm or between 460 and 480 nm). Such an approach may, for example, approximately double the effective width of the pass-through blue light emission, which may help improve the CRI performance of the light bulb 100. In fact, such an approach may be particularly helpful as some of the lowest emissions for the light bulbs according to embodiments of the present invention may be in the cyan color range, and the longer wavelength blue LEDs may help fill in this gap in the emission spectrum. The use of longer wavelength blue LEDs may, however, result in some reduction in the luminous flux of the solid state light bulb 100 as the longer wavelength blue LEDs tend to be, on average, dimmer than corresponding short wavelength blue LEDs.

The relatively short wavelength blue LEDs may also help achieve higher Qg values. However, at very low blue wavelengths, reliability may decrease as will the efficiency of the emission from the LED in exciting the yellow and green phosphors. Accordingly, in some embodiments, the short wavelength blue LEDs may have peak wavelengths in the range of about 445 nm to about 455 nm.

In embodiments in which both short and long peak wavelength blue LEDs are used, it may be advantageous to use the longer wavelength blue LEDs in the blue-shifted-red LED packages 142. Referring again to FIG. 6, it can be seen that one potential disadvantage of using separate blue-shifted-yellow/green and blue-shifted-red LED packages instead of phosphor converted LED packages which include both yellow/green and red phosphors in the same recipient luminophoric medium is that the amount of red phosphor that is required is typically increased due to the lower absorption by the red phosphor in the blue wavelength range as compared to the green and yellow wavelength ranges. Typically the red phosphors are more expensive than the green and yellow phosphors, which may increase the cost of the light bulb 100. Thus, in selecting the red phosphors, one consideration may be the absorption spectrum of the phosphor, as all else being equal, better absorption in the blue color range may be preferred. Additionally, as can be seen in FIG. 6, the absorption tends to be somewhat better at the longer blue wavelengths, and hence the use of longer blue wavelength LEDs in the blue-shifted-red LED packages 142 may help reduce the overall cost of the light bulb 100.

It should also be noted that the overall efficiency of a red phosphor tends to be a function of the Stoke's shift of the phosphor, which refers to the difference between the peak wavelength of the light absorbed by the phosphor and the peak wavelength of the light emitted by the phosphor. Generally speaking, the higher the Stoke's shift, the lower the conversion efficiency of the phosphor (the percentage of the incident radiometric optical power that is yielded as down-converted radiometric optical power). The use of longer wavelength blue LEDs in the blue-shifted-red LED packages 142 acts to reduce the Stoke's shift, and hence can beneficially improve the conversion efficiency of the red phosphors.

In the solid state light bulb 100 of FIGS. 11A-11C, each blue-shifted-yellow/green LED package 142 was implemented using a single blue LED and a recipient luminophoric medium having a 50%/50% mix of a YAG:Ce phosphor and a LuAG:Ce phosphor. Four of the blue-shifted-red LED packages 142 were implemented using a single blue LED and the Red1 phosphor discussed above with reference to TABLE 2, while the remaining three blue-shifted-red LED packages 142 were implemented using a single blue LED and the Red2 phosphor discussed above with reference to TABLE 2. The performance of the solid state light bulb 100 was then measured and compared to the performance of a conventional state-of-the-art solid state light bulb that included fourteen BSGYR LED packages. The measured performance of these devices are shown in TABLE 3 below. The bulbs were allowed to come to thermal equilibrium in room temperature ambient. The resulting LED operating temperature was ~100° C.

TABLE 3

| Device Configuration | CCT (K) | Luminous Flux | L/W | ccx | ccy | CRI | R9 |
|---|---|---|---|---|---|---|---|
| 14 BSYGR | 2813 | 811.6 | 90.6 | 0.4494 | 0.4059 | 81.2 | 3.8 |
| 7 BSY/G; 4 BSR1; 3 BSR2 | 2812 | 842.3 | 97.4 | 0.4553 | 0.4168 | 84.3 | 20.1 |

As shown in TABLE 3, a solid state light bulb according to embodiments of the present invention provides a significant performance advantage as compared to the conventional state-of-the-art light bulb. In particular, significant improvement is provided in terms of both the luminous flux and the lumens-per-Watt performance of the light bulb, while the device at the same time achieves an improvement in CRI along with a significant improvement in CRI R9 performance. While the Qg performance of the devices was not measured, it is anticipated that a significant improvement in Qg performance will also be achieved due to the higher contribution of saturated red color as reflected by the significantly enhanced CRI R9 value.

TABLE 4 compares the luminous flux and color quality performance of a submount printed circuit board, as shown in FIG. 11B, according to embodiments of the present invention to a submount with conventional BSYGR LED packages as a function of operating temperature.

TABLE 4

| Device Configuration | Operating Temp (° C.) | CCT (K) | LPW | Luminous Flux | CRI | R9 |
|---|---|---|---|---|---|---|
| Separate BSY/G and BSR | 25 | 2793 | 136.9 | 1123 | 86.7 | 35.7 |
| Conventional BSYGR | 25 | 2764 | 132.8 | 1092 | 82.6 | 7.7 |
| Separate BSY/G and BSR | 40 | 2794 | 135.2 | 1097 | 86.3 | 34.2 |
| Conventional BSYGR | 40 | 2768 | 131.0 | 1067 | 82.3 | 6.6 |
| Separate BSY/G and BSR | 60 | 2798 | 132.1 | 1058 | 85.8 | 32.3 |
| Conventional BSYGR | 60 | 2777 | 127.8 | 1029 | 82.8 | 8.6 |
| Separate BSY/G and BSR LEDs | 85 | 2810 | 127.7 | 1010 | 85.2 | 29.7 |
| Conventional BSYGR | 85 | 2794 | 122.9 | 976 | 82.1 | 6.0 |
| Separate BSY/G and BSR | 100 | 2808 | 122.2 | 960 | 84.8 | 28.5 |
| Conventional BSYGR | 100 | 2809 | 119.0 | 938 | 81.5 | 4.2 |

As shown in TABLE 4, the submount according to embodiments of the present invention provides improved performance at all operating temperatures examined. At the target operating temperature of 100° C. (and all other operating temperatures investigated), superior luminous flux and luminous efficiency are provided, as well as improved CRI and CRI R9 performance. In each case, the LED packages were driven by a 100 mA current that is a typical driving current for a 60 W incandescent light bulb replacement.

FIG. 11D is a perspective view of an alternative reflector 120' that may be used in place of the reflector 120 in the solid state light bulb 100 of FIGS. 11A-11C in other embodiments of the present invention. As shown in FIG. 11D, the alternative reflector 120' includes a base 124 and a primary reflection surface 122'. A lower edge 125 of the base 124 may be mounted on the printed circuit board (or other submount) 140 or may be mounted on the body 110 through, for example, openings in the printed circuit board 140. The reflection surface 122' may be positioned above the printed circuit board 140 within the dome 130. At least one blue-shifted-yellow/green emitter 142A and at least one blue-shifted-red emitter 142B may be within an internal cavity 126 defined by the base 124. Others of the blue-shifted-yellow/green emitters 142A and of the blue-shifted-red emitters 142B may be positioned on the printed circuit board 140 to surround an external periphery of the base 124.

Figure 11E:
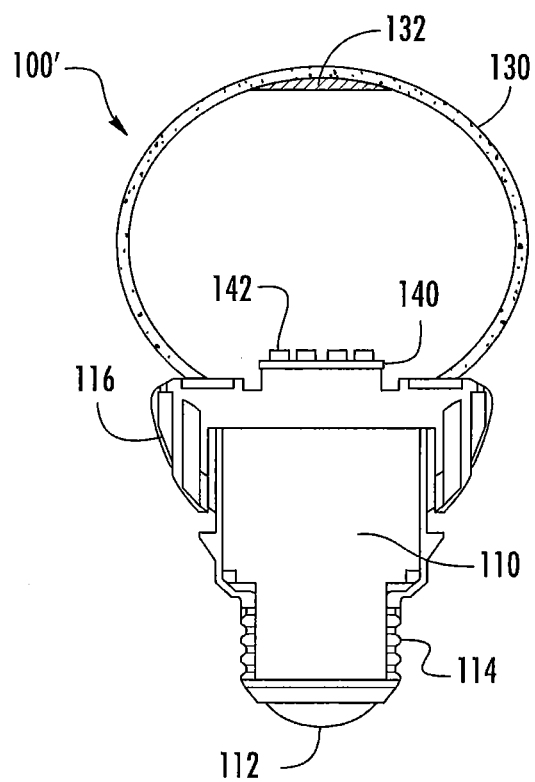
FIG. 11E is a cross-sectional view of a solid state light bulb according to further embodiments of the present invention.

FIG. 11E is a cross-sectional view of a solid state light bulb 100' according to further embodiments of the present invention. The solid state light bulb 100' is very similar to the solid state light bulb 100 of FIGS. 11A-11C, except that the reflector 120 is omitted in solid state light bulb 100' and is replaced instead with a partially reflective/transmissive coating (or other partially reflective material and/or optical element) 132 that is coated on the dome 130 that reflects a portion of the light emitted by the LED packages 142 downwardly and outwardly. It will be appreciated that the partially reflective coating 132 may be on the inside of the dome 130, on the outside of the dome 130 and/or integrated into the dome material. Instead of, or in addition to, the partially reflective coating 132 the shape of the dome 130 could be modified to help distribute the light in a desired manner such as, for example, to meet Energy Star requirements. As one example, a dimple could be created at the top of the dome 130 that would redirect the light from the LED packages 142 in a desired direction. In such embodiments, the dome 130 may or may not include the partially reflective coating 132. In still other embodiments, the coating 132 could be fully reflective. In such embodiments, the coating may have a smaller surface area and/or may have openings to allow some light to pass through. In yet other embodiments, the coating 132 may be diffuse and/or may have different or variable reflective or optical characteristics. The coating/material 132 may provide a desired light distribution with uniform color characteristics. The techniques according to embodiments of the present invention may be particularly well-suited for solid state light bulbs such as A series light bulbs (e.g., A19 and A21 bulbs) and for candelabra light bulbs. These light bulbs have small form factors which tend to require that the LED packages be located in close proximity to each other. The closer the LED package spacing, the more heat that will build up in the vicinity of the LEDs included therein. As discussed above, the luminous flux and efficiency of LEDs typically decreases with increasing operating temperature, and hence thermal performance may be a significant issue with respect to solid state light bulbs, particularly if cost and/or form factor concerns allow the use of minimal heat sink structures, and may also limit or preclude the use of temperature control circuitry.

As noted above, according to embodiments of the present invention, the use of blue-shifted-red LED packages may alleviate some of the thermal issues as blue-shifted red LED packages may exhibit higher luminous flux performance and more stable color rendering performance as compared to the red AlInGaP LEDs that are conventionally used in many solid state light fixtures. Moreover, with the use of both blue-shifted yellow/green and blue-shifted-red LED packages, the same type of LED may be used in each (e.g., a blue gallium nitride based LED). Consequently, the LEDs used to form both the blue-shifted-yellow/green emitters and the blue-shifted-red emitters may degrade at approximately the same rate over time, and hence the color of the combined light emitted by the solid state light fixtures according to some embodiments of the present invention may remain relatively consistent as the solid state light fixture ages. This may allow for the provision, in some embodiments, of solid state light fixtures that do not include control circuitry that adjusts the relative amount of drive current supplied to the blue-shifted-yellow/green emitters as compared to the blue-shifted-red emitters in order to compensate for different rates in degradation of the LEDs included in such emitters. Such control circuitry is typically provided in solid state light fixtures that use AlInGaP LEDs to implement the red emitters.

A problem that arises, however, when using separate blue-shifted-yellow/green and blue-shifted-red LED packages in a small form factor light fixture such as an A series light bulb is that there is reduced space for mixing the colors of the separate yellow/green and red emitters. If the color mixing is inadequate, the combined light output exiting the light bulb may appear as white light with visible fringe regions of red, yellow, green or other color emission due to diffraction. Such light is generally not considered acceptable by many consumers, as consumers tend to prefer light that mimics the more uniform light output by conventional incandescent light bulbs. Such color mixing concerns generally are not present when phosphor converted white LED packages are used as such LEDs include the red and green and/or yellow phosphors in the same recipient luminophoric medium allowing for mixing of the light at the LED. The use of separate blue-shifted-yellow/green emitters and blue-shifted-red emitters is counter-intuitive in small form-factor solid state light fixtures such as A-series light bulbs and candelabra light bulbs, as the operating temperature issues tends to require spacing the LED packages further apart and this increased spacing and the small size of the diffuse optical enclosure tends to not allow for sufficient color mixing, which is why each LED package includes all of the phosphors so that each LED package emits white light.

Pursuant to embodiments of the present invention, solid state light fixtures such as solid state light bulbs are provided that use various techniques to provide improved color mixing so that the non-white light emitted by the separate blue-shifted-yellow/green and blue-shifted-red LED packages will combine to provide substantially uniform white light when exiting the light bulb. As discussed above with respect to the embodiment of FIGS. 11A-11C, these techniques may include the use of reflective structures that enhance color mixing and the separate blue-shifted-yellow/green and blue-shifted-red LED packages are arranged within the light bulb to enhance color mixing. Additionally, pursuant to further embodiments of the present invention, multi-zone emitters in which light having two distinct colors is output from an individual LED package may be used so that enhanced color mixing will occur.

Figure 12A:
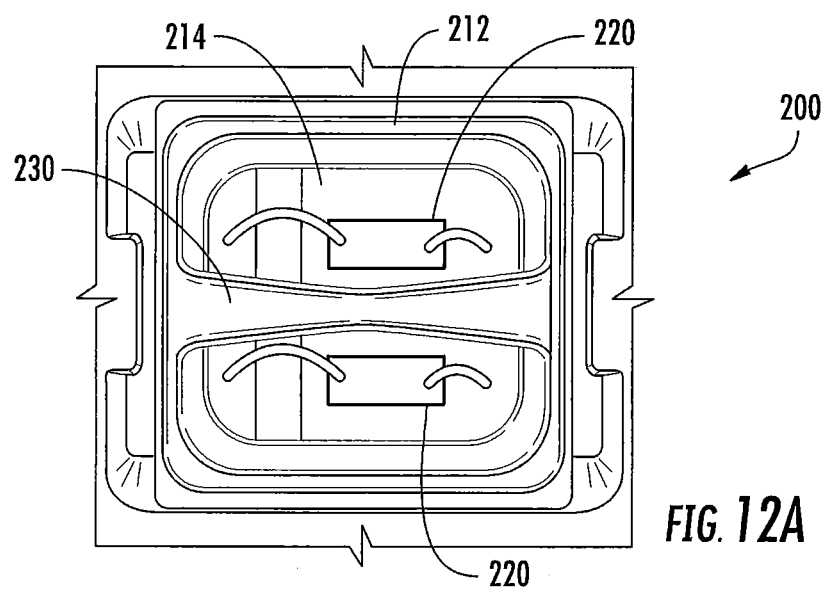
FIG. 12A is a plan view of a surface-mounted LED package that includes two LEDs mounted in separate sub-cavities.
Figure 12B:
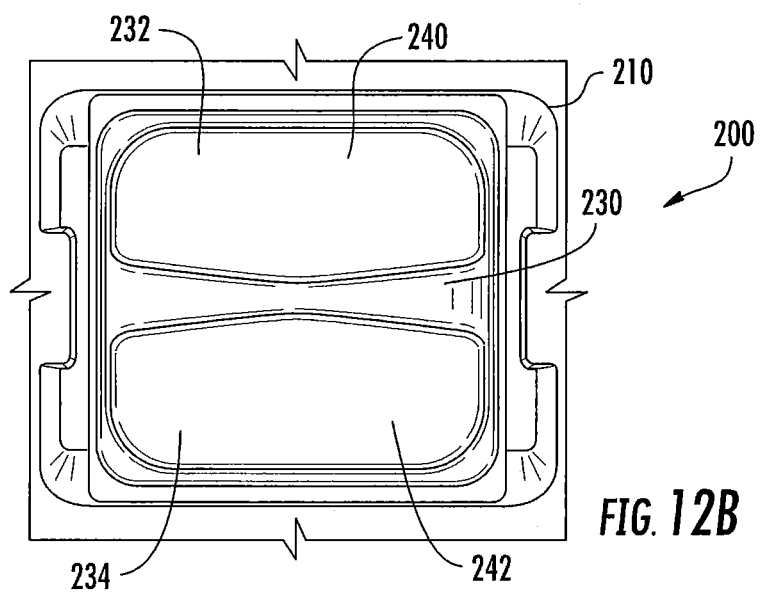
FIG. 12B is a plan view of the surface-mounted LED package of FIG. 12A with two different types of recipient luminophoric mediums deposited into the respective sub-cavities.

For example, in some embodiments of the present invention, LED packages are provided that include multiple cavities or regions which may receive respective recipient luminophoric mediums. These LED packages may be used, for example, in place of the LED packages 142A, 142B that are shown in FIG. 11B. One such example LED package 200 is illustrated in FIGS. 12A-12B. As shown in FIG. 12A, the LED package 200 is provided that includes two LEDs 220 that are mounted on a submount 210. While two LEDs 220 are included in the example package of FIGS. 12A-12B, it will be appreciated that more or fewer LEDs 220 may be provided. The submount 210 includes a cavity 214 that is defined by a plurality of sidewalls 212. The LEDs 220 may be mounted in the cavity 214.

A divider 230 is provided that divides the cavity 214 into first and second sub-cavities 232, 234. A first recipient luminophoric medium 240 may be deposited in the first sub-cavity 232 and a second recipient luminophoric medium 242 may be deposited in the second sub-cavity 234. The second recipient luminophoric medium 242 may be different from the first recipient luminophoric medium 240. In some embodiments, the first recipient luminophoric medium 240 may include a $Y_3Al_5O_{12}$:Ce phosphor and/or a $Lu_3Al_5O_{12}$:Ce phosphor, and the second recipient luminophoric medium 242 may include at least one $(Ca_{1-x}Sr_x)SiAlN_3$:Eu$^{2+}$ phosphor or other phosphor that emits light having a peak wavelength in the red color range.

The divider 230 may be advantageous as it allows separating the first and second recipient luminophoric mediums 240, 242 into separate sub-cavities 232, 234, which can reduce or prevent the second recipient luminophoric medium 242 from absorbing light emitted by the first recipient luminophoric medium 240, and vice versa. Thus, the above-described situation where a red phosphor absorbs a significant amount of the emission from a green phosphor and/or from a yellow phosphor may be avoided. Moreover, by having the first and second recipient luminophoric mediums 240, 242 in very close proximity and, in fact, within the same cavity 214 of a surface mount LED package, the mixing between the light emitted from the first and second recipient luminophoric mediums 240, 242 may be improved so that the device will emit light having a more uniform white color.

In some embodiments, the submount 210 may comprise a leadframe. As known to those of skill in the art, a leadframe refers to a cuplike structure in which one or more LEDs may be mounted and electrically connected to a power source. The cuplike structure may include reflective sidewalls that help light emitted from the LEDs to escape from the leadframe. The cuplike structure of the leadframe may define a cavity such as the cavity 214 described above. The cavity may include one or more recipient luminophoric mediums.

In leadframe-based LED packages according to certain embodiments of the present invention, the leadframe 210 may include a molded structure formed of, for example, a reflective white plastic that forms the sidewalls 212 that define the cavity 214. The divider 230 may comprise an integral portion of the molded structure (i.e., the structure that forms the cavity 214 and the sub-cavities 232, 234 may be a single molded package structure that has multiple cavities). Alternatively, the divider 230 may comprise a structure that is separate from the structure that includes the sidewalls 212 that define the cavity 214. This separate divider 230 may be dispensed or otherwise formed or deposited within the cavity 214. The divider 230 may be produced out of white, highly reflective material such as a silicone. The separate divider 230 may divide the cavity 214 into the first and second sub-cavities 232, 234.

In further embodiments, the submount structure 210 may comprise a ceramic or metal submount. In some embodiments, the submount structure may include a molded structure that is formed on the top surface of the ceramic or metal submount. The molded structure may be formed, for example, by overmolding and/or by dispensing a material such as, for example, a reflective white plastic onto the ceramic or metal submount to define the cavity 214. The molded structure may include an integral divider that divides the cavity 214 into multiple sub-cavities such as the sub-cavities 232, 234. One or more LEDs 220 may be mounted in the ceramic submount LED package. The first and second recipient luminophoric mediums 240, 242 may be deposited in the respective sub-cavities 232, 234 to be in close proximity to each other but to not be substantially mixed together. A silicone lens may be overmolded over the LEDs 220.

While FIGS. 12A-12B illustrate one example submount that includes a cavity that is divided into two sub-cavities, it will be appreciated that in further embodiments additional submounts may be provided that have a main cavity and divider that divide the main cavity into different numbers of sub-cavities, which may each have the same size or different sizes, and that the same or different recipient luminophoric mediums may be deposited into each such sub-cavity. It will also be appreciated that the divider that is used to divide the cavity defined by the submount into separate sub-cavities may be a separate structure or may be part of the submount structure (e.g., the walls that define the cavity and the divider that divides the cavity into sub-cavities may all comprise a single molded structure). In further embodiments a divider may be provided even if there is no cavity, and the first and second recipient luminophoric mediums may be sprayed onto the LEDs and onto the submount on the respective sides of the divider. The divider may act to separate the first and second luminophoric mediums to reduce or prevent them from mixing together.

Figure 13:
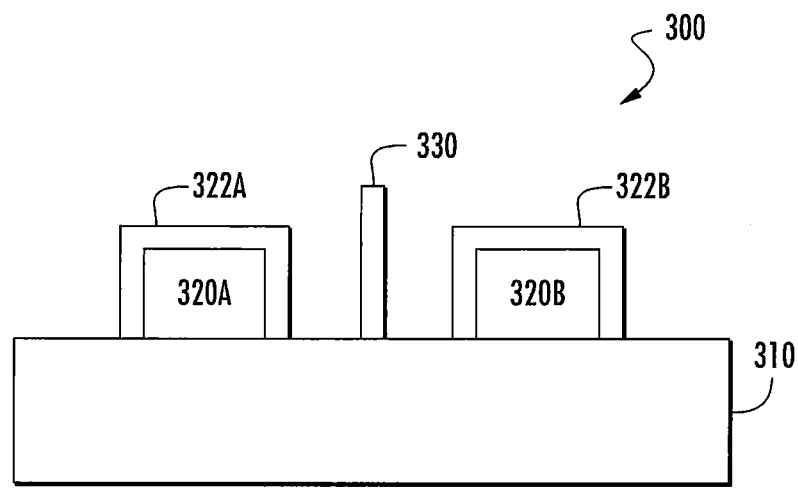
FIG. 13 is a schematic side view of an LED package according to further embodiments of the present invention.

FIG. 13 is a schematic side view of an LED package 300 according to further embodiments of the present invention. As shown in FIG. 13, the LED package 300 includes a submount 310 that has a pair of LEDs 320A, 320B mounted thereon. The submount 310 may comprise, for example, a ceramic, semiconductor or metal substrate. The LEDs 320A, 320B may be mounted on the substrate 310 in a conventional manner and may be electrically connected to a power source in a conventional manner. Accordingly, further description of the submount 310 and the electrical connections will be omitted here. After the LEDs 320A, 320B are mounted on the submount 310, the LED 320A (and perhaps certain other portions of the submount 310) may be covered by a mask or stencil, and then a first recipient luminophoric medium 322A may be deposited on the submount 310 and the exposed LED 320A via any appropriate deposition process such as, for example, spraying. Thereafter, the mask/stencil may be removed and a second mask/stencil may be placed or formed over the LED 320A (and perhaps certain other portions of the submount 310). Then a second recipient luminophoric medium 322B may be deposited on the submount 310 and the second (now exposed) LED 320B via any appropriate deposition process such as, for example, spraying. The first recipient luminophoric medium 322A may include yellow and/or green phosphors and may not include any red phosphors, and the second recipient luminophoric medium 322B may include one or more red phosphors and may not include any yellow or green phosphors. In this manner, an LED package 300 may be formed that has two distinct emitters that emit different color light. The two emitters may be in very close proximity. For example, the LEDs 320A and 320B may be separated by between, for example, 1-50 millimeters in some embodiments. A divider 330 may be provided between the LEDs 320A, 320B on the submount 310. The divider 330 may reduce the amount of light emitted by the LED 320A and the recipient luminophoric medium 322A that is absorbed by the LED 320B and the recipient luminophoric medium 322B, and vice versa, and hence may reduce the amount of double-conversion that may occur. A lens (not shown) may be placed over both LEDs 320 in some embodiments.

Figure 14:
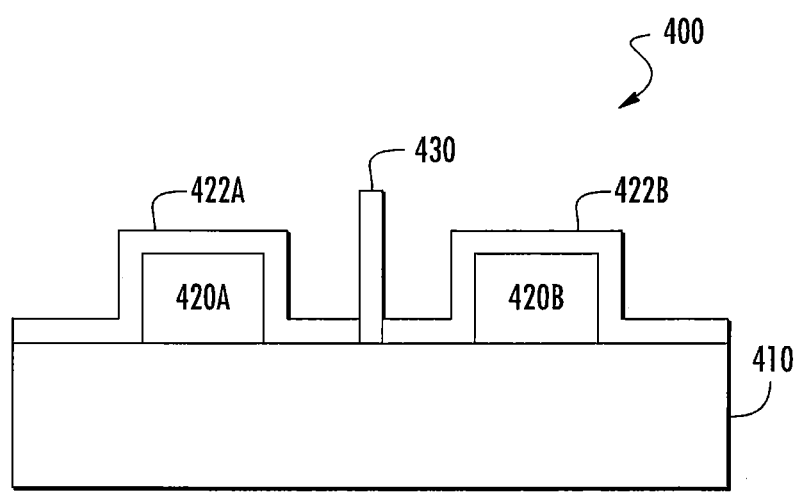
FIG. 14 is a schematic side view of an LED package according to still further embodiments of the present invention.

FIG. 14 is a schematic side view of a packaged LED 400 according to still further embodiments of the present invention. As shown in FIG. 14, the packaged LED 400 includes a submount 410 that has a pair of LEDs 420A, 420B mounted thereon. The submount 410 may comprise, for example, a ceramic, semiconductor or metal substrate. The LEDs 420 may be mounted on the substrate 410 in a conventional manner and may be electrically connected to a power source in a conventional manner. Accordingly, further description of the submount 410 and the electrical connections will be omitted here. The LEDs 420 may comprise, for example, a first blue-shifted-yellow or a blue-shifted-green LED 420A and a second blue-shifted-red LED 420B. The LEDs 420A and 420B may be in very close proximity. For example, the LEDs 420A and 420B may be separated by between, for example, 1-50 millimeters in some embodiments. The LEDs 420A and 420B may have respective recipient luminophoric mediums 422A, 422B formed thereon after the LEDs 420A, 420B are mounted on the submount 410. For example, the respective recipient luminophoric mediums 422 may be deposited on the LEDs 420 after the LEDs 420 are mounted on the submount 410 using, for example, a phosphor spraying technique. In this case, the recipient luminophoric mediums 422 may extend onto the sidewalls of the LEDs 420 as shown in FIG. 14. In other embodiments, the recipient luminophoric mediums 422 may be deposited on the LEDs 420 after the LEDs are singulated but before they are mounted on the submount 410 by, for example, mounting the LEDs 420 on a temporary submount such as, for example, a tape (not shown), and performing a phosphor spraying process. The phosphor coated LEDs 420 may then be mounted on the submount 410. Alternatively, the recipient luminophoric mediums 422 may be applied using a wafer level deposition process such as spin-coating or electrophoretic deposition in order to deposit the recipient luminophoric mediums 422 on LED wafers before the wafers are diced into individual LED chips 420.

As shown in FIG. 14, the LED package 400 may not include a cavity such as the cavity 214 of LED package 200, since the recipient luminophoric mediums 422 were formed on the LEDs 420 prior to placement of the LEDs 420 on the submount 410. The LED package 400 may optionally include a divider 430, which may comprise, for example, a reflective plastic divider 430. Such a divider may reduce the amount of light emitted by the LED 420A and the recipient luminophoric medium 422A that is absorbed by the LED 420B and the recipient luminophoric medium 422B (and vice versa), and hence may reduce the amount of double-conversion that may occur. A lens (not shown) may be placed over both LEDs 420 in some embodiments.

The LED package 400 may exhibit excellent color mixing properties as the separate blue-shifted-yellow or blue-shifted-green LED 420A and the blue-shifted-red LED 420B are in very close proximity to each other.

The LED packages 200, 300 and 400 that are described above with reference to FIGS. 12A-14 comprise multi-zone emitters in that a single LED package emits light of two distinct colors. The light of two distinct colors may be a first color that is on a first side of the black body locus and a second color that is on a second side of the black body locus. In some embodiments, the light emitted by the first zone may comprise blue-shifted-yellow or blue-shifted-green light that is non-white light that comprises pass through light from a blue LED and light emitted by yellow and/or green phosphors. The light emitted by the second zone may comprise blue-shifted-red light that is non-white light that comprises pass-through light from a blue LED and light emitted by one or more red phosphors. In some embodiments, the first and/or the second zone may include one or more narrow band phosphors, such as, for example, $K_2SF_6$, among others, as disclosed in U.S. Provisional Patent Application Ser. Nos. 62/222,382 and 62/181,249, each of which are incorporated herein by reference. The light of two different colors may mix well, even when the LED packages 200, 300 and 400 are used in smaller solid state light fixtures, because the two zones that emit light of different colors are so close together. A plurality of the LED packages 200, 300 and/or 400 may be included in the solid state light fixture. For example, the LED packages 200, 300 and/or 400 could be used in place of the LED packages 142A, 142B that are included in the solid state light fixture 100 that is discussed above with reference to FIGS. 11A-11C.

Figure 16A:
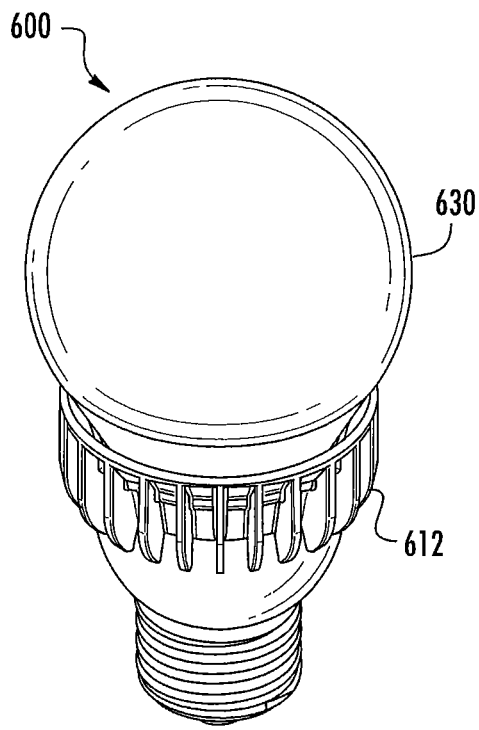
FIGS. 16A-16D illustrate a solid state light bulb according to still further embodiments of the present invention.
Figure 16B:
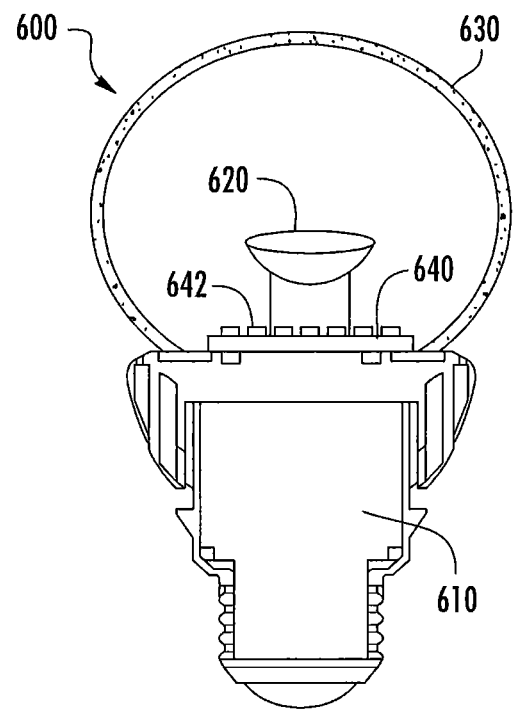
Figure 16C:
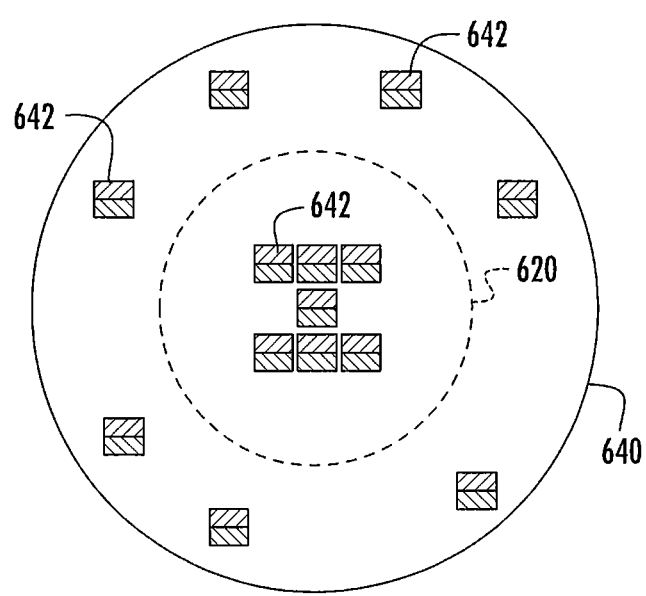
Figure 16D:
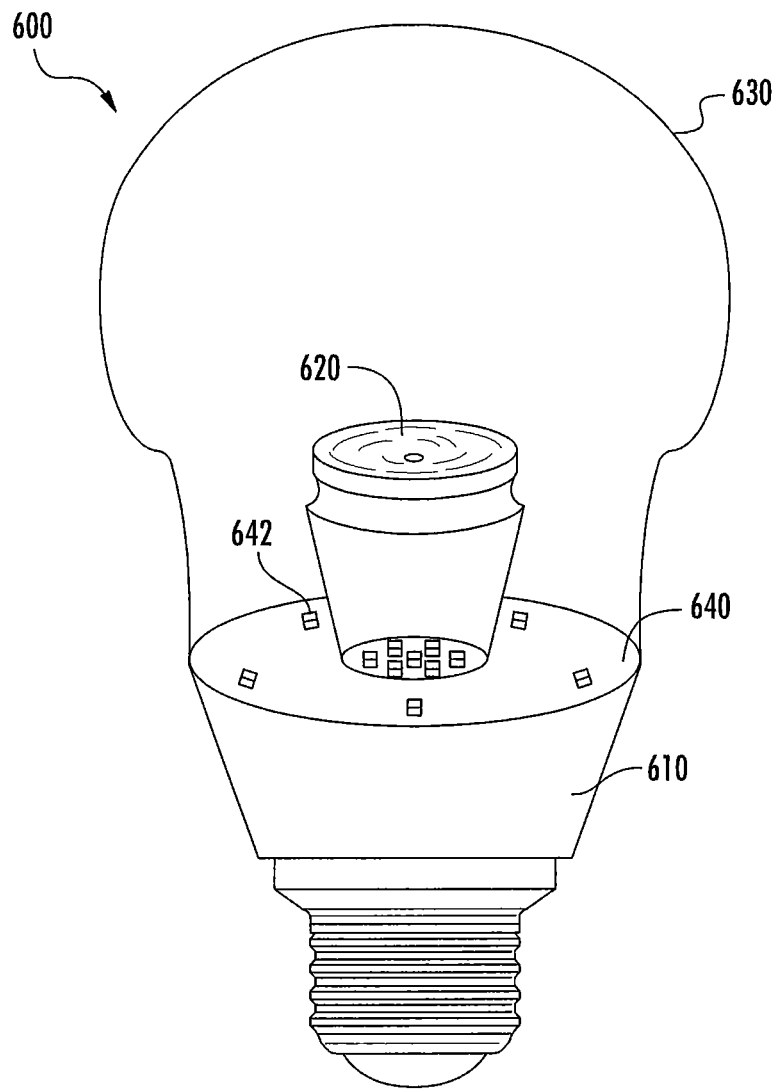

FIGS. 16A-16C illustrate a solid state light bulb 600 according to still further embodiments of the present invention. In particular, FIG. 16A is a perspective view of the solid state light bulb 600, FIG. 16B is a cross-sectional view of the solid state light bulb 600, FIG. 16C is a plan view of a submount of the solid state light bulb 600 that has a plurality of LED packages mounted thereon. FIG. 16D is a perspective view of a modified version of the solid state light bulb 600 that includes a secondary optical structure according to some other embodiments.

As shown in FIGS. 16A-16D, the solid state light bulb 600 comprises a body 610, a secondary optical structure 620, a dome 630 and a submount 640 with a plurality of LED packages 642 mounted thereon. The body 610 and the dome 630 may be any conventional body and dome, respectively, and hence these elements will not be discussed further herein. In the depicted embodiment, the body includes a heat sink 612, but it will be appreciated that this heat sink 612 may be omitted in other embodiments. The submount 640 may be similar to the submount 120 discussed above with respect to FIG. 11B. However, the layout of the LED packages 642 on the submount 640 differs from the layout of the LED packages 142 on the submount 120 of FIG. 11B. In particular, on submount 640, seven of the LED packages 642 are clustered in the center of the submount 640, and the other seven LED packages 642 are dispersed around the periphery of the submount 640 to define a circle. It will also be noted that each LED package 642 comprises a multi-zone emitter in which light having two distinct colors is output from an individual LED package 642. The LED packages 642 may be formed, for example, according to the discussion of FIGS. 12A-12B above.

The secondary optical structure 620 is mounted within the dome 630 above the submount 640. The secondary optical structure 620 may comprise, for example, a total internal reflection optical structure, two versions of which are schematically shown in FIGS. 16B and 16D. A total internal reflection optical structure may comprise a highly efficient optical structure that receives light and reflects the light so that it is emitted from the structure in a different, desired direction. For light bulbs, it is often desirable to have much of the light emit from the side of the dome 630 or even to shine downwardly below the body 610 of the light bulb 600. The total internal reflection optical structure 620 may redirect at least a portion of the upwardly directed light emitted by the LED packages 642 so that it is emitted at various angles through the side of the dome 630.

Referring to FIGS. 16B-D, seven of the LED packages 642 are directly underneath the total internal reflection optical structure 620 (the location of the total internal reflection optical structure 620 is shown by the circle drawn in a dashed line in FIG. 16C) and hence most of the light output by these LED packages 642 will be redirected by the total internal reflection optical structure 620. The remaining LED packages 642 are positioned below and around the periphery of the total internal reflection optical structure 620. Some of the light emitted by these LED packages 642 may be reflected off the sides of the total internal reflection optical structure 620 and/or captured by the total internal reflection optical structure 620 and redirected, while other of the light emitted by these LED packages 642 may exit the light bulb 600 without interacting with the total internal reflection optical structure 620.

While the solid state light fixtures according to embodiments of the present invention that are discussed above are implemented using, for example, blue-shifted-yellow/green and blue-shifted-red LED packages, it will be appreciated that in other embodiments violet or ultraviolet LEDs could be used in place of the blue LEDs. Thus, it will be appreciated that all of the above-described embodiments could be implemented using blue, violet and/or ultraviolet LEDs, and hence the change in the output of the LEDs as a function of operating temperature and/or as a function of hours of operation (lifetime) may be similar, reducing or eliminating any need for control circuitry that modifies the drive currents supplied to the LEDs based on operating temperature, lifetime or measured output of the LEDs (as the luminous flux and color of the light. Herein, the term "UV/blue-shifted-yellow/green LED packages" refers to an LED package having one or more LEDs that emit light in the ultraviolet, violet or blue color ranges that have an associated recipient luminophoric medium that includes phosphor(s) that receive the ultraviolet/violet/blue light emitted by the LED(s) and in response thereto emit light having a peak wavelength in the yellow or green color ranges.

As described above, pursuant to some embodiments of the present invention, solid state light fixtures are provided that include a plurality of blue-shifted-yellow/green LED packages and a plurality of blue-shifted-red LED packages. These solid state light fixture may emit light having a correlated color temperature of between 1800 K and 5500 K, a CRI value of between 80 and 99, a CRI R9 value of between 15 and 75, and a Qg value of between 90 and 110 when the blue-shifted-yellow/green LED packages and the blue-shifted-red LED packages are operating at steady-state operating temperatures of at least 80° C.

In some embodiments, each blue-shifted-yellow/green LED package may comprise a first blue LED and an associated first recipient luminophoric medium that includes a $Y_3Al_5O_{12}$:Ce phosphor and/or a $Lu_3Al_5O_{12}$:Ce phosphor, and each blue-shifted-red LED package may comprise a second blue LED and an associated second recipient luminophoric medium that includes a first $(Ca_{1-x}Sr_x)SiAlN_3$:$Eu^{2+}$ phosphor. In some such embodiments the first blue LEDs may have a first average peak wavelength that is less than a second average peak wavelength of the second blue LEDs. For example, the first blue LEDs may each have a peak wavelength that is less than 455 nm and the second blue LEDs may each have a peak wavelength that is more than 460 nm.

In some embodiments, the first recipient luminophoric mediums may include both the $Y_3Al_5O_{12}$:Ce phosphor and the $Lu_3Al_5O_{12}$:Ce phosphor and no red phosphor. Likewise, in some embodiments, two different types of blue-shifted-red LED packages may be provided, where the each different type includes a different $(Ca_{1-x}Sr_x)SiAlN_3$:$Eu^{2+}$ phosphor. In other embodiments, each blue-shifted-red LED package may include two different $(Ca_{1-x}Sr_x)SiAlN_3:Eu^{2+}$ phosphors that are mixed together in the same recipient luminophoric medium. In each case, the peak wavelength of the two different $(Ca_{1-x}Sr_x)SiAlN_3:Eu^{2+}$ phosphors may be different. For example, the first $(Ca_{1-x}Sr_x)SiAlN_3:Eu^{2+}$ phosphor may have a peak wavelength between 615 and 624 nm and the second $(Ca_{1-x}Sr_x)SiAlN_3:Eu^{2+}$ phosphor may have a peak wavelength between 625 nm and 640 nm.

In some embodiments, the solid state light fixture may be an A-series light bulb such as an A19 or A21 light bulb. The solid state light fixture may also be a candelabra light bulb. The blue-shifted-yellow/green LED packages and the blue-shifted-red LED packages may be surface mounted on a printed circuit board in some embodiments such that each of the blue-shifted-yellow/green LED packages is immediately adjacent a respective one of the blue-shifted-red LED packages.

In some embodiments, a first of the blue-shifted-yellow/green LED packages and a first of the blue-shifted-red LED packages may be implemented together as a packaged LED component that includes at least one LED on a submount and a first recipient luminophoric medium that only includes yellow and/or green phosphors on a first side of the submount and a second recipient luminophoric medium that only includes red phosphors on a second side of the submount that is opposite the first side.

Pursuant to further embodiments of the present invention, packaged LED components are provided that include a submount having an LED mounting surface; at least one LED on the LED mounting surface; and a first recipient luminophoric medium having a first phosphor on top of a first region of the LED mounting surface and a second recipient luminophoric medium having a second phosphor that is different from the first phosphor and that emits light having a peak wavelength in the red color range on top of the second region of the LED mounting surface. In these embodiments, the first recipient luminophoric medium is separate from the second recipient luminophoric medium and the second recipient luminophoric medium is not on top of the first region and the first recipient luminophoric medium is not on top of the second region.

In some embodiments, these packaged LED components may include a divider that extends across the LED mounting surface to define the first region and the second region. The LED mounting surface may be within a cavity, and the divider may divide the cavity into first and second sub-cavities. In such embodiments, the first recipient luminophoric medium may be in the first sub-cavity and the second recipient luminophoric medium may be in the second sub-cavity. The distance between the first sub-cavity and the second sub-cavity is less than two centimeters in some embodiments. In some embodiments, the submount may include a molded structure that defines the cavity and the first and second sub-cavities. In other embodiments, the divider may be a separate structure from the material that defines the cavity. The divider may comprise, for example, a reflective plastic material.

In some embodiments, the first recipient luminophoric medium may include a $Y_3Al_5O_{12}:Ce$ phosphor and/or a $Lu_3Al_5O_{12}:Ce$ phosphor and may emit light having a peak wavelength in the green or yellow color range, and the second recipient luminophoric medium may include at least a first $(Ca_{1-x}Sr_x)SiAlN_3:Eu^{2+}$ phosphor.

Pursuant to further embodiments of the present invention, solid state light fixtures are provided that include a plurality of blue-shifted-yellow/green LED packages and a plurality of blue-shifted-red LED packages, where the light emitted by the solid state light fixture has an emission spectrum having a first peak in the blue color range, a second peak between 525 nm and 575 nm, and a third peak between 610 nm and 650 nm, and the third peak is larger than the first peak and the second peak. The second peak may be a shoulder formed on a side of the third peak. The second peak may be between 535 nm and 555 nm, and the third peak may be between 615 nm and 630 nm.

In such embodiments, each blue-shifted-yellow/green LED package may comprise a first blue LED and an associated first recipient luminophoric medium that includes a $Y_3Al_5O_{12}:Ce$ phosphor and/or a $Lu_3Al_5O_{12}:Ce$ phosphor, and each blue-shifted-red LED package comprises a second blue LED and an associated second recipient luminophoric medium that includes a first $(Ca_{1-x}Sr_x)SiAlN_3:Eu^{2+}$ phosphor (and in some cases, a second $(Ca_{1-x}Sr_x)SiAlN_3:Eu^{2+}$ phosphor that emits light having a peak wavelength that is higher than the peak wavelength of the light emitted by the first $(Ca_{1-x}Sr_x)SiAlN_3:Eu^{2+}$ phosphor as well). The solid state light fixture may emit light having a correlated color temperature of between 1800 K and 5500 K, a CRI value between 80 and 99, a CRI R9 between 15 and 75, and a Qg value between 90 and 110 when LEDs in the blue-shifted-yellow/green LED packages and the LEDs in the blue-shifted-red LED packages are operating at steady-state operating temperatures of at least 80° C.

Pursuant to still other embodiments of the present invention, lighting apparatus are provided that comprise a three dimensional shaped optically transmissive enclosure such as the dome 130 described above that has an interior volume; a plurality of distinct yellow/green light emitting regions within the interior volume, the yellow/green light emitting regions comprising at least one gallium nitride based LED that produces shorter wavelength light and at least one first recipient luminophoric medium that downconverts at least some of the shorter wavelength light to longer wavelength light; and a plurality of distinct red/orange light emitting regions within the interior volume, the red/orange light emitting regions comprising at least one gallium nitride based LED that produces shorter wavelength light and at least one second recipient luminophoric medium that down-converts at least some of the shorter wavelength light to longer wavelength light. The lighting apparatus emits white light from the optically transmissive enclosure having a correlated color temperature between 1800 K and 5500 K and a CRI value of greater than 80. The light emitted by the lighting apparatus may have a CRI R9 value between 15 and 75, and a Qg value between 90 and 110 when the gallium nitride based LEDs are operating at steady-state operating temperatures of at least 80° C. in some embodiments. The lighting apparatus may be, for example, an A series light bulb.

In some embodiments, the at least one first recipient luminophoric medium may include a $Y_3Al_5O_{12}:Ce$ phosphor and/or a $Lu_3Al_5O_{12}:Ce$ phosphor, and the at least one second recipient luminophoric medium may include a first $(Ca_{1-x}Sr_x)SiAlN_3:Eu^{2+}$ phosphor. The at least one second recipient luminophoric medium may further include a second $(C_{a1-x}S_{rx})SiAlN_3:E^{u2+}$ phosphor that has a peak wavelength that is greater than a peak wavelength of the first $(C_{a1-x}S_{rx})SiAlN_3:E^{u2+}$ phosphor in some embodiments.

In other embodiments, the lighting apparatus may further include a second plurality of distinct red/orange light emitting regions that are within the interior volume, the second red/orange light emitting regions comprising at least one gallium nitride based LED that produces shorter wavelength light and at least one third recipient luminophoric medium that downconverts at least some of the shorter wavelength light to longer wavelength light, wherein a peak wavelength of the light emitted by the at least one third recipient luminophoric medium exceeds a peak wavelength of the light emitted by the at least one second recipient luminophoric medium.

Pursuant to yet further embodiments of the present invention, lighting apparatus may be provided that comprise an optically transmissive enclosure comprising an interior volume and shaped in accordance with an A series bulb; a plurality of distinct yellow/green light emitting regions that are configured to emit light into the interior volume, the yellow/green light emitting regions comprising at least one gallium nitride based LED that produces shorter wavelength light and at least one first recipient luminophoric medium that downconverts at least some of the shorter wavelength light to longer wavelength light; and a plurality of distinct red/orange light emitting regions that are configured to emit light into the interior volume, the red/orange light emitting regions comprising at least one gallium nitride based LED that produces shorter wavelength light and at least one second recipient luminophoric medium that downconverts at least some of the shorter wavelength light to longer wavelength light. The lighting apparatus may emit light having a correlated color temperature of between 1800 K and 5500 K, a CRI value between 80 and 99, a CRI R9 value between 15 and 75, and a Qg value between 90 and 110 when the gallium nitride based LEDs are operating at steady-state operating temperatures of at least 80° C.

In some embodiments, the at least one first recipient luminophoric medium may include a $Y_3Al_5O_{12}$:Ce phosphor and/or a $Lu_3Al_5O_{12}$:Ce phosphor, and the at least one second recipient luminophoric medium may include a first $(Ca_{1-x}Sr_x)SiAlN_3$:$Eu^{2+}$ phosphor. In some cases, the at least one second recipient luminophoric medium may also include a second $(Ca_{1-x}Sr_x)SiAlN_3$:$Eu^{2+}$ phosphor that has a peak wavelength that is greater than a peak wavelength of the first $(Ca_{1-x}Sr_x)SiAlN_3$:$Eu^{2+}$ phosphor. In other embodiments, the lighting apparatus may further include a second plurality of distinct red/orange light emitting regions that are configured to emit light into the interior volume, the second red/orange light emitting regions comprising at least one gallium nitride based LED that produces shorter wavelength light and at least one third recipient luminophoric medium that downconverts at least some of the shorter wavelength light to longer wavelength light, wherein a peak wavelength of the light emitted by the at least one third recipient luminophoric medium exceeds a peak wavelength of the light emitted by the at least one second recipient luminophoric medium.

According to still other embodiments of the present invention, A-series solid state light bulbs are provided that include an A-series light bulb body; a diffuse optical enclosure mounted on the A-series light bulb body; a reflector within the diffuse optical enclosure; and a submount having at least one blue-shifted-yellow/green emitter and at least one blue-shifted-red emitter in a central section of the submount and a plurality of blue-shifted-yellow/green emitters and a plurality of blue-shifted-red emitters arranged around a periphery of the submount. In these light bulbs, each blue-shifted-yellow/green emitter emits light having a peak wavelength in the yellow or green color ranges and each blue-shifted-red emitter emits light having a peak wavelength in the red color range. The reflector may be positioned above the submount and may have a truncated frusto-conical shape in some embodiments.

In some embodiments, the at least one blue-shifted-yellow/green emitter and at least one blue-shifted-red emitter that are in the central section of the submount comprise a packaged LED component that includes at least one blue light emitting diode ("LED") on an LED mounting surface, a first recipient luminophoric medium having a first phosphor on top of a first region of the LED mounting surface and a second recipient luminophoric medium having a second phosphor that is different from the first phosphor on top of a second region of the LED mounting surface, wherein the first recipient luminophoric medium is separate from the second recipient luminophoric medium and the second recipient luminophoric medium is not on top of the first region and the first recipient luminophoric medium is not on top of the second region. The solid state light fixture may be an A19 or A21 solid state light bulb. In some embodiments, the first and second recipient luminophoric regions may be disposed side-by-side on the at least one LED.

Pursuant to still other embodiments of the present invention, solid state light fixtures are provided that include a diffuse optical enclosure having an interior volume; a plurality of blue-shifted-yellow/green emitters that are configured to emit light into the interior volume; a plurality of blue-shifted-red emitters that are configured to emit light into the interior volume; and a controller that controls the relative current levels provided to the plurality of blue-shifted-yellow/green emitters and the plurality of blue-shifted-red emitters. This controller is configured to increase the relative amount of drive current supplied to the blue-shifted-red emitters as compared to the blue-shifted-yellow/green emitters when the solid state light fixture is dimmed.

In some embodiments, first light emitted from the diffuse optical enclosure may comprise white light having a correlated color temperature of between 1800 K and 5500 K when the solid state light fixture is not dimmed, and second light emitted from the diffuse optical enclosure when the solid state light fixture is dimmed by at least 40% becomes non-white light with an increased red component.

In some embodiment, each blue-shifted-yellow/green emitter may comprise a first blue LED and an associated first recipient luminophoric medium that includes a $Y_3Al_5O_{12}$:Ce phosphor and/or a $Lu_3Al_5O_{12}$:Ce phosphor, and each blue-shifted-red emitter comprises a second blue LED and an associated second recipient luminophoric medium that includes a first $(Ca_{1-x}Sr_x)SiAlN_3$:$Eu^{2+}$ phosphor.

The above-described solid state light fixtures according to embodiments of the present invention may exhibit high luminous flux, high quality color rendering, a good ability to accurately reproduce red colors, and overall high color quality and vividness, and may maintain such performance even at high operating temperatures (e.g., temperatures of 100° C.).

While embodiments of the present invention have primarily been discussed above with respect to solid state light bulbs, and may have particular utility with respect to various small form factor light fixtures as well as light fixtures having three dimensional optically transmissive enclosures, it will be appreciated that the same techniques may be used in other types of solid state light fixtures. For example, each of the embodiments disclosed herein may be alternatively implemented in other types of solid state light fixtures including, for example, downlights, troffers, streetlights, canopy lights, parking garage lights, lights that use a two dimensional planar optically transmissive lens, such as a diffuse lens and other lighting fixtures.

Figure 15A:
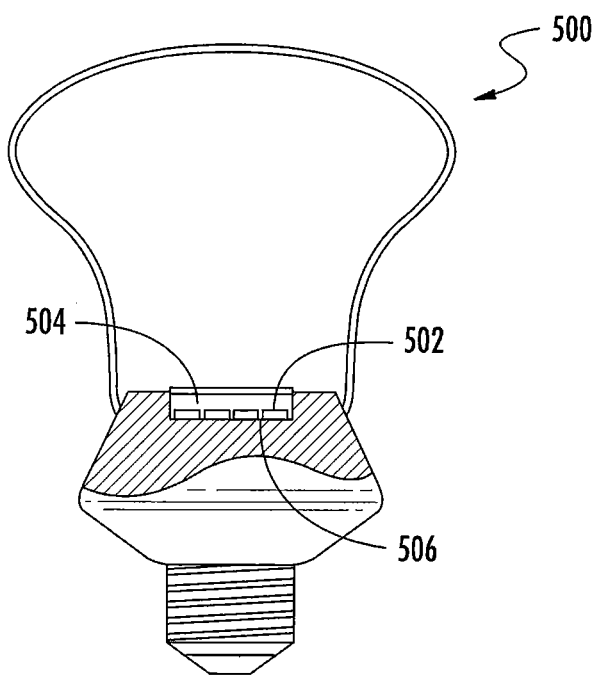
FIG. 15A illustrates a PAR-series downlight according to further embodiments of the present invention.
Figure 15B:
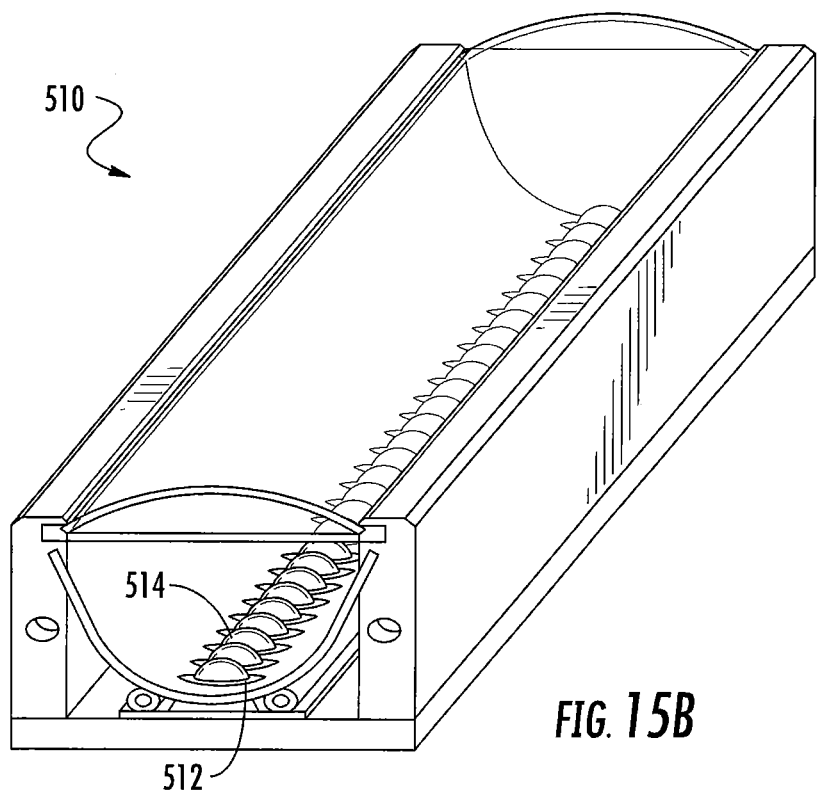
FIG. 15B illustrates a troffer light fixture according to further embodiments of the present invention.
Figure 15C:
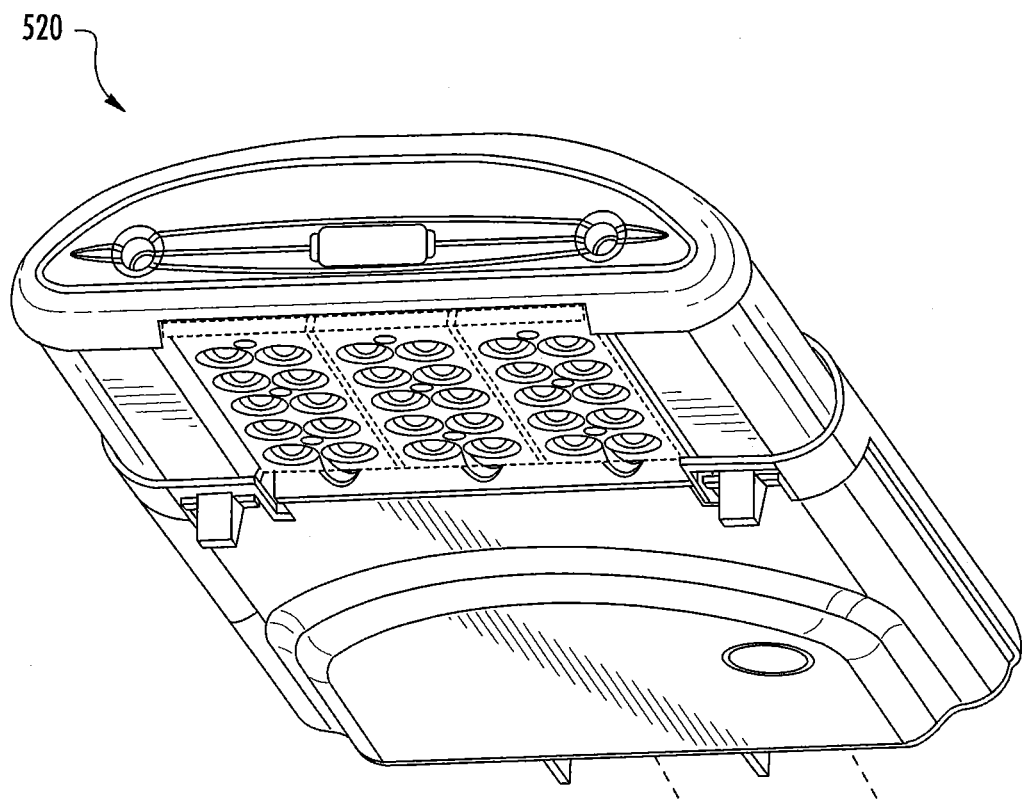
FIG. 15C illustrates a solid state streetlight according to still further embodiments of the present invention.
Figure 15D:
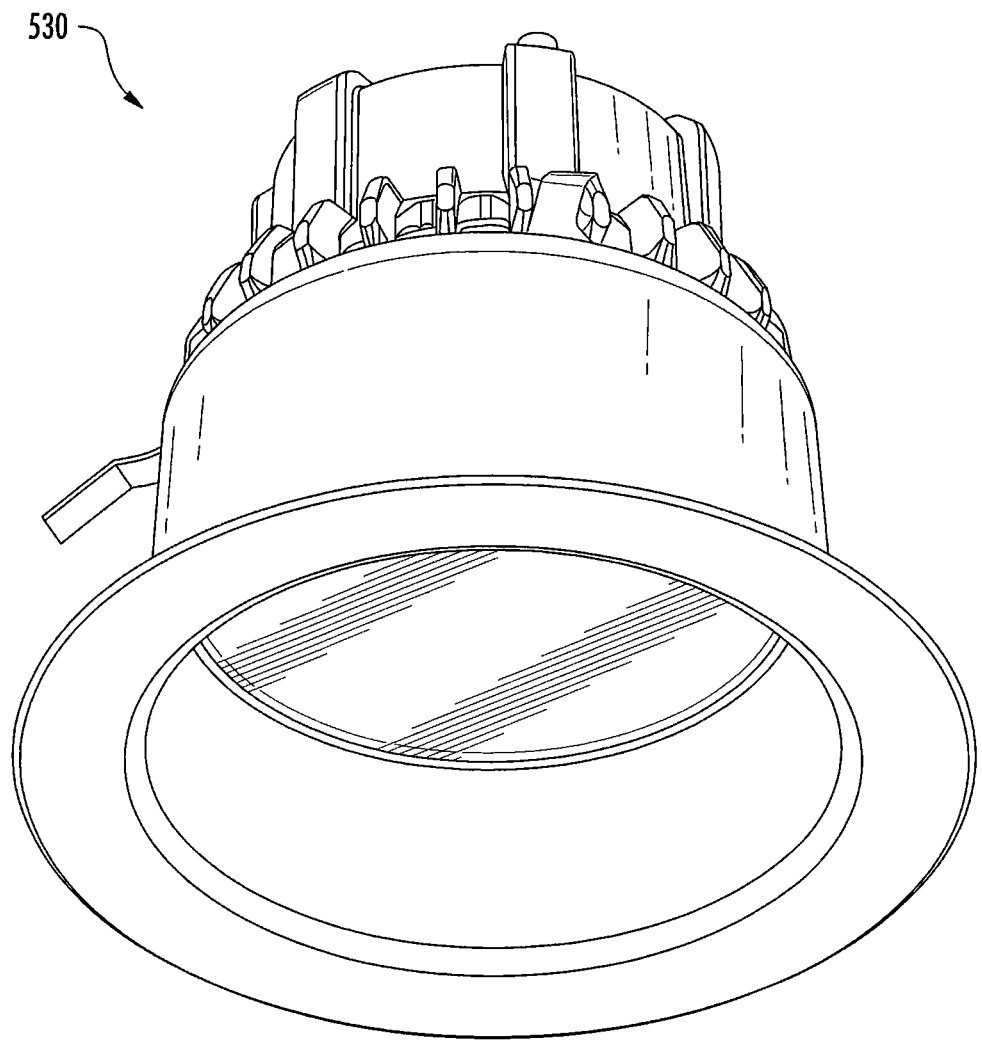
FIG. 15D illustrates a solid state downlight according to still further embodiments of the present invention.

As a simple example of other light fixtures that may use the blue-shifted-yellow/green LED packages and blue-shifted-red LED packages in the manner described above, FIG. 15A illustrates a PAR-series downlight 500. The PAR-series downlight 500 may include blue-shifted-yellow/green LED packages 502 and blue-shifted-red LED packages 504 on a submount 506 according to any of the above-described embodiments of the present invention. The PAR-series downlight 500 may include, for example, the submount printed circuit board 140 of FIG. 11B having the LED packages 142 mounted thereon. The blue-shifted-yellow/green LED packages and blue-shifted-red LED packages according to any of the above-described embodiments of the present invention may also be implemented in various other downlights, such as, for example, in PAR and BR series downlights disclosed in U.S. Pat. Nos. 8,591,062 and 8,596,819 and U.S. patent application Ser. No. 14/306,342, each of which are incorporated herein by reference. As another example, FIG. 15B illustrates a troffer light fixture 510. The troffer light fixture 510 may include blue-shifted-yellow/green LED packages 512 and blue-shifted-red LED packages 514 according to any of the above-described embodiments of the present invention. The above-described blue-shifted-yellow/green LED packages and blue-shifted-red LED packages according to embodiments of the present invention may also be implemented in various other lighting fixtures, such as, for example, in the waveguide-based troffers disclosed in U.S. Patent Publication No. 2014/0347885, in the troffer style fixtures disclosed in U.S. Patent Publication No. 2012/0051041 and/or in the waveguide based garage lights disclosed in U.S. Patent Publication No. 2014/0355302, each of which are incorporated herein by reference. In another example, FIG. 15C illustrates a solid state streetlight 520 according to further embodiments of the present invention. The streetlight 520 may be implemented according to any of the above-described embodiments of the present invention. Other streetlights and outdoor lighting fixtures that can be implemented using the above-described blue-shifted-yellow/green LED packages and blue-shifted-red LED packages according to embodiments of the present invention include the streetlights disclosed in U.S. U.S. Pat. No. 8,622,584; U.S. Pat. No. 8,425,071; U.S. Pat. No. 9,028,087; and U.S. Patent Publication No. 2015/0253488, each of which are incorporated herein by reference. Finally, FIG. 15D illustrates a solid state downlight 530 according to some embodiments of the present invention. The a solid state downlight 530 may include blue-shifted-yellow/green LED packages and blue-shifted-red LED packages according to any of the above-described embodiments of the present invention. Other downlights and similar fixtures that can be implemented using the above-described blue-shifted-yellow/green LED packages and blue-shifted-red LED packages according to embodiments of the present invention include the downlights disclosed in U.S. Pat. No. 8,622,584; U.S. Pat. No. 8,425,071; U.S. Pat. No. 9,028,087; U.S. Pat. No. 8,882,311; and U.S. Patent Publication No. 2015/0253488, each of which are incorporated herein by reference. In all embodiments, the light can be maintained constant over time and/or as a function of temperature through feedback control, open or closed loop control or, alternatively, may be allowed to simply degrade with time without significant shift in color point.

Figure 17A:
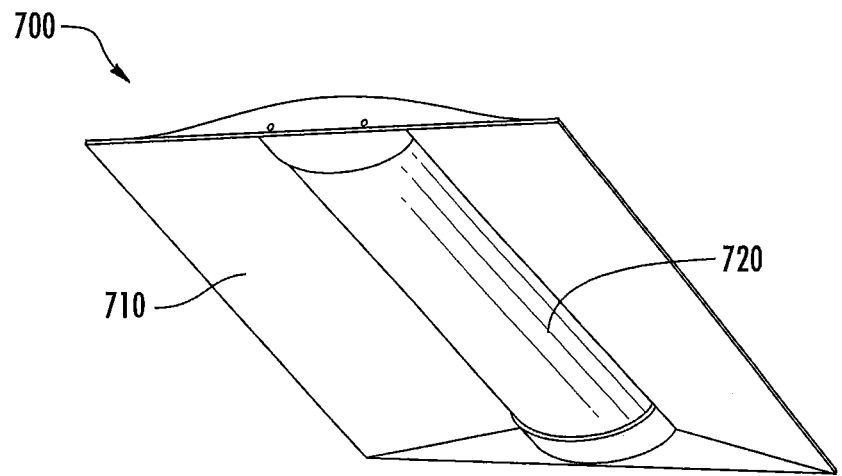
FIG. 17A is a perspective view of a troffer light fixture according to further embodiments of the present invention.
Figure 17B:
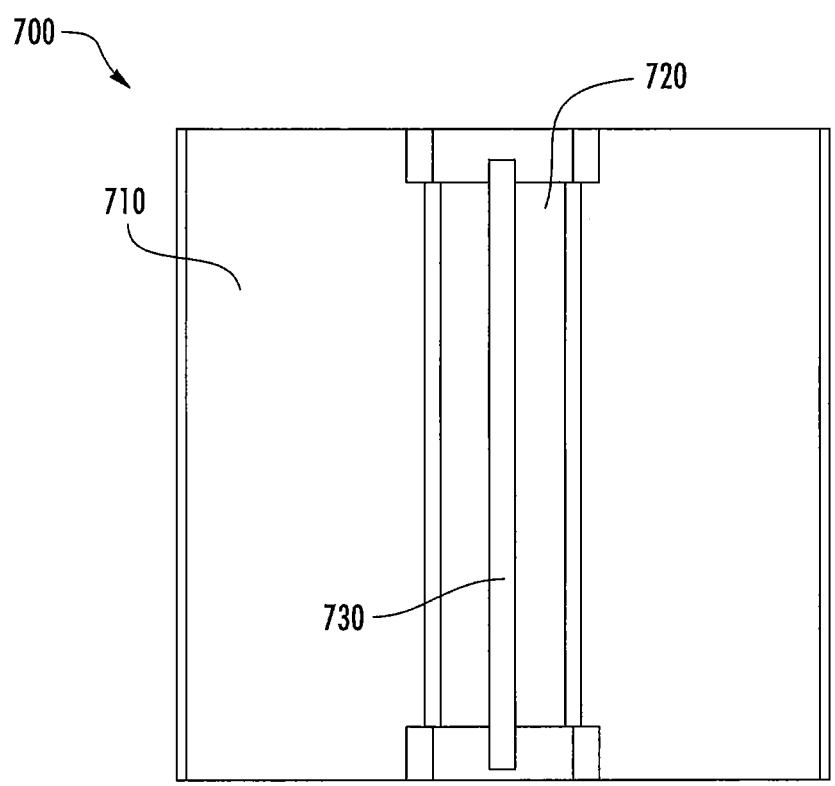
FIG. 17B is a plan view of the troffer light fixture of FIG. 17A.
Figure 17C:
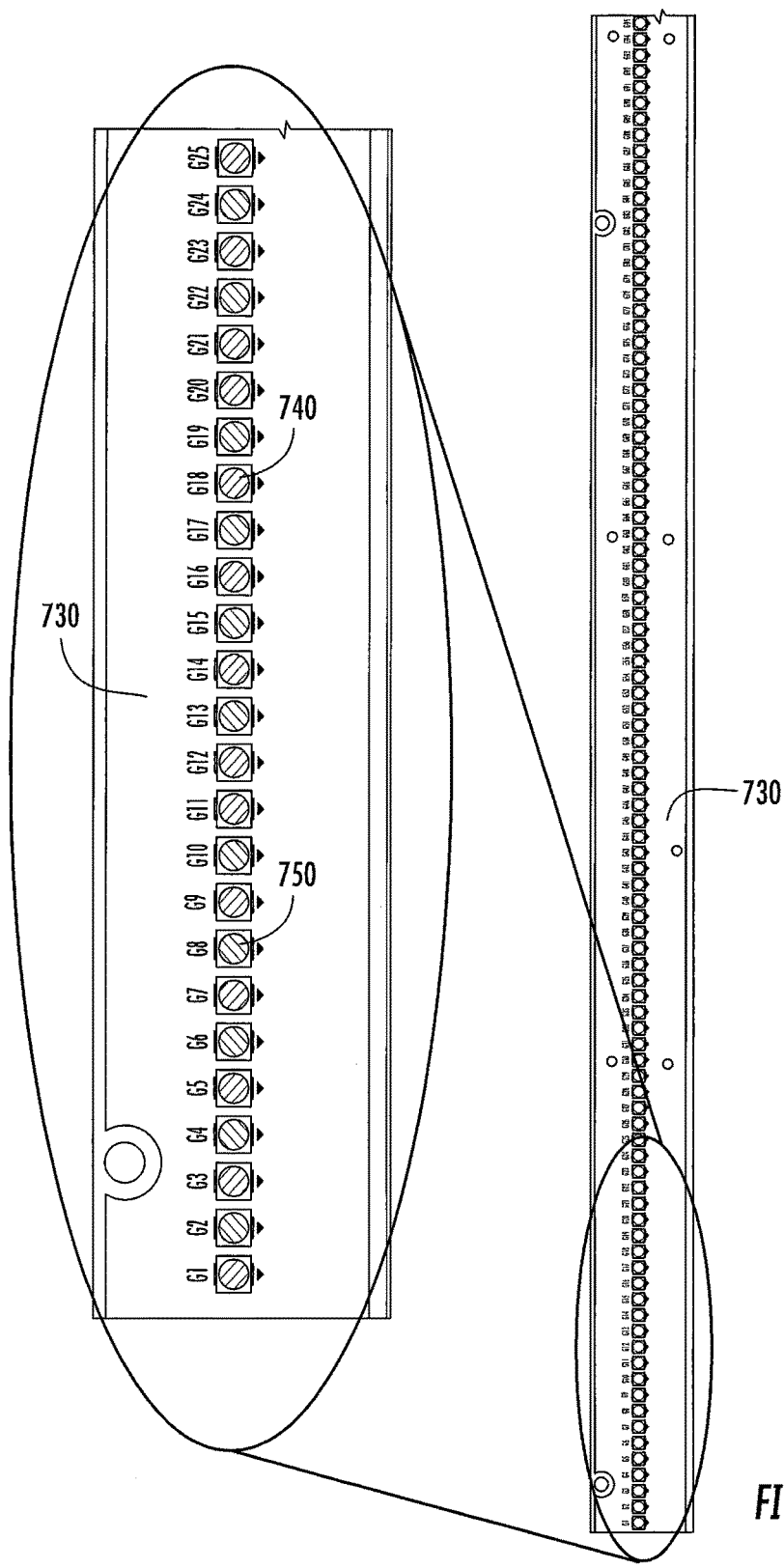
FIG. 17C is a perspective view of the LED package mounting surface and LED packages included in the troffer light fixture of FIG. 17A.

FIGS. 17A-17C illustrate a troffer light fixture 700 according to further embodiments of the present invention. In particular, FIG. 17A is a perspective view of the troffer light fixture 700, FIG. 17B is a plan view of the troffer light fixture 700 and FIG. 17C is a perspective view of the LED package mounting structure and the LED packages 740, 750 included in the troffer light fixture 700.

As shown in FIG. 17A, the troffer light fixture 700 includes a backplate 710 and a dome 720. The dome 720 may or may not also function as a diffuser that mixes light emitted by the LED packages 740, 750. As shown in FIG. 17B, a printed circuit board 730 or other LED package mounting structure may be mounted on the backplate 710 underneath the dome 720.

Turning now to FIG. 17C, a plurality of blue-shifted-yellow/green LED packages 740 and a plurality of blue-shifted-red LED packages 750 are mounted in rows on the package mounting surface 730. The blue-shifted-yellow/green LED packages 740 may be any of the blue-shifted-yellow/green LED packages according to embodiments of the present invention disclosed herein, and the blue-shifted-red LED packages 750 may be any of the blue-shifted-red LED packages according to embodiments of the present invention disclosed herein. In some embodiments, a first subset of the blue-shifted-red LED packages 750 may include a first red phosphor that has a first peak wavelength and a second subset of the blue-shifted-red LED packages 750 may have a second red phosphor that has a second peak wavelength that is longer than the first peak wavelength. The first subset of the blue-shifted-red LED packages 750 that have the first red phosphor having the shorter peak wavelength may be brighter than the second subset of the blue-shifted-red LED packages 750 that have the second red phosphor. Inclusion of the second subset of the blue-shifted-red LED packages 750 that have the second red phosphor may help improve the CRI and/or the CRI R9 performance of the light fixture 700. In other embodiments, each blue-shifted-red LED package 750 may have both the first and second red phosphors mixed together therein in order to allow all of the blue-shifted-red LED packages 750 to be the same component. In still other embodiments, each blue-shifted-red LED package 750 may only include one phosphor and all of the blue-shifted-red LED packages 750 may be the same. Other variations are possible.

The blue-shifted-yellow/green LED packages 740 may, for example, include a YAG:Ce phosphor, a LuAG:Ce phosphor or a combination thereof. In some embodiments some of the blue-shifted-yellow/green LED packages 740 may be blue-shifted-yellow LED packages that include a YAG:Ce phosphor while others of the blue-shifted-yellow/green LED packages 740 may be blue-shifted-green LED packages that include a LuAG:Ce phosphor. In still other embodiments, each blue-shifted-yellow/green LED package 740 may include the same type(s) of phosphor(s), but some of the blue-shifted-yellow/green LED packages 740 may include different amounts of the phosphor(s) than others of the blue-shifted-yellow/green LED packages 740.

As shown in FIG. 17C, there need not be a one-to-one correspondence between the number of blue-shifted-yellow/green LED packages 740 and the number of blue-shifted-red LED packages 750. In the pictured embodiment, six groups of eleven (11) blue-shifted-yellow/green LED packages 740 and nine (9) blue-shifted-red LED packages 750 are provided for a total of 120 LED packages 740, 750. Because there are more blue-shifted-yellow/green LED packages 740 than blue-shifted-red LED packages 750, in some locations two blue-shifted-yellow/green LED packages 740 may be directly adjacent each other.

Figure 17D:
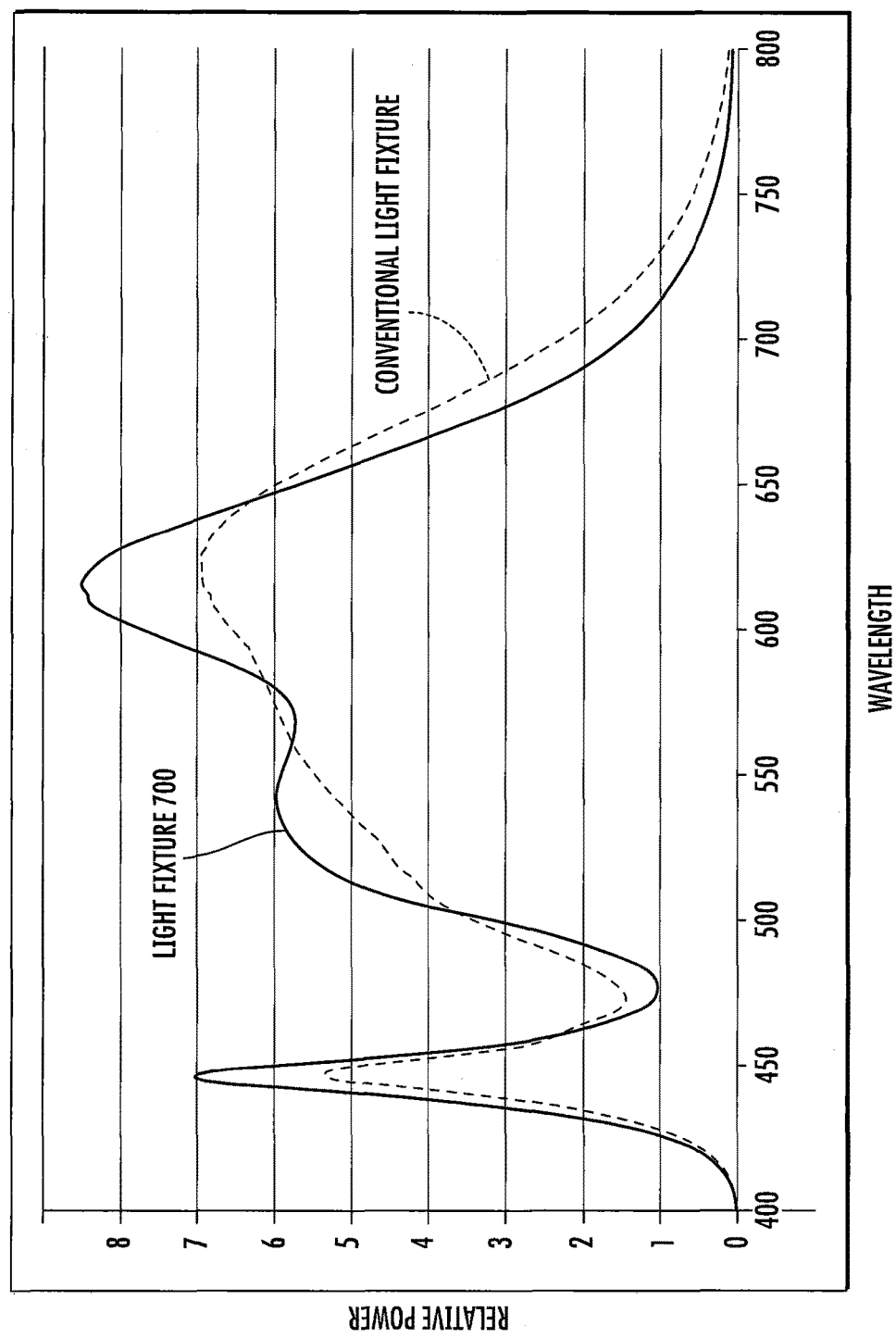
FIG. 17D is a graph that illustrates the emission spectra of a conventional troffer light fixture and the troffer light fixture of FIGS. 17A-17C.

TABLE 5 illustrates measured data for a conventional troffer light fixture that uses LED packages where the yellow/green and red phosphors are mixed together in each LED package as compared to the light fixture 700 that has separate blue-shifted-yellow/green and blue-shifted-red LED packages 740, 750. As shown in TABLE 5, the light fixture 700 according to embodiments of the present invention provides a higher lumen output and improved lumens/watt performance (nearly 10% higher in each case) while providing essentially identical color rendering performance. FIG. 17D illustrates the emission spectra of the two above-discussed troffer light fixtures. The higher luminous output for light fixture 700 results from the increased emission in regions near the center of the eye response curve of FIG. 3.

TABLE 5

| Device | CCT (K) | LPW | Lumens | CRI | R9 |
|---|---|---|---|---|---|
| Conventional Light Fixture | 3420 | 109.2 | 3937 | 90.8 | 60.1 |
| Light Fixture 700 | 3398 | 119.0 | 4306 | 90.9 | 59.0 |

Pursuant to further embodiments of the present invention, light fixtures having adjustable or "tunable" correlated color temperatures are provided. In some embodiments, these light fixtures may include at least three separately controllable strings of LED packages (referred to herein as "LED strings") and at least three different types of LED packages. The correlated color temperature of the light emitted by these light fixtures may be adjusted by adjusting the relative amounts of current supplied to each of the three strings of LED packages. An example embodiment of such a light fixture will now be described with reference to FIGS. 18A-18F.

Figure 18A:
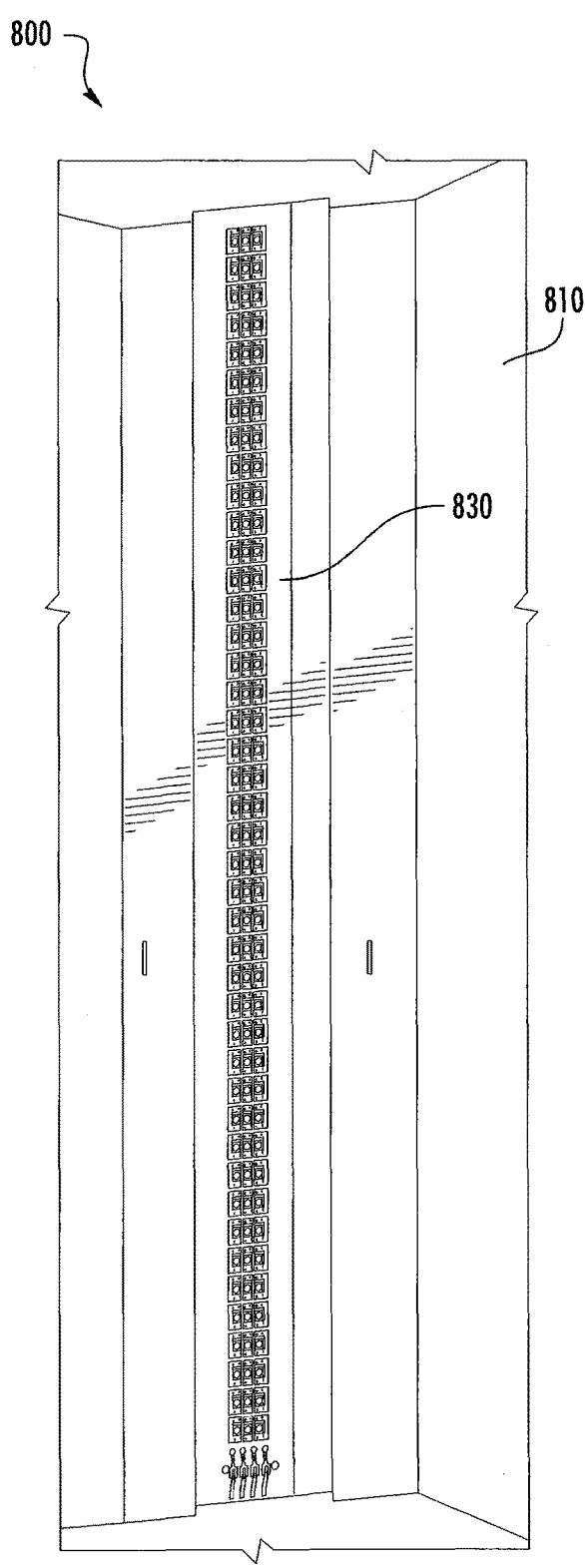
FIG. 18A is a perspective view of a tunable troffer light fixture according to further embodiments of the present invention.
Figure 18B:
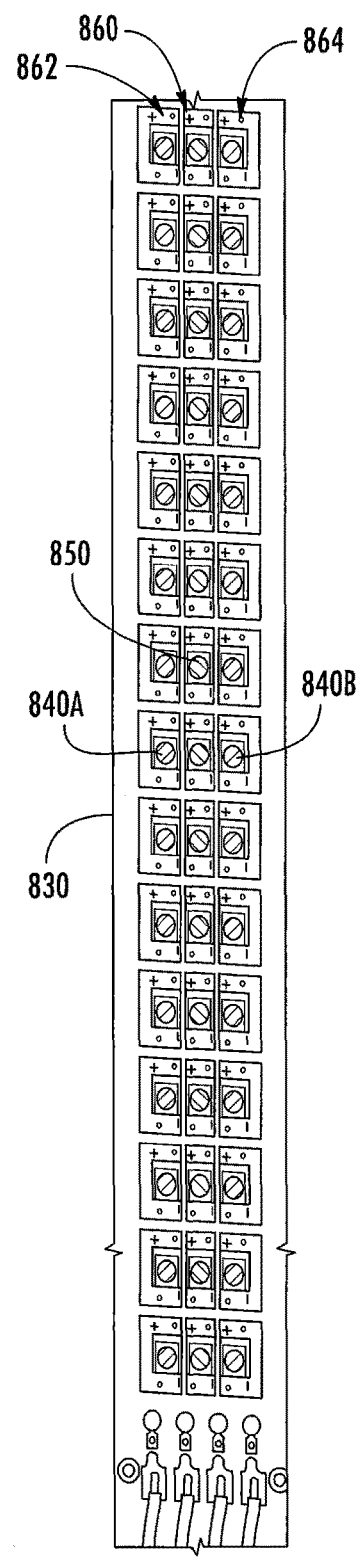
FIG. 18B is an enlarged view of a portion of the LED package mounting surface and LED packages of the tunable troffer light fixture of FIG. 18A.
Figure 18C:
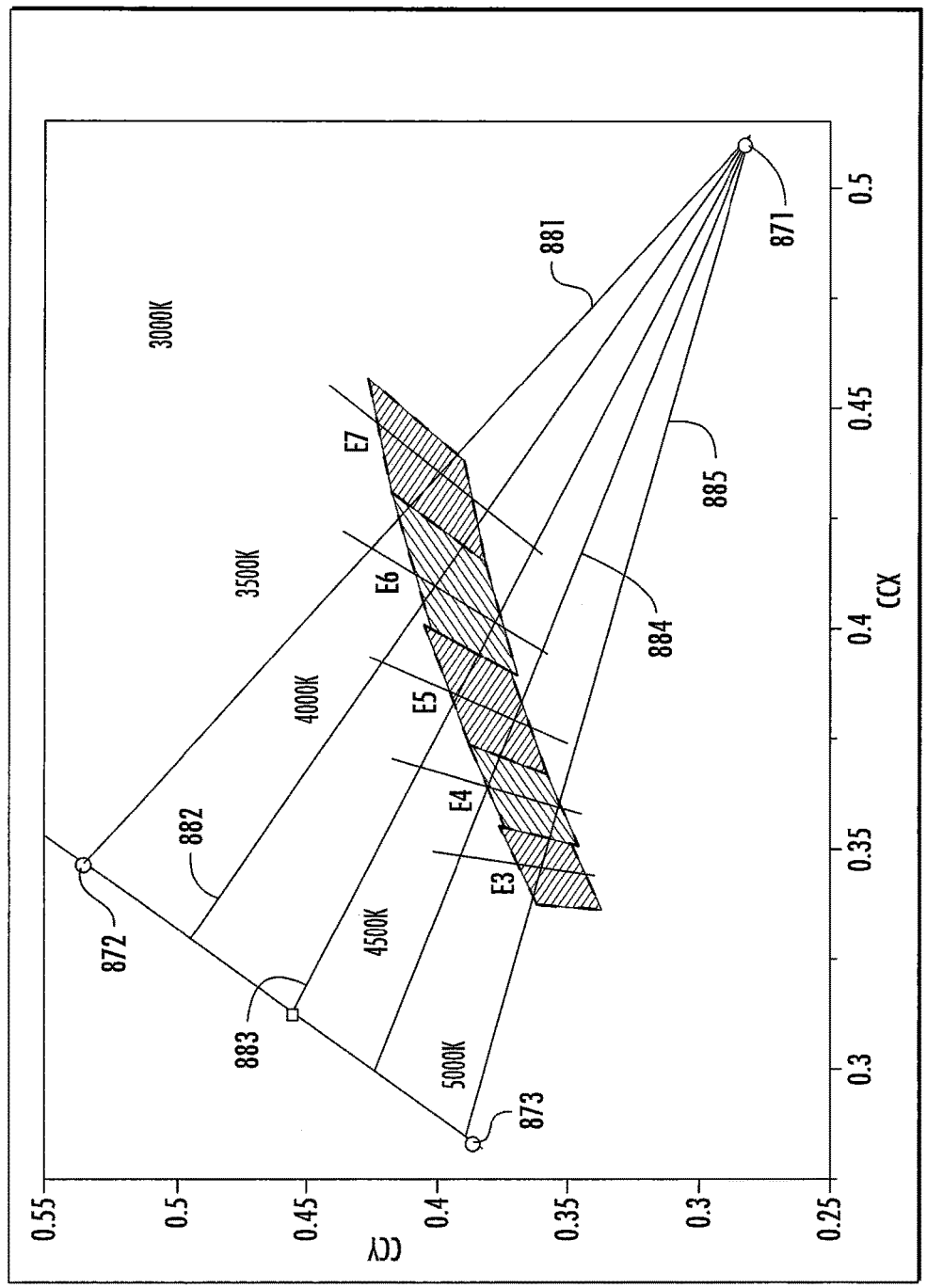
FIG. 18C is an enlarged portion of the 1931 CIE Chromaticity Diagram illustrating a range of color points that may be achieved using the tunable troffer light fixture of FIG. 18A.
Figure 18D:
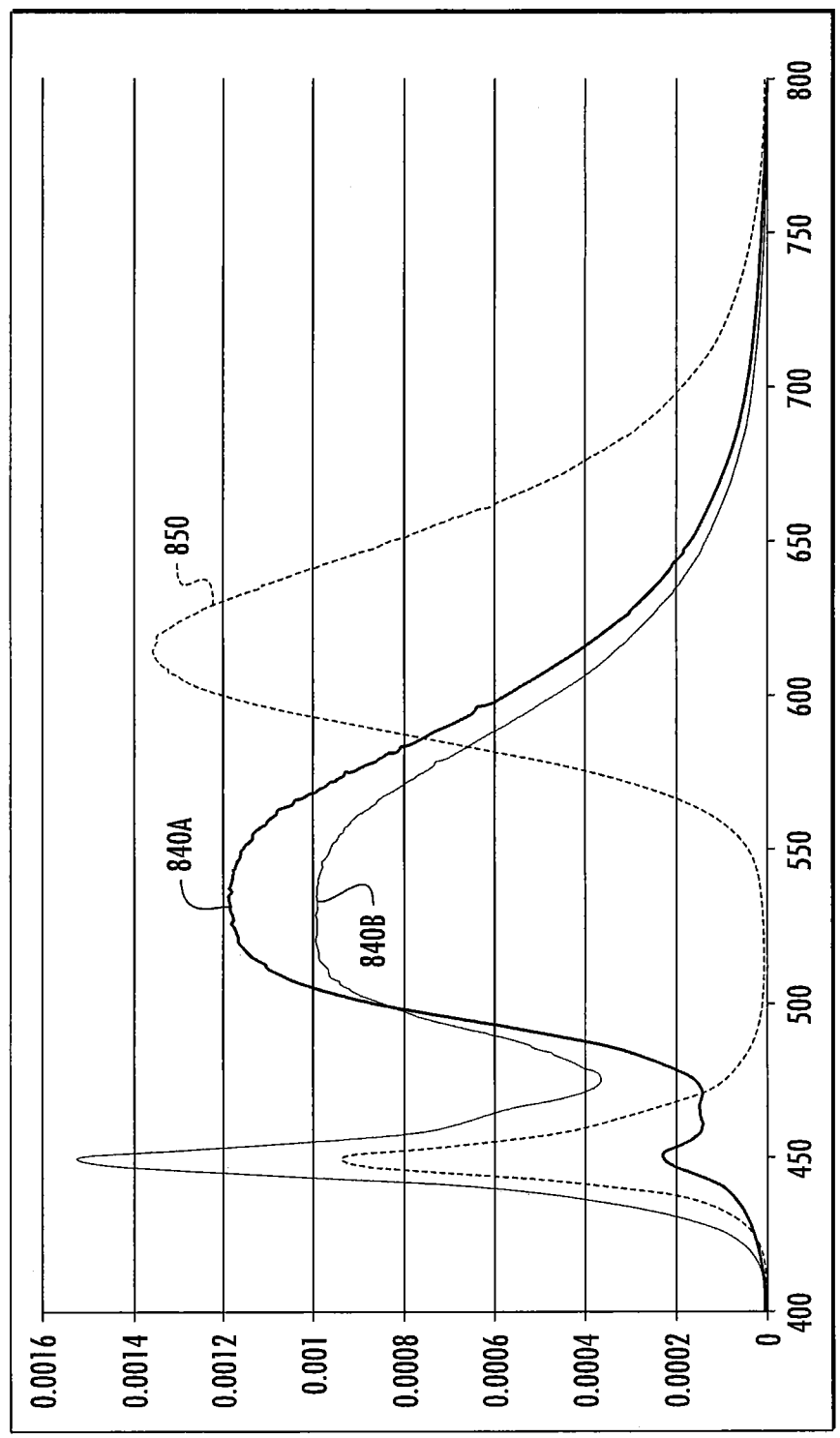
FIG. 18D is a graph illustrating the intensity of the radiation emitted as a function of wavelength for each of the different types of LED packages included in the tunable troffer light fixture of FIG. 18A.
Figure 18E:
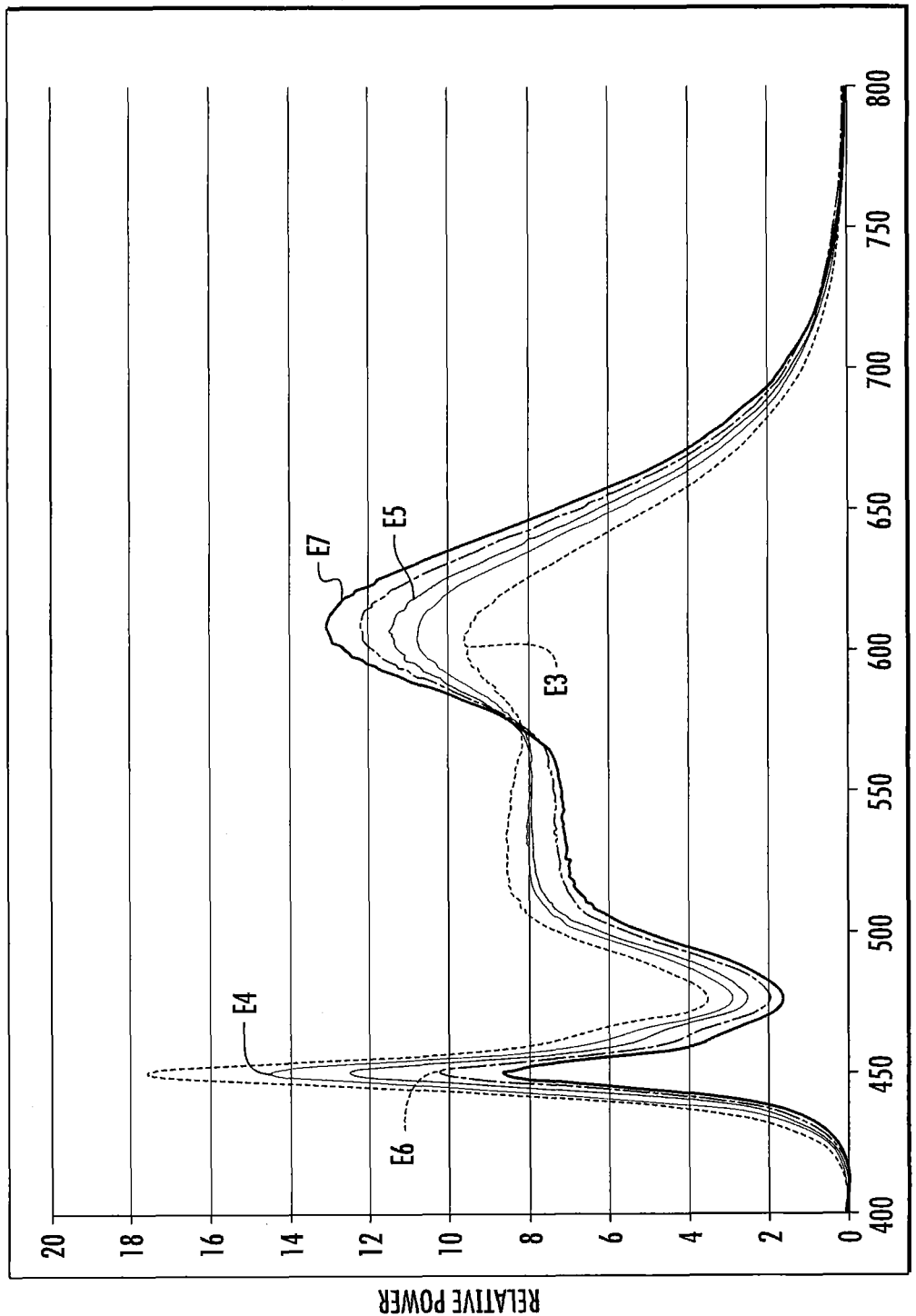
FIG. 18E is a graph illustrating the intensity of the radiation emitted as a function of wavelength for the tunable troffer light fixture of FIG. 18A when operated to fall within the E3 through E7 regions of FIG. 18C by controlling the relative drive currents to the LED packages.
Figure 18F:
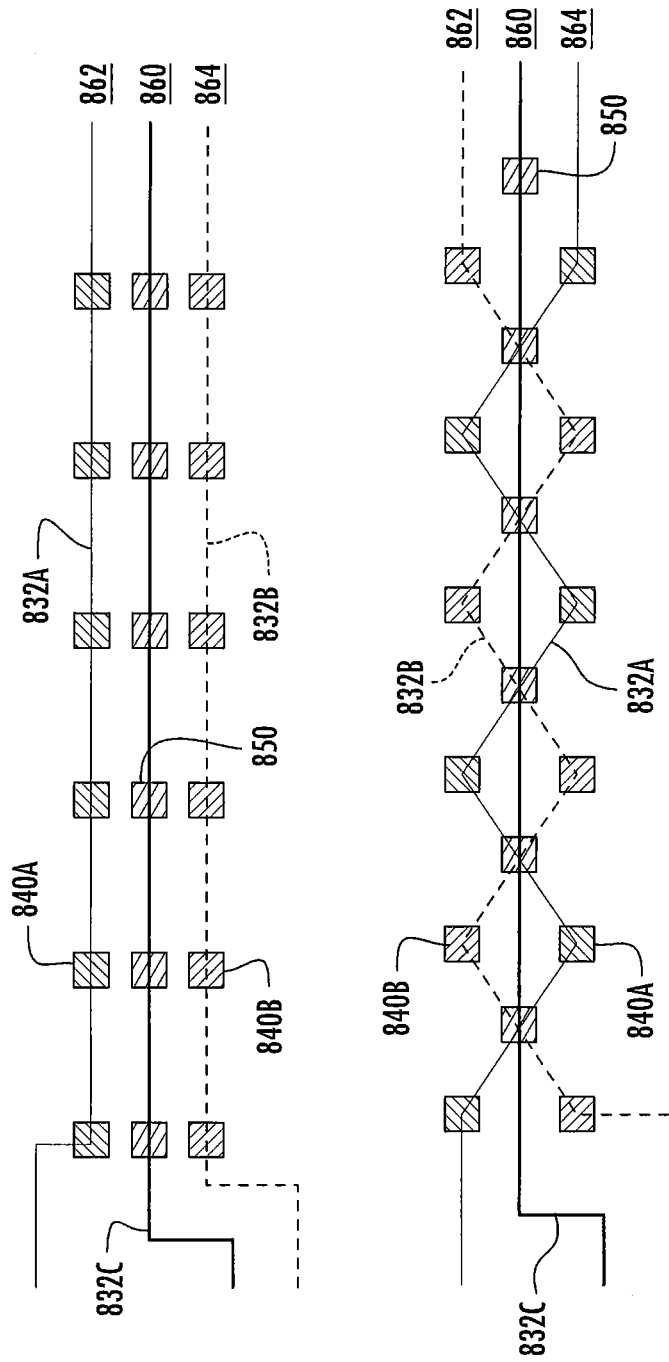
FIG. 18F illustrates two connection schemes for each of the different types of LED packages included in the tunable troffer light fixture of FIG. 18A.

In particular, FIG. 18A is a perspective view of a tunable troffer light fixture 800 according to further embodiments of the present invention. FIG. 18B is an enlarged view of a portion of a printed circuit board of the tunable troffer light fixture 800 that acts as the LED package mounting structure. FIG. 18C is an enlarged portion of the 1931 CIE Chromaticity Diagram that illustrates a range of color points that may be achieved using the tunable troffer light fixture 800, including color points within the E3-E7 color bins. FIG. 18D is a graph illustrating the intensity of the radiation emitted as a function of wavelength for each of the different types of LED packages included in the tunable troffer light fixture 800. FIG. 18E is a graph illustrating the intensity of the radiation emitted as a function of wavelength for the tunable troffer light fixture 800 when operated to fall within each of the E3 through E7 regions of FIG. 18C. FIG. 18F illustrates two example connection schemes for the different types of LED packages included in the tunable troffer light fixture 800.

Referring to FIGS. 18A-18B, the troffer light fixture 800 includes a backplate 810 and an LED package mounting structure 830 which is in the form of a printed circuit board. The troffer light fixture 800 may further include a dome (not shown) such as the dome 720 of troffer light fixture 700. The printed circuit board 830 may be mounted on the backplate 810 behind the diffuser. A plurality of blue-shifted-yellow/green LED packages 840 and a plurality of blue-shifted-red LED packages 850 are mounted in three rows on the printed circuit board 830. The blue-shifted-yellow/green LED packages 840 may be any of the blue-shifted-yellow/green LED packages according to embodiments of the present invention disclosed herein, and the blue-shifted-red LED packages 850 may be any of the blue-shifted-red LED packages according to embodiments of the present invention disclosed herein.

As shown in FIG. 18B, the blue-shifted-yellow/green LED packages 840 and the blue-shifted red LED packages 850 may be arranged in three generally parallel, spaced-apart rows 860, 862, 864. The blue-shifted-yellow/green LED packages 840 may be in the two outside rows 862, 864, and the blue-shifted-red LED packages 850 may be in the middle row 860 that is between the two outside rows 862, 864. In some embodiments, the LED packages 840 in the second row 862 may comprise blue-shifted-yellow/green LED packages 840A and the LED packages 840 in the third row 864 may comprise blue-shifted-yellow/green LED packages 840B, where the blue-shifted-yellow/green LED packages 840A are designed to emit different color light than the blue-shifted-yellow/green LED packages 840B, as will be explained in greater detail below.

In one example embodiment, the troffer light fixture 800 includes 180 LED packages (i.e., 60 LED packages per row). The LED packages 840A, 840B, 850 may be electrically connected in a plurality of LED strings. In an example embodiment, each of the three rows 860, 862, 864 may include five strings of twelve adjacent LED packages each, with the LED packages in each string electrically connected, for example, in series. In this embodiment, five strings of LED packages 840A, five strings of LED packages 840B, and five strings of LED packages 850 are included in the light fixture 800.

In some embodiments, the LED packages 840A in the second row 862 may include the same phosphor as the LED packages 840B in the third row 864, but may have a different amount of phosphor. In particular, the LED packages 840A may have a higher amount of phosphor than the LED packages 840B. As a result, the LED packages 840A and 840B will emit light having different color points. The color point of the light emitted by the troffer light fixture 800 may be changed by varying the currents provided to the respective different types of LED packages 840A, 840B, 850. In some embodiments, the phosphor included in the LED packages 840A, 840B may be a LuAG:Ce phosphor. In other embodiments, the phosphor included in the LED packages 840A, 840B may be a YAG:Ce phosphor. In still other embodiments, the phosphor included in the LED packages 840A, 840B may be a combination of YAG:Ce phosphor and a LuAG:Ce phosphor. Other phosphors may also be used. In some embodiments, each LED package 840A may include a single type of phosphor (e.g., a LuAG:Ce phosphor), and the LED packages 840A may have at least two times more of this phosphor than the LED packages 840B. In other embodiments, each LED package 840A may include a single type of phosphor (e.g., a LuAG:Ce phosphor), and the LED packages 840A may have at least three times more of this phosphor than the LED packages 840B. In still other embodiments, each LED package 840A may include a single type of phosphor (e.g., a LuAG:Ce phosphor), and the LED packages 840A may have at least four, five, six or even seven times more of this phosphor than the LED packages 840B. The LED packages 840A may be referred to herein as "high phosphor LED packages as they may include a greater amount of phosphor than the "low phosphor LED packages 840B.

The red phosphor included in the blue-shifted-red LED packages 850 may be a $(Ca_{1-x}Sr_x)SiAlN_3:Eu^{2+}$ phosphor in some embodiments. The ratio of the amount of yellow/green phosphor (e.g., LuAG:Ce) included in the high phosphor blue-shifted-yellow/green LED packages 840A to the amount of red phosphor $(Ca_{1-x}Sr_x)SiAlN_3:Eu^{2+}$ phosphor) included in the blue-shifted-red LED packages 850 may be between about 2 and 7 in some embodiments (i.e., the amount of LuAG:Ce phosphor may exceed the amount of $((Ca_{1-x}Sr_x)SiAlN_3:Eu^{2+}$ phosphor by between a factor of 2 and a factor of 7). In other embodiments, this ratio may be between 3 and 6. In still other embodiments, this ratio may be between 3 and 5.

The ratio of the amount of yellow/green phosphor (e.g., LuAG:Ce) included in the low phosphor blue-shifted-yellow/green LED packages 840B to the amount of red phosphor $((Ca_{1-x}Sr_x)SiAlN_3:Eu^{2+}$ phosphor) included in the blue-shifted-red LED packages 850 may be between about 0.3 and 2 in some embodiments. In other embodiments, this ratio may be between 0.5 and 1.5. In still other embodiments, this ratio may be between 0.6 and 1.0.

Using the same type of phosphor in the LED packages 840A and 840B, but in different amounts, may be advantageous for several reasons. First, by using the same phosphor any change in the performance of the phosphor over time and/or with temperature will tend to be the same for the LED packages 840A and 840B. This may lessen the impact of such changes on the light output by the light fixture 800. Additionally, using the same type of phosphor may simplify the manufacturing process.

FIG. 18C is an enlarged portion of the 1931 CIE Chromaticity Diagram that illustrates a range of color points that may be achieved using the tunable troffer light fixture 800. As shown in FIG. 18C, in some embodiments, the color point 871 of the light emitted by the blue-shifted-red LED packages 850 may be selected to form a tie line 881 with the color point 872 of the blue-shifted-yellow/green LED packages 840A that runs through the E7 bin on the 1931 CIE Chromaticity Diagram. This may be seen graphically in FIG. 18C, where the tie line 881 that connects the color point 871 for the LED packages 850 to the color point 872 for the LED packages 840A runs through the E7 color bin. Likewise, the color point 873 of the light emitted by the blue-shifted-yellow/green LED packages 840B may be selected to form a tie line 885 with the color point 871 of the LED packages 850 that runs through the E3 bin on the 1931 CIE Chromaticity Diagram. Additional tie lines 882-884 are illustrated in FIG. 18C which extend from the color point 871 for the LED packages 850 to points on a line 886 that extends between color points 872 and 873. The tie lines 882-884 extend through the E4, E5 and E6 color bins on the 1931 CIE Chromaticity Diagram, respectively. Thus, it can be seen that by varying the relative levels of the currents supplied to the three rows of LED packages 860, 862, 864 the troffer light fixture 800 may be configured to emit light having a color point in any of the E3 through E7 color bins. In principle, any color point that is within the triangle formed by the three anchor points can be reached with a given combination of currents for the three strings of LED packages—although points on the black body locus are of principal interest for applications.

TABLE 6 illustrates measured performance data for the troffer light fixture 800 when configured to operate at respective color points in each of the E3-E7 color bins. In TABLE 6, references to LoP Y/G refer to the LED packages 840B that have the lower amount of phosphor, references to HiP Y/G refer to the LED packages 840A that have the higher amount of phosphor, and references to R refer to the LED packages 850. As shown in TABLE 6, the troffer light fixture 800 according to embodiments of the present invention exhibits high lumens/watt performance while providing excellent color rendering performance when operated in all five color bins E3-E7.

TABLE 6

| Color Point | LoP Y/G Current (mA) | HiP Y/G Current (mA) | R Current (mA) | LPW | CCT (K) | CRI | R9 |
|---|---|---|---|---|---|---|---|
| E3 | 85 | 0 | 43 | 172.4 | 4974 | 90.6 | 37.2 |
| E4 | 54 | 20 | 55 | 175.8 | 4111 | 92.4 | 42.5 |
| E5 | 34 | 34 | 61 | 175.8 | 3707 | 92.2 | 39.5 |
| E6 | 15 | 47 | 68 | 171.6 | 3329 | 92.4 | 37.6 |
| E7 | 0 | 58 | 75 | 166.0 | 3063 | 91.1 | 30.7 |

FIG. 18D is a graph illustrating the intensity of the radiation emitted as a function of wavelength for each of the different types of LED packages included in the tunable troffer light fixture 800. As shown in FIG. 18D, the LED packages 840A and 840B have similar emission spectra, as they use the same phosphor, but the lower phosphor LED packages 840B have a large amount of pass-through blue light and relatively less green/yellow emission, while the high phosphor LED packages 840A absorb most of the blue light resulting in only a small amount of blue emission and a larger green/yellow emission.

FIG. 18E is a graph illustrating the intensity of the radiation emitted as a function of wavelength for the tunable troffer light fixture 800 when operated to fall within each of the E3 through E7 regions or "color bins" of FIG. 18C. As can be seen in FIG. 18E, the general shape of each emission spectrum is similar, but the relative intensities of each peak vary. In particular, the emission spectra for the higher color temperature samples (e.g., E3, E4) have higher emission intensities in the blue color range and lower emission intensities in the green, yellow and red color ranges. Conversely, the emission spectra for the lower color temperature samples (e.g., E7, E6) have lower emission intensities in the blue color range and higher emission intensities in the green, yellow and red color ranges.

Referring again to FIG. 18B, in some embodiments, the first through third rows 860, 862, 864 of LED packages may comprise a first middle row 860 of LED packages 850, a second outside row 862 of LED packages 840A, and a third outside row 864 of LED packages 840B. The first row 860 of LED packages 850 is between the second and third rows 862, 864. The three rows 860, 862, 864 may be spaced apart and generally parallel to each other. The LED packages 840A, 840B, 850 may also be aligned in columns of three LED packages each as shown, although they need not be in some embodiments. As shown in TABLE 6 above, in order to operate the tunable troffer light fixture 800 in the E3 color bin (CCT of about 5000 K), a relatively high current may be provided to the LED string(s) in the third row 864 (i.e., to the low phosphor LED packages 840B) while little or no current is supplied to the LED strings in the second row 862 (i.e., to the high phosphor LED packages 840A), and relatively less current is supplied to the LED packages 850 included in the first (middle) row 860. As is also shown in TABLE 6, in order to operate the tunable troffer light fixture 800 in the E7 color bin (CCT of about 3000 K), a relatively high current may be provided to the LED string(s) in the second row 862 (i.e., to the high phosphor LED packages 840A) while little or no current is supplied to the LED strings in the third row 864 (i.e., to the low phosphor LED packages 840B), and relatively more current is supplied to the LED packages 850 included in the first (middle) row 860. TABLE 6 likewise shows the relative currents supplied to the LED packages 840A, 840B, 850 in order to operate the light fixture 800 in the E4-E6 color bins.

FIG. 18F is a schematic diagram illustrating the layout arrangement and electrical connections for the LED packages 840A, 840B and 850 according to two example embodiments of the present invention. As shown in the top half of FIG. 18F, in the first example embodiment, the blue-shifted red LED packages 850 are all positioned in the first row 860, the high phosphor blue-shifted-yellow/green LED packages 840A are all positioned in the second row 862 which is on a first side of the first row 860, and the low phosphor blue-shifted-yellow/green LED packages 840B are all positioned in the third row 864 which is on a second side of the first row 860 that is opposite the first side. This layout is consistent with the layout shown in FIG. 18B. A total of sixty LED packages 840A, 840B or 850 are included in each row. These sixty LED packages are divided into five strings of twelve LED packages each, with the LED packages being electrically connected in series. Circuit traces 832 on the printed circuit board 830 may be used to make these series electrical connections. Each LED string may be connected to a power supply (not shown).

As is shown in the bottom half of FIG. 18F, in an alternative embodiment, the circuit board 830 (or other LED package mounting surface) may have circuit traces 832A, 832B, 832C (collectively 832) on at least two different levels which may allow electrically connecting LED packages 840A, 840B, 850 that are in different ones of the rows 860, 862, 864. In one example embodiment using this technique, the LED packages in rows 862 and 864 may each alternate between LED packages 840A and 840B. In the depicted embodiment, the LED packages 840A are electrically connected in series and the LED packages 840B are electrically connected in series. Accordingly, the circuit traces 832A connecting the LED packages 840A criss-cross with the circuit traces 832B connecting the LED packages 840B. As a result, both the circuit traces 832A and the circuit traces 832B cross the circuit traces 832C in many locations. In the depicted embodiment the LED packages 840A and 840B are aligned in columns (of two LED packages each) while the LED packages 850 are offset from the LED packages 840A and 840B in the column direction. It will be appreciated, however, that other arrangements are possible.

One potential advantage of the LED package layout shown in the bottom portion of FIG. 18F is that when the LED packages 840A are all aligned in the row 862 and the LED packages 840B are all aligned in the row 864, color separation may appear as the light fixture 800 is tuned to operate in the E3 or E7 color bins, as the contribution of either row 862 or 864 becomes low or non-existent under such operating conditions. For example, as shown in TABLE 6, when the troffer light fixture 800 is operated in the E7 color bin, the current supplied to the low phosphor blue-shifted-yellow/green LED packages 840B is approximately zero. As such, if the LED packages 840B are all aligned in a single row 864 on the second side of the row 860 of red LED packages 850, then the red LED packages 850 will effectively be located in an "outside" row when the light fixture 800 is operated under these conditions.

Unfortunately, the human eye may be very perceptive to the color red, and when the LED packages 800 are positioned in the arrangement shown in the top half of FIG. 18F, a human observer looking at the light fixture 800 may see a row of generally greenish light next to a row of generally reddish light when the light fixture 800 is operated in the E7 color bin, especially under dimming operation. This same effect may occur when the light fixture 800 is operated in the E3 color bin. By including both LED packages 840A and 840B in each of the two outside rows 862, 864 this tendency for color separation to appear when the light fixture 800 is operated at either end of its tunable operating range may be reduced or eliminated, as at least half of the LED packages in both rows 862 and 864 will emit light under all of the operating conditions for the light fixture 800.

Figure 19A:
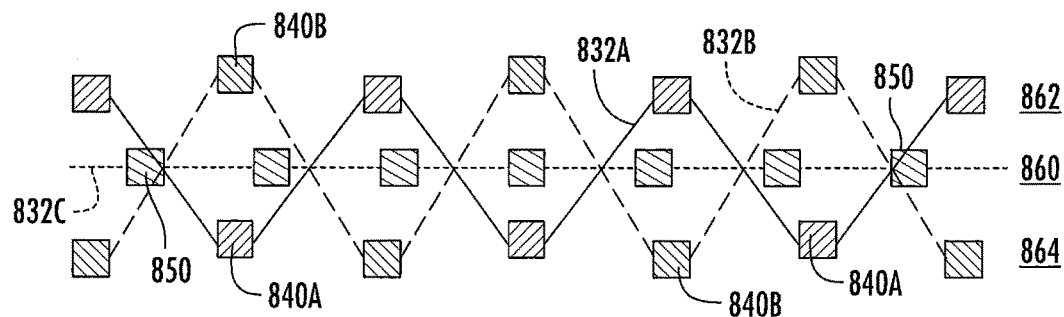
FIGS. 19A-19C are schematic diagrams illustrating layout arrangements and connection schemes for the different types of LED packages included in light fixtures according to further embodiments of the present invention.
Figure 19B:
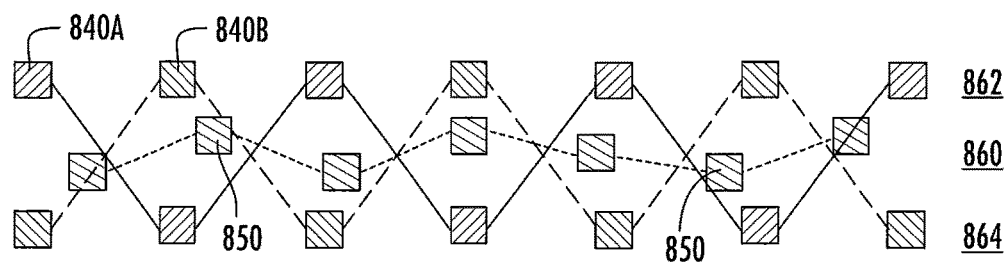
Figure 19C:
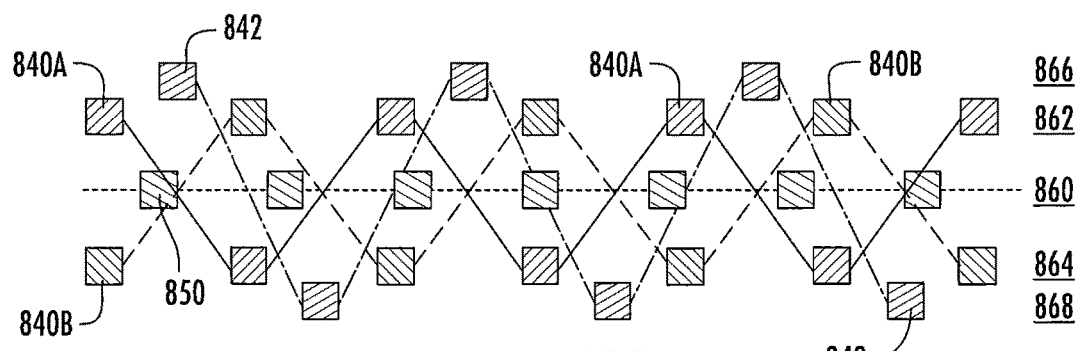

It will also be appreciated that the layout arrangements of the LED packages of FIG. 18F may be modified in various ways. For example, as shown in FIG. 19A, the blue-shifted-yellow/green LED packages 840A, 840B in the second and/or third rows 862, 864 need not be aligned in perfect rows. Likewise, as shown in FIG. 19B, the blue-shifted-red LED packages 850 in the first row 860 need not be aligned in a perfect row. As shown in FIG. 19C, in further embodiments more than three rows of LED packages may be provided. In the particular embodiment shown in FIG. 19C, five rows 860, 862, 864, 866, 868 of LED packages 840A, 840B, 842, 850 are provided, including three different types of blue-shifted-yellow/green LED packages 840A, 840B, 842 and blue-shifted-red LED packages 850. As will be discussed below, the use of more than two different types of blue-shifted-yellow/green LED packages may be beneficial in certain situations including, for example, applications where the light fixture is to be tunable across a broad range of correlated color temperatures. In other embodiments, more than one type of blue-shifted-red LED package 850 may be used. For example, the embodiments of FIG. 19A or 19B could be modified to include two central rows of blue-shifted-red LED packages 850 that are arranged in a criss-cross configuration (like the blue-shifted-yellow/green LED packages 840A, 840B in FIG. 19A) or could be modified so that the single row of blue-shifted-red LED packages 850 included two different types of blue-shifted-red LED packages 850.

Since the blue-shifted-yellow/green LED packages 840A, 840B may all be part of the second and third LED string and the blue-shifted-red LED packages 850 may all be part of the first LED string, the light fixture 800 to be configured to have increased red light contribution when the bulb is dimmed, which can be achieved by driving the blue-shifted-red LED packages 850 more heavily than the blue-shifted-yellow/green LED packages 840A, 840B when the light fixture 800 is dimmed. Such a dimming feature may be preferred as it mimics the dimming characteristics of a conventional incandescent light bulb which comparatively emits more red light when dimmed. Thus, the correlated color temperature of the light emitted from the light fixture may generally decrease with an increasing level of dimming. Thus, as the luminous flux of the light fixture decreases, the correlated color temperature may also generally decrease.

Additionally, pursuant to embodiments of the present invention the LED packages 840A, 840B, 850 may be arranged on the printed circuit board 830 or other LED package mounting surface so that the blue-shifted-yellow/green LED packages 840A, 840B generally surround the blue-shifted-red LED packages 850. This can be seen, for example, in the example designs of FIGS. 19A-19C. As noted above, if one or more of the blue-shifted-red LED packages 850 are mounted along the outer rows 862, 864, the color mixing may be insufficient to produce true white light, and hence an observer looking at the light fixture 800 may be able to see the locations of the blue-shifted-red LED packages 850. While this issue can be resolved by providing a diffusing mechanism such as a diffusing plate or dome, the use of such diffusing mechanisms reduces the luminous output of the light fixture and increases the cost thereof, both of which are undesirable. The inventors have discovered that by locating the blue-shifted-red LED packages 850 in one (or more) center rows 860 with rows 862, 864 of blue-shifted-yellow/green LED packages 840A, 840B on either side thereof, improved color mixing may be obtained.

Because of these color mixing issues, it may also be desirable to have the rows 862, 864 of blue-shifted-yellow/green LED packages 840A, 840B extend farther in each direction than the row 860 of blue-shifted-red LED packages 850. Examples of this configuration are once again shown in FIGS. 19A-19C. For example, in FIG. 19A the top row 862 of blue-shifted-yellow/green LED packages 840A, 840B extends farther to both the left and right than does the middle row 860 of blue-shifted-red LED packages 850. Similarly, the bottom row 864 of blue-shifted-yellow/green LED packages 840A, 840B also extends farther to both the left and right than does the middle row 860 of blue-shifted-red LED packages 850. This arrangement may provide improved color mixing. Since each row 860, 862, 864 may include the same number of LED packages (e.g., 60), the blue-shifted-red LED packages 850 in the middle row 860 may be spaced more closely together than the blue-shifted-yellow/green LED packages 840A, 840B that are included in the outside rows 862, 864 to allow the rows of blue-shifted-yellow/green LED packages 840A to extend farther in each direction than the row of blue-shifted-red LED packages 850.

Thus, pursuant to some embodiments of the present invention, troffer light fixtures may be provided that have a tunable color point. The troffer light fixture may include a plurality of blue-shifted-yellow/green LED packages. The blue-shifted-yellow/green LED packages may include both low-phosphor LED packages and high phosphor LED packages. The high phosphor LED packages have a higher phosphor conversion ratio than the low phosphor LED packages, meaning that the phosphor included in each high phosphor LED package will convert a higher percentage of the light emitted by the blue LED included therein to light of a different wavelength as compared to the low phosphor LED packages. A higher phosphor conversion ratio may be achieved, for example, by using two different phosphors that convert different amounts of light per unit weight of phosphor and/or by using different amounts of phosphor in the two different LED package types. For example, in embodiments in which the low-phosphor LED packages and the high phosphor LED packages include the same phosphor, the high phosphor LED packages will have a greater amount of the phosphor than the low phosphor LED packages. However, in other embodiments where the low-phosphor LED packages and the high phosphor LED packages use different types of yellow/green phosphors, this will not necessarily be the case.

The troffer light fixture may also include a plurality of blue-shifted-red LED packages. The blue-shifted-red LED packages may extend in a first row. A first subset of the blue-shifted-yellow/green LED packages may extend in a second row on a first side of the blue-shifted-red LED packages and a second subset of the blue-shifted-yellow/green LED packages may extend in a third row on a second side of the blue-shifted-red LED packages. The two rows of blue-shifted-yellow/green LED packages may be on opposed sides of the row of blue-shifted-red LED packages In some embodiments, the blue-shifted-yellow/green LED packages in the second row may include both low phosphor LED packages and high phosphor LED packages and/or the blue-shifted-yellow/green LED packages in the third row may include both low phosphor LED packages and high phosphor LED packages. The blue-shifted-red LED packages may be electrically connected in series to form a first LED string and the low phosphor LED packages may be electrically connected in series to form a second LED string. The second LED string may cross the first LED string. For example, in some embodiments, the second LED string may cross the first LED string at least twice. In other embodiments, the second LED string may cross the first LED string in at least four locations. The high phosphor LED packages may be electrically connected in series to form a third LED string. The third LED string may cross the first LED string. For example, in some embodiments, the third LED string may cross the first LED string two, four or even more times. The third LED string may also cross the first LED string two, four or even more times. In some embodiments, the second and third strings of blue-shifted-yellow/green LED packages may include X LED packages each, and the second string may cross the third string X-1 times. More than one first LED string, more than one second LED string and/or more than one third LED string may be included in the light fixture.

A first end of the second row may extend beyond a first end of the first row, and a second end of the second row may extend beyond a second end of the first row. Likewise, a first end of the third row may extend beyond the first end of the first row, and a second end of the third row may extend beyond the second end of the first row. In order to achieve this arrangement in embodiments that include the same number of low phosphor blue-shifted-yellow/green LED packages, high phosphor blue-shifted-yellow/green LED packages and blue-shifted-red LED packages, an average separation between adjacent ones of the blue-shifted-red LED packages in the first row may be less than an average separation between adjacent ones of the blue-shifted-yellow/green LED packages in the second row and less than an average separation between adjacent ones of the blue-shifted-yellow/green LED packages in the third row. This arrangement may ensure that the blue-shifted-red LED packages are surrounded by the blue-shifted-yellow/green LED packages, which may provide for better color mixing.

In some embodiments, the low phosphor blue-shifted-yellow/green LED packages and the high phosphor blue-shifted-yellow/green LED packages may each include a single phosphor, and may include the same phosphor. In some embodiments, this phosphor may be a LuAG:Ce phosphor. The low phosphor LED packages may each include a first amount of the phosphor and the high phosphor LED packages each include a second amount of the phosphor that is between, for example, two to seven times the first amount.

Pursuant to other embodiments, tunable light emitting diode (LED) based light fixtures are provided that include a plurality of blue-shifted-red LED packages and a plurality of blue-shifted-yellow/green LED packages. The blue-shifted-yellow/green LED packages include both low-phosphor LED packages that each include a first amount of a first phosphor and high phosphor LED packages that each include a second amount of the first phosphor. The first amount may be between twice and seven times the second amount in some embodiments.

The blue-shifted-red LED packages may extend in a first row and the blue-shifted-yellow/green LED packages may extend in both a second row and in a third row, with the second row positioned on a first side of the first row and the third row positioned on a second side of the first row that is opposite the first side. The second and third rows may be generally parallel to the first row. The second row may include both low phosphor LED packages and high phosphor LED packages, and the third row may likewise include both low phosphor LED packages and high phosphor LED packages.

The blue-shifted-red LED packages may be electrically connected in series to form a first LED string and the low phosphor LED packages may be electrically connected in series to form a second LED string, and the second LED string may cross the first LED string in at least four locations. The high phosphor LED packages may be electrically connected in series to form a third LED string. The first second and third LED strings may cross over other of the first through third LED strings multiple times (e.g., in at least two locations, in at least four locations, etc).

The second row may have respective endpoints that extend beyond respective endpoints of the first row, and the third row may likewise have respective endpoints that extend beyond respective endpoints of the first row. An average separation between adjacent ones of the blue-shifted-red LED packages in the first row may be less than an average separation between adjacent ones of the blue-shifted-yellow/green LED packages in the second row and/or less than an average separation between adjacent ones of the blue-shifted-yellow/green LED packages in the third row.

In some embodiments, the tunable troffer light fixture may be configured to operate in any of the E3-E7 color bins, while providing a CRI of at least 90 and a CRI R9 of at least 30 in each of the E3-E7 color bins. In some embodiments, the light fixture may exhibit at least 130 lumens per watt when operating under these conditions.

As shown in TABLE 6 above, in order to operate in the E3 color bin, the tunable troffer light fixture 800 reduces the current that is supplied to the high phosphor blue-shifted-yellow/green LED packages 840A to essentially zero, while in order to operate in the E7 color bin, the tunable troffer light fixture 800 reduces the current that is supplied to the low phosphor blue-shifted-yellow/green LED packages 840B to essentially zero. In some cases, it may be desirable or even necessary to not allow the current to any of the LED packages to reach such low levels. In order to maintain minimum current levels (e.g., 50 mA) on each string of LED packages, the locations of the color points for the three (or more) different types of LED packages 840A, 840B, 850 may be set farther apart, as will be explained in greater detail with reference to FIGS. 20A-20D.

Figure 20A:
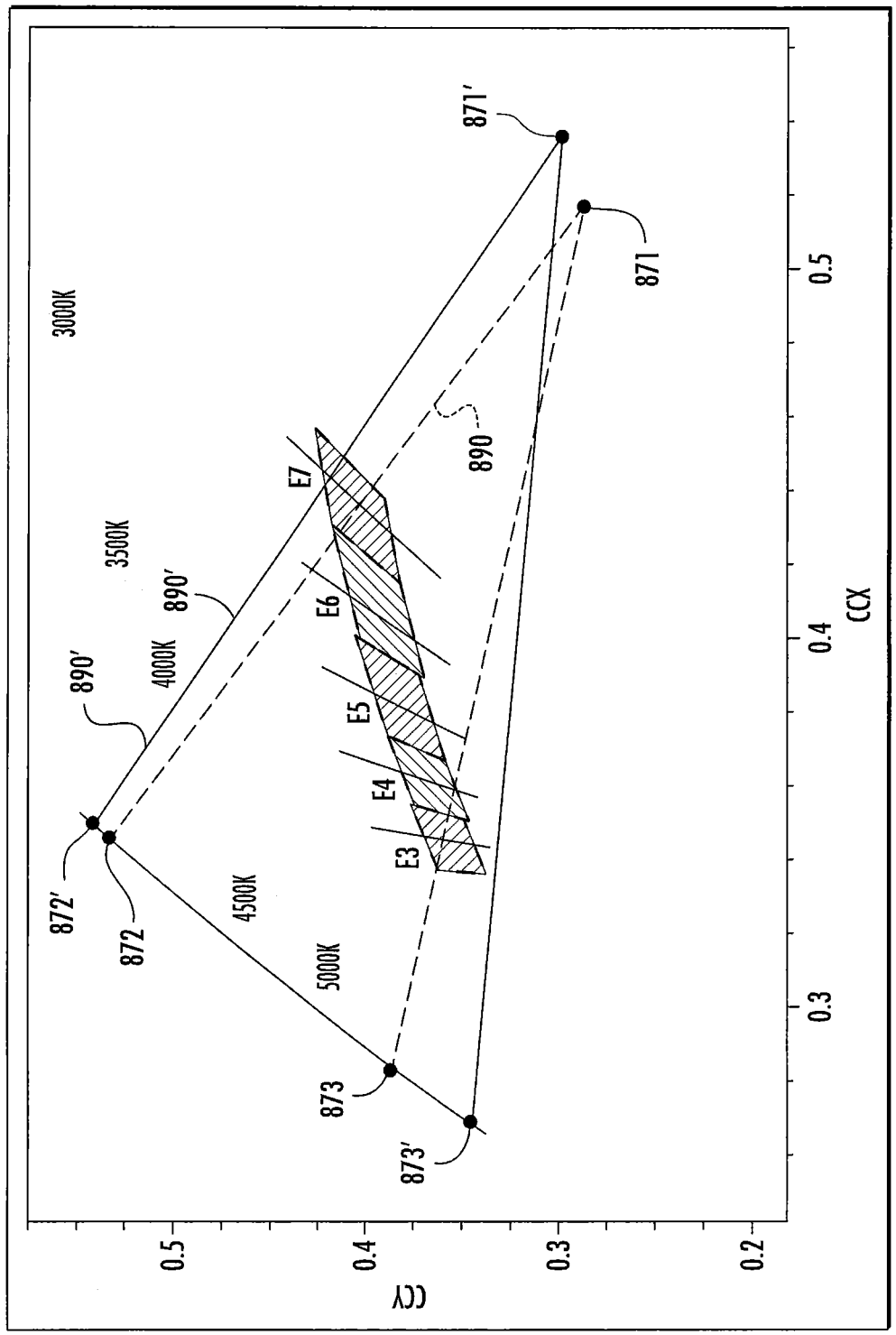
FIG. 20A is an enlarged portion of the 1931 CIE Chromaticity Diagram illustrating a range of color points that may be achieved using a modified version of the tunable troffer light fixture of FIG. 18A that has an extended tuning range.
Figure 20B:
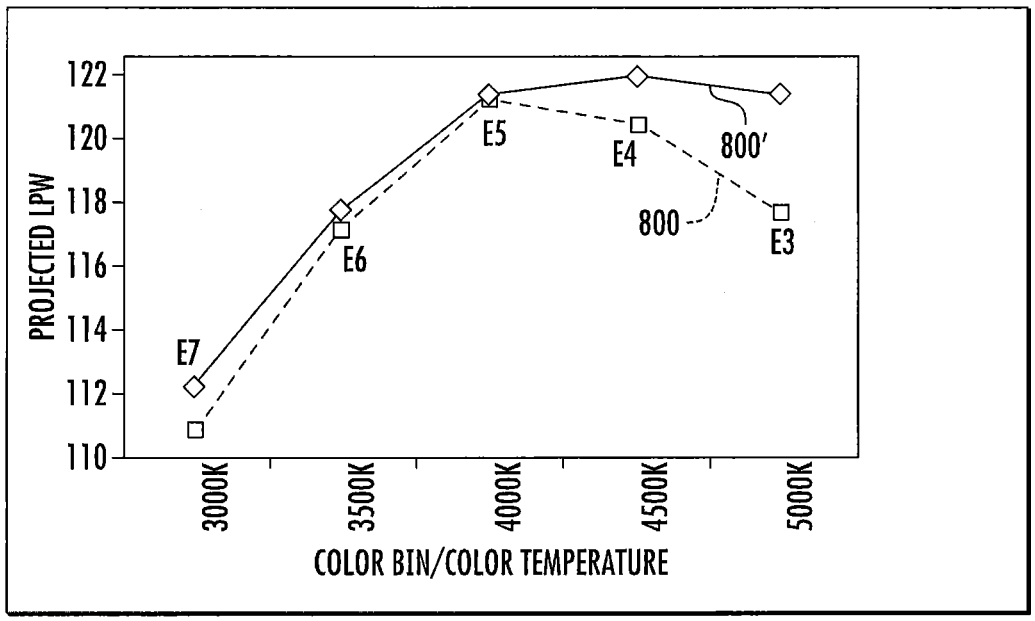
FIGS. 20B and 20C are graphs comparing the lumen per watt and CRI performance of the tunable troffer light fixture of FIG. 18A and the modified version thereof that has the extended tuning range illustrated in FIG. 20A.
Figure 20C:
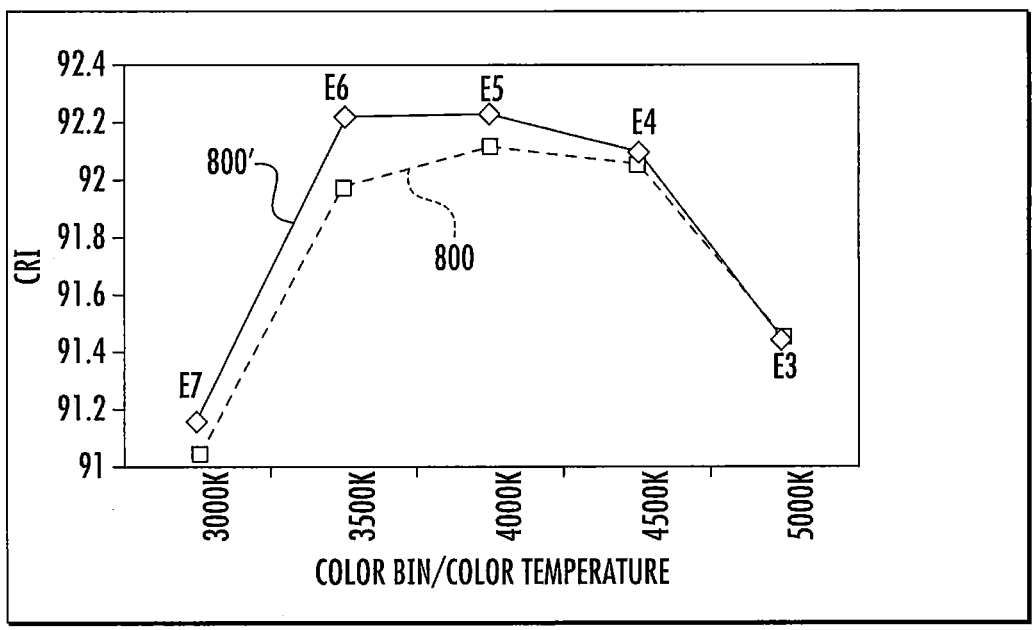
Figure 20D:
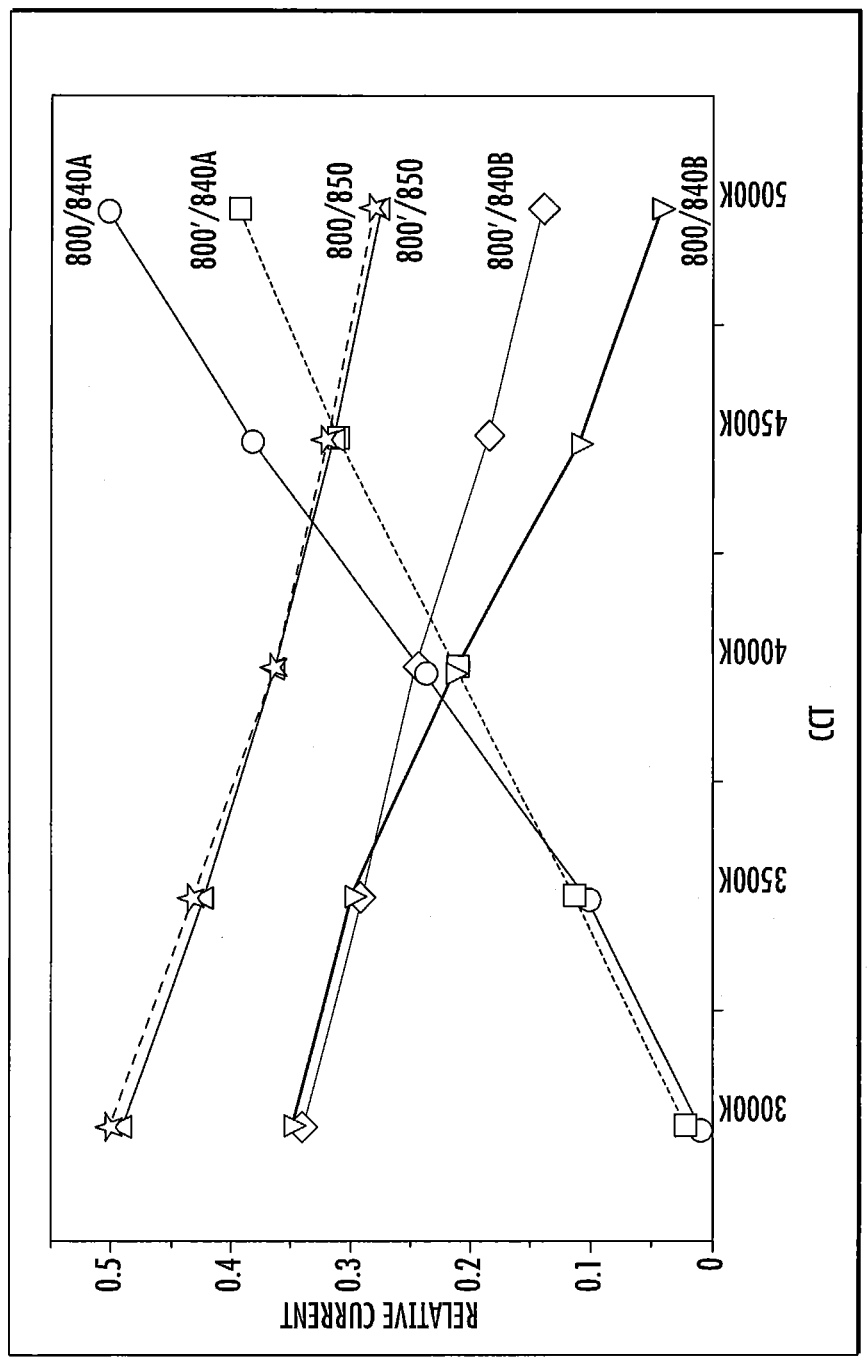
FIG. 20D is a graph illustrating the change in current for various LED strings of the tunable troffer light fixtures of FIG. 18A and FIG. 20A when the light fixtures are driven to operate in each of the five color point regions illustrated in FIG. 18C.

In particular, FIG. 20A is an enlarged portion of the 1931 CIE Chromaticity Diagram illustrating a range of color points that may be achieved using a modified version 800' of the tunable troffer light fixture 800 of FIG. 18A that has an extended tuning range. FIGS. 20B and 20C are graphs comparing the lumen per watt and CRI performance of the tunable troffer light fixture 800 of FIG. 18A and the modified version 800' thereof that has the extended tuning range. FIG. 20D is a graph illustrating the change in current for various LED strings of the tunable troffer light fixtures 800, 800' when driven to operate in each of the five color point regions E3-E7 shown in FIG. 18C.

In order to fabricate the tunable troffer light fixture 800', the blue-shifted-yellow/green LED packages 840A of light fixture 800 may be replaced with blue-shifted-yellow/green LED packages 840A' that have increased phosphor content, and the blue-shifted-yellow/green LED packages 840B of light fixture 800 may be replaced with blue-shifted-yellow/green LED packages 840B' that have reduced phosphor content. For example, in the light fixture 800 of FIGS. 18A-18B, the blue-shifted-yellow/green LED packages 840A, 840B each used a LuAG:Ce phosphor (and not other phosphors), with the LED packages 840A having about 3.6 times the amount of LuAG:Ce phosphor included in the LED packages 840B. In the light fixture 800', this ratio was increased to about 4.4. The blue-shifted-red LED packages 850 of light fixture 800 were replaced with blue-shifted-red LED packages 850' that included about 15% more red phosphor in light fixture 800'.

The effect of these changes may be seen in FIG. 20A. In particular, the points labeled 871, 872, 873 represent the color points for the three different types of LED packages included in the light fixture 800. By adjusting the relative currents provided to the three types of LED packages, the light fixture 800 may emit light having a color point anywhere within the dashed-line triangle 890.

The points in FIG. 20A labeled 871', 872', 873' represent the color points for the three different types of LED packages 840A', 840B', 850' included in the modified light fixture 800'. By adjusting the relative currents provided to the three types of LED packages 840A', 840B', 850', the modified light fixture 800' may emit light having a color point anywhere within the solid-line triangle 890'. As can be seen in FIG. 20A, by further increasing the amount of phosphor included in the high phosphor blue-shifted-yellow/green LED packages 840A' while decreasing the amount of phosphor included in the low-phosphor blue-shifted-yellow/green LED packages 840B', the light fixture 800' is able to operate at a larger number of color points, and may operate in any of the E3-E7 color bins with non-zero drive currents for the blue-shifted-yellow/green LED packages 840A', 840B'.

FIGS. 20B and 20C compare the projected lumens per watt and CRI performance of the light fixtures 800 and 800'. As shown in these figures, the modified light fixture 800' is projected to have essentially equal or even better performance when operating in all five color bins E3-E7.

FIG. 20D is a graph illustrating the change in current for various LED strings of the tunable troffer light fixtures 800, 800' when the light fixtures are driven to operate in each of the E3-E7 color bins. As shown in FIG. 20D, when the light fixtures 800 and 800' are operated in the E5-E7 color bins (CCT values of 3000 K, 3500 K and 4000 K) the currents on each of the three strings are similar between the two devices. However, when operating in color bins E3 and E4 (CCT values of 4500 K and 5000 K), the drive currents for the two strings of blue-shifted-yellow/green LED packages 840A', 840B' in the modified light fixture 800' become closer together. Since under these conditions more LED packages are contributing to the light output, the lumens per watt performance increases for the light fixture 800' as compared to the light fixture 800, which can be seen in the graph of FIG. 20B.

Figure 21A:
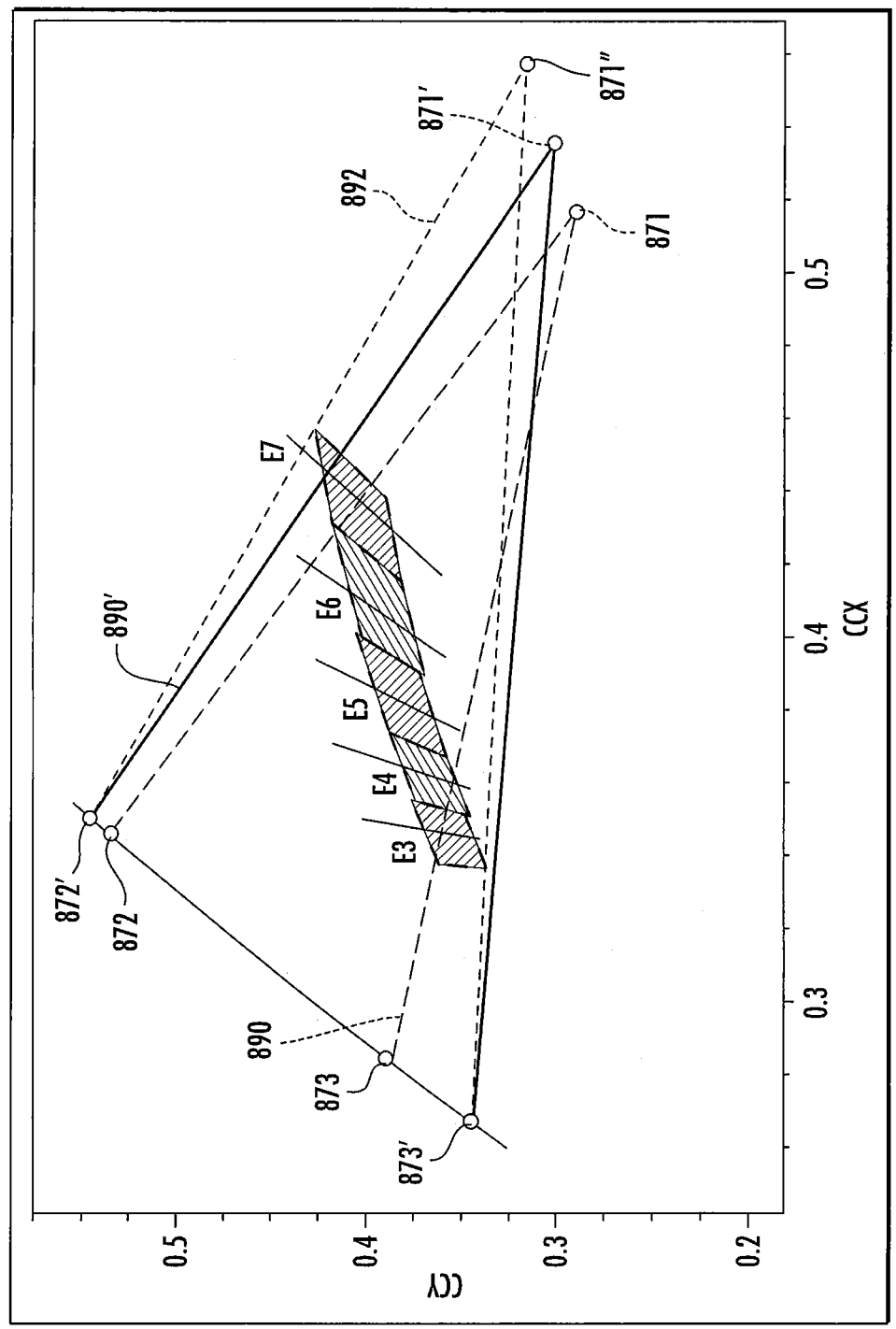
FIG. 21A is an enlarged portion of the 1931 CIE Chromaticity Diagram illustrating a range of color points that may be achieved using a further modified version of the tunable troffer light fixture of FIG. 18A that has a different extended tuning range.

FIG. 21A is an enlarged portion of the 1931 CIE Chromaticity Diagram illustrating a range of color points that may be achieved using a further modified version of the tunable troffer light fixture of FIG. 18A that has a different extended tuning range. In FIG. 21A, the color point for the blue-shifted-red LED packages is moved farther to the right to color point 871", while the color points 872', 873' for the two blue-shifted-yellow/green LED packages 840A', 840B' are unchanged. Consequently, a light fixture having the tuning range shown in FIG. 21A may be formed using the LED packages 840A', 840B' discussed above along with blue-shifted-red LED packages 850" that have a larger amount of red phosphor as compared to the blue-shifted-red LED packages 850' discussed above. As shown in FIG. 21A, the further modified version of the tunable troffer light fixture of FIG. 18A may be used to emit light anywhere in the triangle labeled 892. The triangle 892 is larger than the triangles 890, 890', and also covers all of the E3-E7 color bins with non-zero drive currents for the blue-shifted-yellow/green LED packages 840A', 840B'.

Figure 21B:
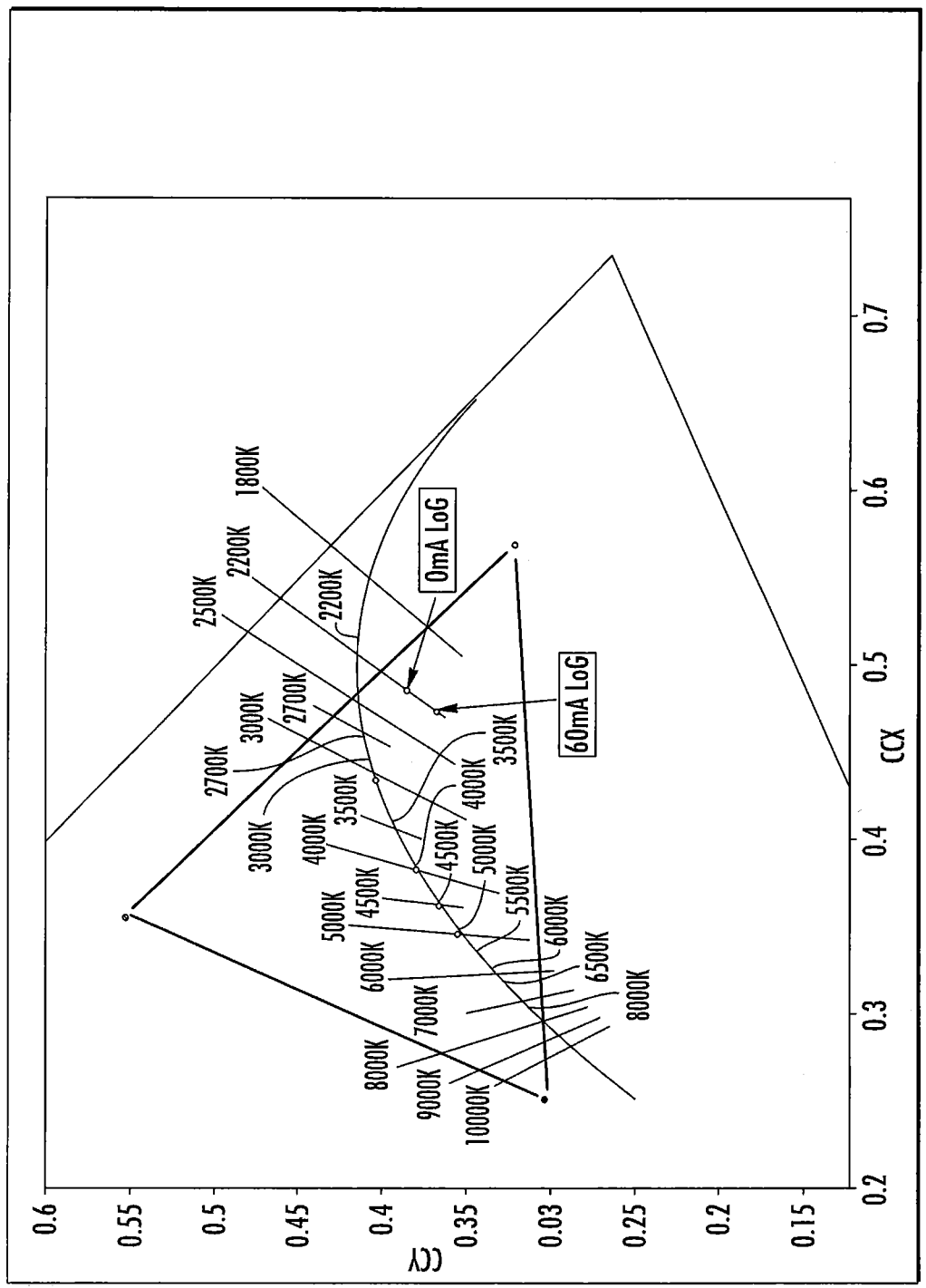
FIG. 21B is an enlarged portion of the 1931 CIE Chromaticity Diagram illustrating how the techniques according to embodiments of the present invention may be used to provide a light fixture that is tunable over a wider range of color temperatures.

FIG. 21B is an enlarged portion of the 1931 CIE Chromaticity Diagram illustrating how the light fixture 800 is tunable over a wider range of color temperatures. As shown in FIG. 21B, by essentially turning off the low phosphor blue-shifted-yellow/green LED packages 840B and increasing the current to the high phosphor blue-shifted-yellow/green LED packages 840A and to the blue-shifted-red LED packages 850, the light fixture 800 may be tuned to emit light having a color temperature of 2200 K, although the color point of this light is offset from the black body locus. If the current to the low phosphor blue-shifted-yellow/green LED packages 840B is set at a low level (60 mA) the light fixture 800 may still be tuned to emit light having a color temperature of 2200 K, although the color point of this light is even farther from the black body locus, as shown in FIG. 21B. Moreover, when the blue-shifted-yellow/green LED packages having higher phosphor loadings are used, it is possible to generate light at 2200K that is on the black body locus.

The light fixtures according to the other embodiments of the present invention may similarly be tuned to such lower color temperatures, and these light fixtures may also be tuned to higher color temperatures (e.g., 6500 K) while still remaining on or very near the black body locus.

FIG. 22A is a plan view of a light fixture 900 that is designed to be tunable over the range shown by triangle 892 in FIG. 21. The light fixture 900 includes a printed circuit board 930 having three different types of LED packages mounted thereon. The LED packages comprise the above-described high phosphor blue-shifted-yellow/green LED packages 840A', the low phosphor blue-shifted-yellow/green LED packages 840B', and the blue-shifted-red LED packages 850".

The light fixture 900 differs from the light fixtures 800 and 800' in that the light fixture 900 includes a larger number of blue-shifted-red LED packages 850' and a smaller number of blue-shifted-yellow/green LED packages 840A', 840B'. In particular, the light fixture 900 includes fifty high phosphor blue-shifted-yellow/green LED packages 840A', fifty low phosphor blue-shifted-yellow/green LED packages 840B' and one hundred blue-shifted-red LED packages 850". As a result, the blue-shifted-red LED packages 850" in the middle row are spaced closely together while the blue-shifted-yellow/green LED packages 840A', 840B' in each row on either side of the middle row are spaced farther apart. The use of more blue-shifted-red LED packages 850" and less blue-shifted-yellow/green LED packages 840A', 840B' increases the efficiency (and hence the lumens per watt performance) of the light fixture 900 when operated at lower color temperatures.

Thus, pursuant to further embodiments of the present invention, the number of blue-shifted-red LED packages may be at least half the number of blue-shifted-yellow/green LED packages. In other embodiments, the number of blue-shifted-red LED packages may be at least 75% the number of blue-shifted-yellow/green LED packages. In still further embodiment, the number of blue-shifted-red LED packages may be at least equal to the number of blue-shifted-yellow/green LED packages.

Figure 22B:
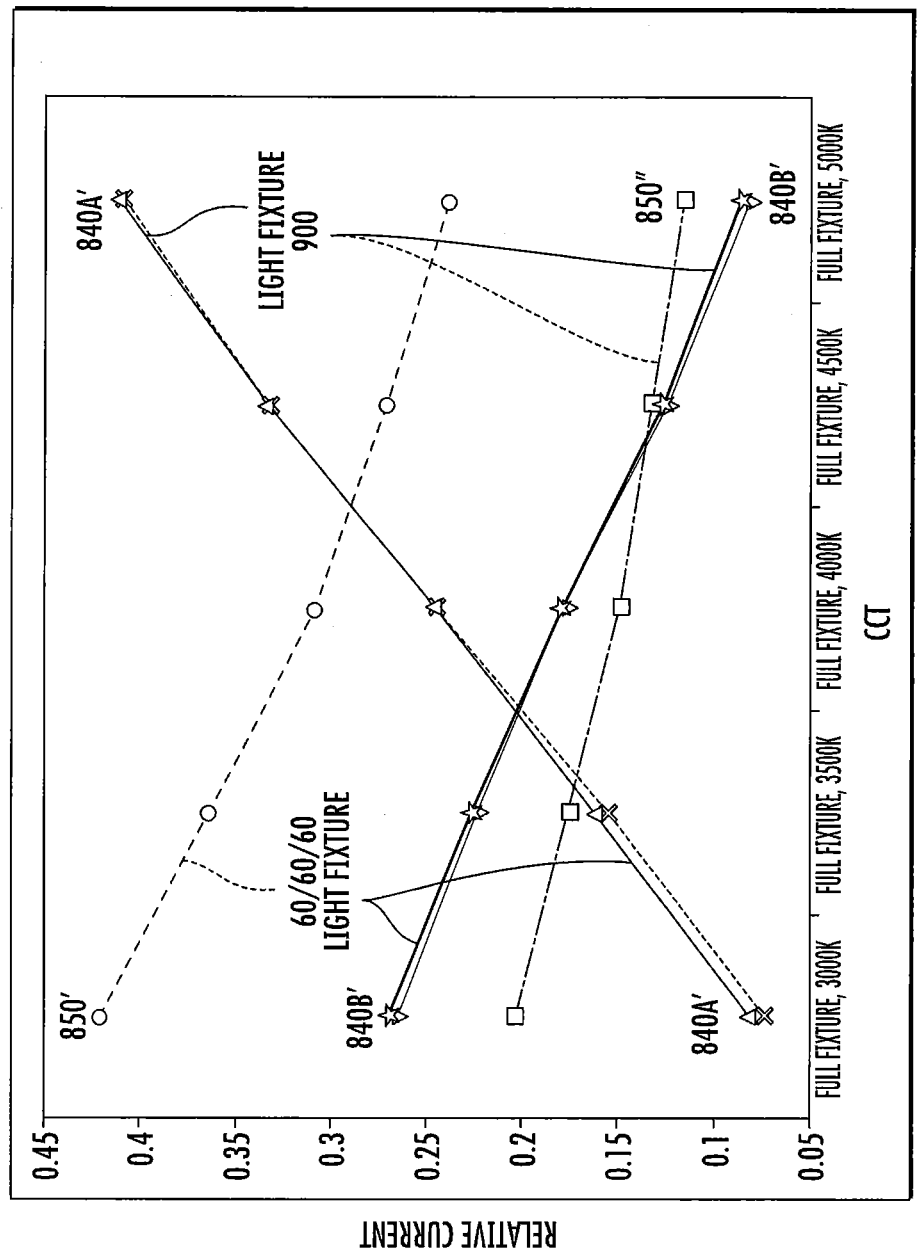
FIG. 22B is a graph illustrating the intensity of the radiation emitted as a function of wavelength for the tunable troffer light fixture of FIG. 22A when operated to fall within the E3 through E7 color bins along with comparative data for a different light fixture design.

FIG. 22B is a graph illustrating the intensity of the radiation emitted as a function of wavelength for the tunable troffer light fixture 900 when operated to fall within each of the E3 through E7 regions or color bins as compared to another tunable troffer light fixture that includes sixty high phosphor blue-shifted-yellow/green LED packages, sixty low phosphor blue-shifted-yellow/green LED packages and sixty blue-shifted-red LED packages that are arranged in the manner shown in the bottom portion of FIG. 18F. As can be seen in FIG. 22B, the use of the relatively higher number of blue-shifted-red LED packages 850" in the light fixture 900 results in a large reduction in the drive current supplied to the blue-shifted-red LED packages 850", with almost no change to the drive current supplied to the blue-shifted-yellow/green LED packages 840A', 840B'. This decrease in the drive current to the blue-shifted-red LED packages 850" results in increased efficiency. When the light fixture 900 is operated at low color temperatures (e.g., in the E7 color bin), this may result in improved lumens per watt performance of more than 3%.

FIG. 23 illustrates a modified printed circuit board design 930' that may be used in the light fixture 900 in place of printed circuit board 930. As shown in FIG. 23, the printed circuit boards 930, 930' are similar, but in printed circuit board 930' the blue-shifted-yellow/green LED packages 840A', 840B' are staggered in the column direction. Since the LED packages are designed so that all of the blue-shifted-yellow/green LED packages 840A', 840B' are on during operation in all of color bins E3-E7, the printed circuit board 930' may exhibit improved color mixing as compared to the printed circuit board 930.

Figure 24:
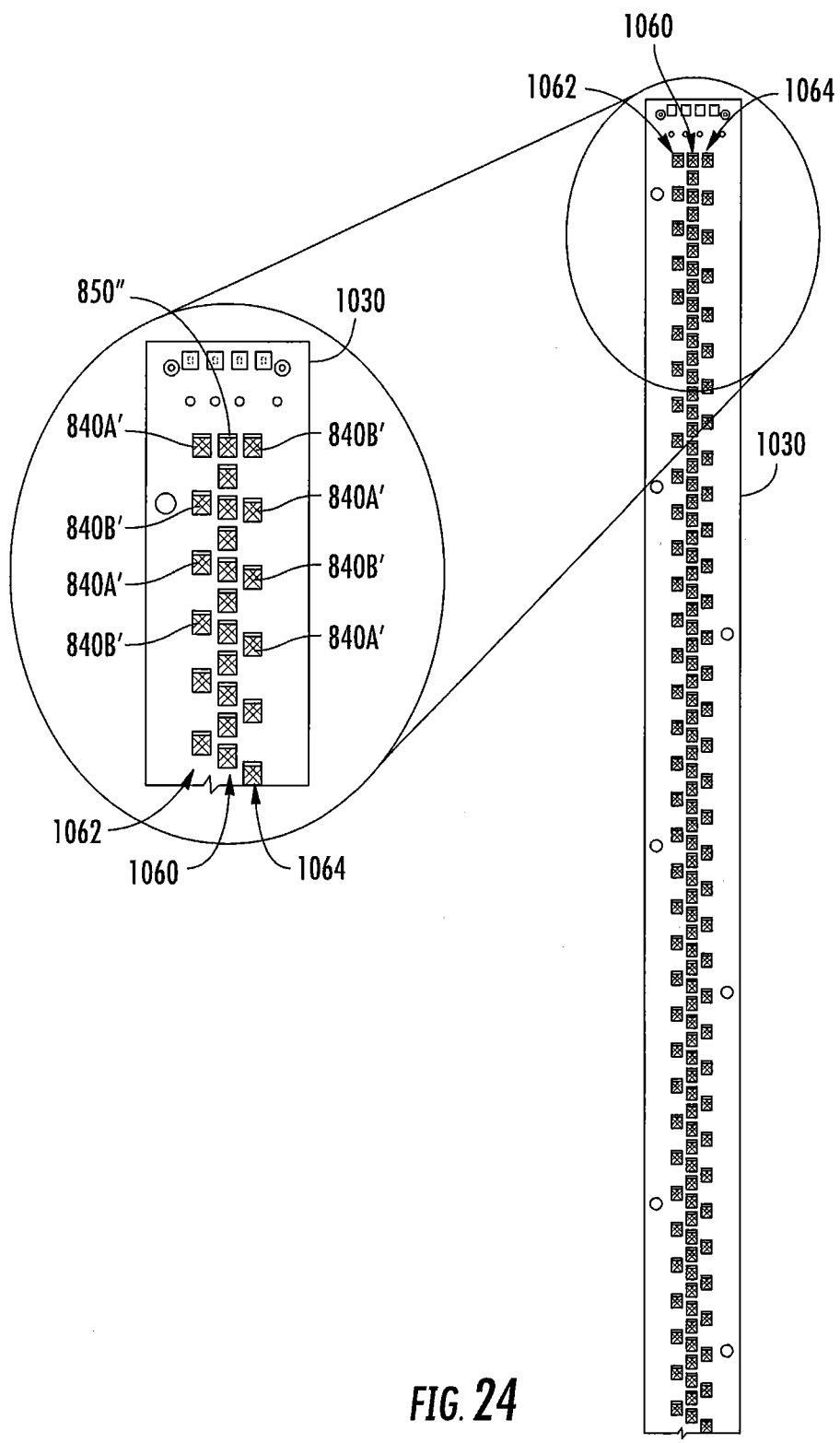
FIG. 24 is a plan view of a printed circuit board according to further embodiments of the present invention.

FIG. 24 illustrates a printed circuit board design 1030 for a light fixture according to further embodiments of the present invention. The printed circuit board 1030 may be used, for example, in the light fixture 900 in place of printed circuit board 930. The light fixture may be, for example, a 2'×2' troffer light fixture. The printed circuit board 1030 may provide even further improved color mixing through the arrangement of the LED packages.

As shown in FIG. 24, the printed circuit board 930 includes fifty blue-shifted-yellow/green LED packages 840A', fifty blue-shifted-yellow/green LED packages 840B' and one hundred blue-shifted-red LED packages 850" that are arranged in three rows 1060, 1062, 1064. The blue-shifted-yellow/green LED packages 840A', 850B' are arranged in strings of ten LEDs each so that there are five strings of blue-shifted-yellow/green LED packages 840A', five strings of blue-shifted-yellow/green LED packages 840B' and ten strings of blue-shifted-red LED packages 850". The blue-shifted-yellow/green LED packages 840A' and the blue-shifted-yellow/green LED packages 840B' are arranged in a criss-cross pattern like the pattern shown in the bottom portion of FIG. 18F. The blue-shifted-yellow/green LED packages 840A', 840B' are in the outside rows 1062, 1064 while the blue-shifted-red LED packages 850" are in the interior row 1060.

In the embodiment of FIG. 24, the spacing between the blue-shifted-yellow/green LED packages 840A', 840B' in the two rows 1062, 1064 of blue-shifted-yellow/green LED packages 840A', 840B' is not uniform. In particular, the distance between adjacent blue-shifted-yellow/green LED packages 840A', 840B' changes in the last ten blue-shifted-yellow/green LED packages 840A', 840B' in each row 1062, 1064. In particular, the six strings of blue-shifted-yellow/green LED packages 840A', 840B' that form the middle portions of rows 1062, 1064 may have space the blue-shifted-yellow/green LED packages 840A', 840B' a uniform distance apart while the four strings of blue-shifted-yellow/green LED packages 840A', 840B' that are one the ends of the two rows 1062, 1064 may have space the blue-shifted-yellow/green LED packages 840A', 840B' may space the LED packages apart in a non-uniform manner. This arrangement may allow the three LED packages 840A', 840B', 850" that are the last LED packages on each of the three rows 1060, 1062, 1064 to be aligned in the column direction, as shown in the enlarged call-out of FIG. 24.

The LED package layout of FIG. 24 may be advantageous because when a light fixture that includes the printed circuit board 1030 is operated at or near either end of its tunable range (e.g., at a color temperature of about 3000 K or a color temperature of about 5000 K for an embodiment that is tunable over the E3-E7 color bins) one of the blue-shifted-yellow/green LED packages 840A' or the blue-shifted-yellow/green LED packages 840B' will be driven by a relatively high current while the other of the blue-shifted-yellow/green LED packages 840A' or the blue-shifted-yellow/green LED packages 840B' will be driven at a very low current. By aligning the three LED packages 840A', 840B', 850" that are on each end of the three rows 1060, 1062, 1064 in the column direction, the mixing of the emitted light may be enhanced. In particular, the arrangement of the LED packages 840A', 840B', 850" on the printed circuit board 1030 may reduce or eliminate the appearance of a red splotch of light and/or a yellow or green splotch of light that may otherwise appear at the end of the printed circuit board 1030 when a light fixture including the printed circuit board 1030 is operated near either end of its tunable color temperature range.

Thus, in some embodiments of the present invention, the LED packages in a row of LED packages may not be uniformly spaced. In some cases, the LED packages in a middle portion of a row may have a uniform spacing while the LED packages at either end of the row may have a non-uniform spacing. In some embodiments, the LED packages in a central row of blue-shifted-red LED packages may have a uniform spacing while the LED packages in one or more outer rows of blue-shifted-yellow/green LED packages may have non-uniform spacing, at least in the outer portions of each row of blue-shifted-yellow/green LED packages.

It will also be appreciated that tunable light fixtures may be provided using the techniques disclosed herein that are tunable over a broader range of color points and color temperatures. For example, according to further embodiments of the present invention, light fixtures may be provided that are tunable to color temperatures as low as 2200 K and/or to as high as 10000 K. When tuning to low color temperatures such as color temperatures of 2200-2500 K, the color point of the combined light output will generally be below the black body locus on the 1931 CIE Chromaticity Diagram. In order to achieve these low color temperatures, a larger percentage of the LED packages may be blue-shifted-red LED packages. Additionally, the amount of phosphor included in at least some of the blue-shifted-red LED packages may be increased to facilitate achieving these lower color temperatures. The higher color temperatures may be achieved, for example, by further reducing the amount of phosphor included in at least some of the low phosphor blue-shifted-yellow/green LED packages.

It will also be appreciated that in other embodiments additional LED packages may be used to achieve tunability over a larger range of color temperatures. For example, FIG. 19C schematically depicts a light fixture that uses three different types of blue-shifted-yellow/green LED packages. In FIG. 19C, the middle row 860 may comprise blue-shifted-red LED packages 850, the rows 862, 864 on either side of the middle row 850 may each include both low phosphor and high phosphor blue-shifted-yellow/green LED packages 840A, 840B (which use a LuAG:Ce phosphor), and the outside rows 866, 868 may each include high phosphor blue-shifted-yellow/green LED package 842 that includes a YAG:Ce phosphor. The blue-shifted-yellow/green LED packages 842 may have a color point that is to the right of the color point for the high phosphor blue-shifted-yellow/green LED packages 840A on the 1931 CIE Chromaticity Diagram. The blue-shifted-yellow/green LED packages 842 may facilitate emitting light at lower color temperatures with improved efficiency. In other embodiments, the blue-shifted-yellow/green LED packages 842 could be included as part of the middle row 860.

In some embodiments, the light fixtures disclosed herein may be used in conjunction with dimming circuits. Typically, pulse width modulation (PWM) dimming circuits are used to dim white light emitting solid state light fixtures. With PWM dimming, the current is delivered to the LED packages using a duty cycle approach where the current is fed to the LED packages as a square wave where the current is provided during one portion of the waveform and not provided during the other. The LED packages thus turn on and off at the frequency of the square wave. A typical frequency for the square wave is 75 Hz, which is high enough that the human eye cannot determine that the LED packages are turning on and off. The amount of dimming may then be readily controlled by adjusting the duty cycle of the square wave (i.e., the percentage of time during a period of the square wave that the LED package is turned on).

PWM dimming may be advantageous because it does not requiring changing the amount of current provided to the LED packages; instead, current either is or is not supplied to the LED packages using the square wave drive current. When a linear dimming is used instead of a PWM approach the light fixture is dimmed by reducing the currents supplied to the LED packages. The potential problem with linear dimming is that different types of LEDs may perform differently as the current is reduced, both in terms of the relative amount of light emitted and also in terms of the peak wavelength of the emitted light. These factors may also be dependent on the operating temperature of the LEDs. Moreover, as the LEDs in the LED packages age, these factors may change, and they may change at different rates and in different ways for different types of LEDs. Thus, it may be difficult and/or expensive to design a control system that can ensure consistent dimming when linear dimming is used.

As discussed above, in some embodiments of the present invention, the same (or very similar) LEDs may be used to fabricate both the blue-shifted-yellow/green LED packages and the blue-shifted-red LED packages. As such, the LEDs will change in the same manner during linear dimming in terms of the amount of light emitted and the peak wavelength of the light. Moreover, gallium nitride based blue LEDs tend to exhibit much smaller changes with both current and temperature than do red LEDs such as AlInGaP LEDs. Because of these differences, linear dimming may be used in the light fixtures according to embodiments of the present invention. This has the potential for simplifying the control circuit. Moreover, in some applications low frequency PWM dimming may be unacceptable, and the use of linear dimming provides a work around in these applications.

Various embodiments of the invention that are described above provide mechanisms for improving color mixing by the arrangement of the LED packages. These arrangements have primarily been described with respect to troffer light fixtures that have long rows of LED packages. However, it will be appreciated that these same techniques may be used with respect to other LED arrangements and other types of solid state light fixtures. Several examples of other types of embodiments will now be described with reference to FIGS. 25A-25B.

Figure 25A:
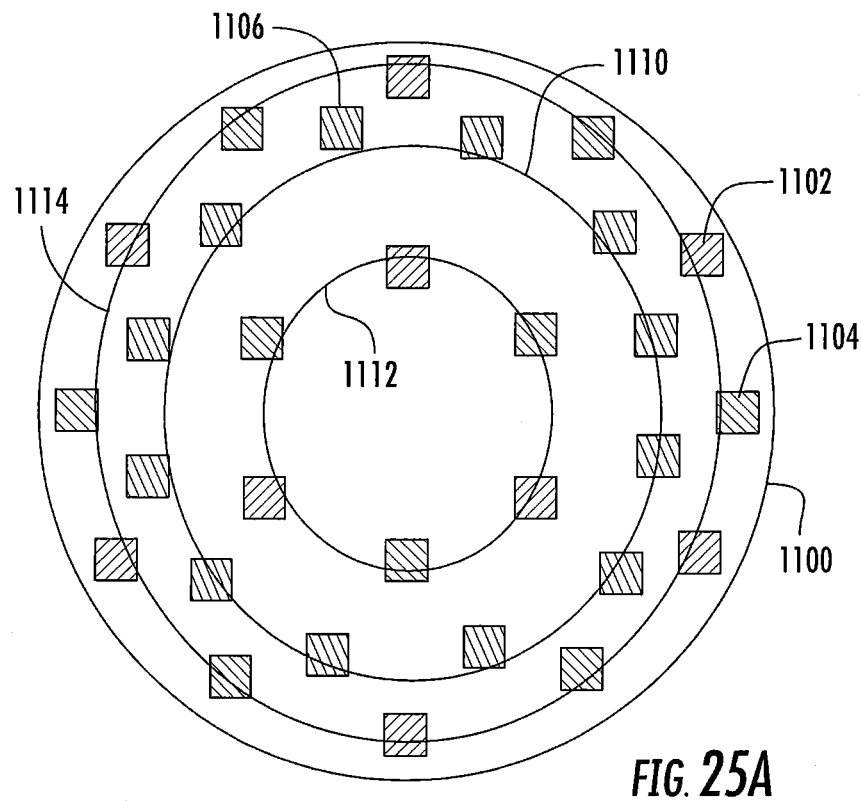
FIGS. 25A-25B illustrate printed circuit boards for solid state light fixtures according to further embodiments of the present invention that have three different types of LED packages arranged in patterns that may provide improved color mixing.

For example, FIG. 25A is a schematic plan view of a printed circuit board (or other submount) 1100 that includes a first, second and third types of wavelength-converted LED packages 1102, 1104, 1106. The LED packages 1102, 1104, 1106 are arranged in three circular patterns 1110, 1112, 1114 on the printed circuit board 1100. The LED packages 1102 may comprise, for example, a first type of blue-shifted-yellow/green LED packages, the LED packages 1104 may comprise, for example, a second type of blue-shifted-yellow/green LED packages, and the LED packages 1106 may comprise, for example, blue-shifted-red LED packages. The LED packages 1102 and 1104 may be in the outer circular pattern 1114 and the inner circular pattern 1112, while the LED packages 1106 may be in the intermediate circular pattern 1110 that is between the inner and outer circular patterns 1112, 1114. This may provide improved color mixing. Additionally, the LED packages 1106 in the intermediate circular pattern 1110 may be arranged between the LED packages 1102, 1104 in the outer circular pattern 1112, and the LED packages 1102, 1104 in the inner circular pattern 1112 may be arranged between the LED packages 1106 in the intermediate circular pattern 1110. Each different type of LED package 1102, 1104, 1106 may be in its own LED string (or set of LED strings). The arrangement shown in FIG. 25A generally surrounds the LED packages 1106 with LED packages 1102 and 1104 to reduce or prevent the LED packages 1106 from being individually visible to a human observer. The arrangement also intersperses the LED packages 1102, 1104 so that each LED package 1106 will always have at least one LED package 1102 or 1104 near it that is driven with a relatively high current regardless of the color temperature to which the light fixture is tuned.

Figure 25B:
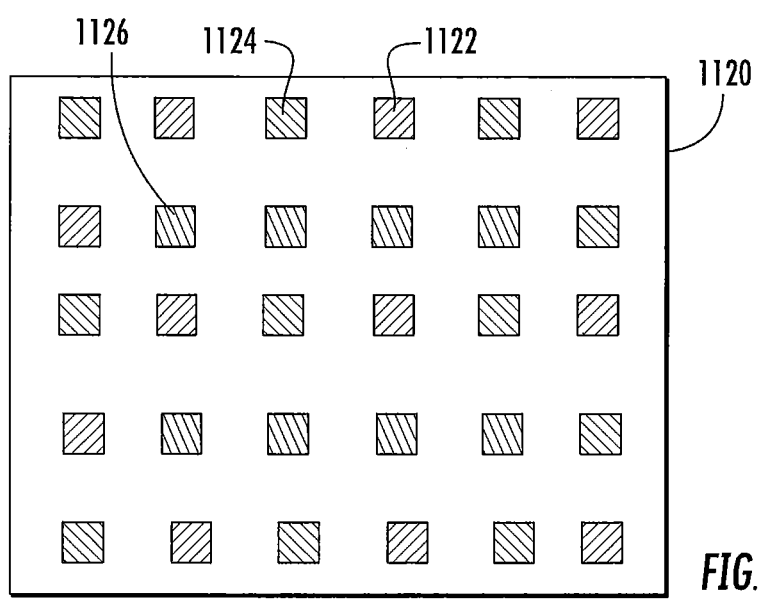

FIG. 25B is a schematic plan view of a printed circuit board (or other submount) 1120 according to further embodiments of the present invention. First, second and third types of wavelength-converted LED packages 1122, 1124, 1126 are mounted on the printed circuit board 1120. The LED packages 1122 may comprise, for example, a first type of blue-shifted-yellow/green LED packages, the LED packages 1124 may comprise, for example, a second type of blue-shifted-yellow/green LED packages, and the LED packages 1126 may comprise, for example, blue-shifted-red LED packages. The LED packages 1122, 1124, 1126 are arranged so that the blue-shifted-red LED packages 1126 are surrounded by the blue-shifted-yellow/green LED packages 1122, 1124. This again may provide improved color mixing.

In FIGS. 25A-25B, the LED packages 1102, 1104, 1106, 1122, 1124, 1126 may be any of the LED packages according to embodiments of the present invention disclosed herein. The design of FIG. 25A may be suitable for use in A-series bulbs and downlights.

Any of the embodiments disclosed herein may include a power circuit having a buck regulator, a boost regulator, a buck-boost regulator, a fly-back converter, a SEPIC power supply, or the like and/or a multiple stage power converter employing the like, and may comprise a driver circuit as disclosed in U.S. patent application Ser. No. 14/291,829, filed May 30, 2014, entitled "High Efficiency Driver Circuit with Fast Response" by Hu et al. or U.S. patent application Ser. No. 14/292,001, filed May 30, 2014, entitled "SEPIC Driver Circuit with Low Input Current Ripple" by Hu et al. incorporated by reference herein. The circuit may further be used with light control circuitry that controls color temperature of any of the embodiments disclosed herein, such as disclosed in U.S. patent application Ser. No. 14/292,286, filed May 30, 2014, entitled "Lighting Fixture Providing Variable CCT" by Pope et al. incorporated by reference herein. Additionally, any of the embodiments described herein can include driver circuitry disclosed in U.S. patent application Ser. No. 15/018,375, titled Solid State Light Fixtures Having Ultra-Low Dimming Capabilities and Related Driver Circuits and Methods, filed on Feb. 8, 2016 and assigned to the same assignee as the present application, the entirety of this application being incorporated herein by reference.

For example, the LED emitters can be arranged in series, parallel or series-parallel configurations and the voltage that passes through the different color emitters can be adjusted via control circuitry to adjust the color emitted by the lighting device. Such voltage adjustment may be used, for example, to change the ratio of current passing through different color LED emitters to achieve the above-described dimming to a warmer correlated color temperature light. This can be done in a series configuration by controlling an amount of current that is shunted around LED emitters of certain color and/or color temperature. In other embodiments, the LEDs may be arranged in strings of LED emitters of the same color and/or color temperature (e.g., a string of blue-shifted yellow/green LED packages and a string of blue-shifted-red LED packages) and these strings can be independently controlled to obtain the desired light color and/or color temperature or color/intensity combination. Other arrangements are possible.

Further, any of the embodiments disclosed herein may be used in a luminaire having one or more communication components forming a part of the light control circuitry, such as an RF antenna that senses RF energy. The communication components may be included, for example, to allow the luminaire to communicate with other luminaires and/or with an external wireless controller, such as disclosed in U.S. Pat. No. 8,975,827, filed Mar. 1, 2013, entitled "Lighting Fixture for Distributed Control" or U.S. Provisional Application No. 61/932,058, filed Jan. 27, 2014, entitled "Enhanced Network Lighting" both owned by the assignee of the present application and the disclosures of which are incorporated by reference herein. More generally, the control circuitry can include at least one of a network component, an RF component, a control component, and one or more sensors. A sensor, such as a knob-shaped sensor, may provide an indication of ambient lighting levels and/or occupancy within the room or illuminated area. Other sensors are possible, and a sensor may be separate from and/or integrated into the light control circuitry. Depending on the embodiment, the light can have integrated logic that locally controls the light based on the sensor input, and/or the light can pass the sensor data to a central control that controls the light, e.g., from a central computer that is linked to the lights via a communication network.

The LED packages discussed herein may be mounted directly on a printed circuit board (e.g., chip on board) and/or packaged phosphor-converted white or color LED packages mounted on the printed circuit board, such as a metal core printed circuit board or FR4 board. In some embodiments, the LED packages can be mounted directly to the heat sink or another type of board or substrate. Depending on the embodiment, the lighting device can employ LED package arrangements or lighting arrangements using remote phosphor technology as would be understood by one of ordinary skill in the art, and examples of remote phosphor technology are described in U.S. Pat. No. 7,614,759, assigned to the assignee of the present invention and hereby incorporated by reference.

The LED packages may be disposed in different configurations and/or layouts as desired, for example utilizing single or multiple strings of LED packages where each string of LED packages comprise LED packages in series and/or parallel. Different color temperatures and appearances could be produced using other LED and/or LED package combinations. If desirable, other arrangements are possible. In some embodiments, a string, a group of LED packages or can comprise different lighting characteristics and by independently controlling a string, a group of LED packages or individual LED packages, characteristics of the overall light out output of the device can be controlled.

In some embodiments, each LED packages may comprise one or more LEDs disposed within a coupling cavity with an air gap being disposed between the LED and a light input surface. In any of the embodiments disclosed herein each of the LED element(s) or module(s) can have different or the same light distribution, although each may have a directional emission distribution (e.g., a side emitting distribution), as necessary or desirable. More generally, any lambertian, symmetric, wide angle, preferential-sided or asymmetric beam pattern LED element(s) or module(s) may be used as the light source.

Moreover, depending on the embodiment, the desired light distribution can be achieved by single primary optics of packaged LEDs and/or combinations of the primary optics of packaged LEDs with single or multiple secondary optics. Optical components can be the same or vary from LED element to LED element depending on the desired lighting characteristics of the luminaire. In some embodiments, LED optics can employ waveguide technology where internal reflection of light is utilized along with light extraction features to achieve a desired light distribution.

In various embodiments described herein various smart technologies may be incorporated in the light fixtures as described in the following applications "Solid State Lighting Switches and Fixtures Providing Selectively Linked Dimming and Color Control and Methods of Operating," application Ser. No. 13/295,609, filed Nov. 14, 2011, which is incorporated by reference herein in its entirety; "Master/Slave Arrangement for Lighting Fixture Modules," application Ser. No. 13/782,096, filed Mar. 1, 2013, which is incorporated by reference herein in its entirety; "Lighting Fixture for Automated Grouping," application Ser. No. 13/782,022, filed Mar. 1, 2013, which is incorporated by reference herein in its entirety; "Multi-Agent Intelligent Lighting System," application Ser. No. 13/782,040, filed Mar. 1, 2013, which is incorporated by reference herein in its entirety; "Routing Table Improvements for Wireless Lighting Networks," application Ser. No. 13/782,053, filed Mar. 1, 2013, which is incorporated by reference herein in its entirety; "Commissioning Device for Multi-Node Sensor and Control Networks," application Ser. No. 13/782,068, filed Mar. 1, 2013, which is incorporated by reference herein in its entirety; "Wireless Network Initialization for Lighting Systems," application Ser. No. 13/782,078, filed Mar. 1, 2013, which is incorporated by reference herein in its entirety; "Commissioning for a Lighting Network," application Ser. No. 13/782,131, filed Mar. 1, 2013, which is incorporated by reference herein in its entirety; "Ambient Light Monitoring in a Lighting Fixture," application Ser. No. 13/838,398, filed Mar. 15, 2013, which is incorporated by reference herein in its entirety; "System, Devices and Methods for Controlling One or More Lights," application Ser. No. 14/052,336, filed Oct. 10, 2013, which is incorporated by reference herein in its entirety; and "Enhanced Network Lighting," application No. 61/932,058, filed Jan. 27, 2014, which is incorporated by reference herein in its entirety.

Additionally, any of the luminaire embodiments described herein can include the smart lighting control technologies disclosed in U.S. Provisional Application Ser. No. 62/292,528, titled Distributed Lighting Network, filed on Feb. 8, 2016 and assigned to the same assignee as the present application, the entirety of this application being incorporated herein by reference.

While embodiments of the present invention have primarily been discussed above with respect to troffer and A-series light fixtures, it will be appreciated that the techniques disclosed herein are applicable to a wide range of other types of light fixtures. For example, U.S. Patent Publication No. 2014/0347885 discloses light fixtures that have optical waveguide bodies. It will be appreciated that the techniques disclosed herein may also be used in these optical waveguide luminaires.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

The present invention has been described above with reference to the accompanying drawings, in which certain embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that, when used in this specification, the terms "comprises" and/or "including" and derivatives thereof, specify the presence of stated features, operations, elements, and/or components, but do not preclude the presence or addition of one or more other features, operations, elements, components, and/or groups thereof.

It will be understood that, although the terms first, second, etc. may be used herein to describe various elements, components, regions and/or layers, these elements, components, regions and/or layers should not be limited by these terms. These terms are only used to distinguish one element, component, region or layer from another element, component, region or layer. Thus, a first element, component, region or layer discussed below could be termed a second element, component, region or layer without departing from the teachings of the present invention.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A light emitting diode (LED) based light fixture, comprising:
 a plurality of blue-shifted-yellow/green LED packages, the blue-shifted-yellow/green LED packages including low-phosphor LED packages and high phosphor LED packages, the high phosphor LED packages having a higher phosphor conversion ratio than the low phosphor LED packages; and
 a plurality of blue-shifted-red LED packages,
 wherein the blue-shifted-red LED packages extend in a first row, and
 wherein a first subset of the blue-shifted-yellow/green LED packages extend in a second row on a first side of the blue-shifted-red LED packages and a second subset of the blue-shifted-yellow/green LED packages extend in a third row on a second side of the blue-shifted-red LED packages that is opposite the first side.

2. The LED based light fixture of claim 1, wherein the blue-shifted-yellow/green LED packages in the second row include both low phosphor LED packages and high phosphor LED packages.

3. The LED based light fixture of claim 2, wherein the blue-shifted-red LED packages are electrically connected in series to form a first LED string and the low phosphor LED packages are electrically connected in series to form a second LED string, wherein the second LED string crosses the first LED string in at least four locations.

4. The LED based light fixture of claim 3, wherein the high phosphor LED packages are electrically connected in series to form a third LED string, and wherein the third LED string crosses the first LED string in at least four locations.

5. The LED based light fixture of claim 1, wherein a first end of the second row extends beyond a first end of the first row, and a second end of the second row extends beyond a second end of the first row.

6. The LED based light fixture of claim 1, wherein the high phosphor LED packages each include a first amount of a first phosphor and the low phosphor LED packages each include a second amount of the first phosphor, wherein the first amount is between twice and seven times the second amount.

7. The LED based light fixture of claim 1, wherein an average separation between adjacent ones of the blue-shifted-red LED packages in the first row is less than an average separation between adjacent ones of the blue-shifted-yellow/green LED packages in the second row.

8. The LED based light fixture of claim 1, wherein all of the LED packages in the second row are not spaced apart from adjacent LED packages in the second row by a uniform amount, and wherein all of the LED packages in the third row are not spaced apart from adjacent LED packages in the second row by a uniform amount.

9. A tunable light emitting diode (LED) based light fixture, comprising:
 a plurality of blue-shifted-yellow/green LED packages, the blue-shifted-yellow/green LED packages including low-phosphor LED packages that each include a first amount of a first phosphor and high phosphor LED packages that each include a second amount of the first phosphor; and
 a plurality of blue-shifted-red LED packages;
 wherein the second amount is between twice and seven times the first amount.

10. The tunable LED based light fixture of claim 9, wherein the blue-shifted-red LED packages extend in a first row and the blue-shifted-yellow/green LED packages extend in a second row and in a third row, with the second row extending on a first side of the first row and the third row extending on a second side of the first row that is opposite the first side.

11. The tunable LED based light fixture of claim 10, wherein the second row includes both low phosphor LED packages and high phosphor LED packages, and wherein the third row includes both low phosphor LED packages and high phosphor LED packages.

12. The tunable LED based light fixture of claim 9, wherein the blue-shifted-red LED packages are electrically connected in series to form a first LED string and the low phosphor LED packages are electrically connected in series to form a second LED string, and wherein the second LED string crosses the first LED string in at least four locations.

13. The tunable LED based light fixture of claim 10, wherein a second line defined by the second row has respective endpoints that extend beyond respective endpoints of a first line defined by the first row.

14. The tunable LED based light fixture of claim 10, wherein an average separation between adjacent ones of the blue-shifted-red LED packages in the first row is less than an average separation between adjacent ones of the blue-shifted-yellow/green LED packages in the second row.

15. The LED based light fixture of claim 9, wherein a total number of blue-shifted-red LED packages included in the LED based light fixture is greater than 0.75 times a total number of blue-shifted-yellow/green LED packages included in the LED based light fixture.

16. A light emitting diode (LED) based light fixture, comprising:
 a plurality of blue-shifted-yellow/green LED packages, the blue-shifted-yellow/green LED packages including low-phosphor LED packages and high phosphor LED packages, the high phosphor LED packages having a higher phosphor conversion ratio than the low phosphor LED packages; and
 a plurality of blue-shifted-red LED packages,
 wherein the blue-shifted-yellow/green LED packages surround the blue-shifted-red LED packages.

17. The LED based light fixture of claim 16, wherein at least some of the blue-shifted-yellow/green LED packages are arranged in a first circle and the blue-shifted-red LED packages are arranged in a second circle that is within the first circle.

18. The LED based light fixture of claim 17, wherein additional of the blue-shifted-yellow/green LED packages are arranged in a third first circle that is within the second circle.

19. The LED based light fixture of claim 16, wherein the blue-shifted-yellow/green LED packages in the first circle include both low phosphor LED packages and high phosphor LED packages that are arranged in alternating order.

20. The LED based light fixture of claim 16, wherein the high phosphor LED packages each include a first amount of a first phosphor and the low phosphor LED packages each include a second amount of the first phosphor, wherein the first amount is between twice and seven times the second amount.

* * * * *

UNITED STATES PATENT AND TRADEMARK OFFICE
CERTIFICATE OF CORRECTION

PATENT NO. : 9,786,639 B2  Page 1 of 1
APPLICATION NO. : 15/226992
DATED : October 10, 2017
INVENTOR(S) : Bergmann et al.

It is certified that error appears in the above-identified patent and that said Letters Patent is hereby corrected as shown below:

In the Specification

Column 14, Lines 42, 46, 48: Please correct each entry of "CRT" to read -- CRI --
      Lines 52-54, 56, 59: Please correct each entry of "CRT" to read -- CRI --
      Lines 62, 64, 66: Please correct each entry of "CRT" to read -- CRI --

Column 16, Lines 20, 23, 26: Please correct "GM" to read -- GAI --

Signed and Sealed this
Twenty-seventh Day of February, 2018

Andrei Iancu
*Director of the United States Patent and Trademark Office*